US012563668B2

(12) United States Patent
Lu et al.

(10) Patent No.: US 12,563,668 B2
(45) Date of Patent: Feb. 24, 2026

(54) CIRCUIT BOARD, MANUFACTURING METHOD THEREOF, AND ELECTRONIC DEVICE

(71) Applicant: Unimicron Technology Corp., Taoyuan City (TW)

(72) Inventors: Chih-Chiang Lu, New Taipei City (TW); Jun-Rui Huang, Tainan City (TW); Ming-Hao Wu, Taoyuan City (TW); Yi-Pin Lin, Taoyuan City (TW); Tung-Chang Lin, Taoyuan City (TW)

(73) Assignee: Unimicron Technology Corp., Taoyuan City (TW)

( * ) Notice: Subject to any disclaimer, the term of this patent is extended or adjusted under 35 U.S.C. 154(b) by 659 days.

(21) Appl. No.: 17/894,128

(22) Filed: Aug. 23, 2022

(65) Prior Publication Data

US 2023/0262893 A1 Aug. 17, 2023

Related U.S. Application Data

(60) Provisional application No. 63/344,634, filed on May 23, 2022, provisional application No. 63/310,103, filed on Feb. 15, 2022.

(30) Foreign Application Priority Data

Aug. 5, 2022 (TW) ................................. 111129444

(51) Int. Cl.
*H05K 1/11* (2006.01)
*H05K 1/02* (2006.01)
(Continued)

(52) U.S. Cl.
CPC ............. *H05K 1/116* (2013.01); *H05K 1/024* (2013.01); *H05K 3/0094* (2013.01); (Continued)

(58) Field of Classification Search
CPC ...... H05K 1/115; H05K 1/116; H05K 1/0222; H05K 1/024; H05K 1/0221; H05K 1/0251;
(Continued)

(56) References Cited

U.S. PATENT DOCUMENTS 4,964,948 A * 10/1990 Reed ..................... H05K 3/0008
29/852
9,578,755 B2 2/2017 Mizutani et al.
(Continued)

FOREIGN PATENT DOCUMENTS

TW I248330 1/2006
TW I259744 8/2006
(Continued)

OTHER PUBLICATIONS

"Office Action of Taiwan Counterpart Application", issued on Mar. 14, 2023, p. 1-p. 8.

*Primary Examiner* — Roshn K Varghese
(74) *Attorney, Agent, or Firm* — JCIPRNET

(57) ABSTRACT

A circuit board, including a first dielectric material, a second dielectric material, a third dielectric material, a fourth dielectric material, a first external circuit layer, a second external circuit layer, a conductive structure, a first conductive via, and multiple second conductive vias, is provided. The first conductive via at least passes through the first dielectric material and the fourth dielectric material, and is electrically connected to the first external circuit layer and the second external circuit layer to define a signal path. The second conductive vias pass through the first dielectric material, the second dielectric material, the third dielectric material, and a part of the conductive structure, and surround the first conductive via. The second conductive vias are electrically connected to the first external circuit layer, the
(Continued)

conductive structure, and the second external circuit layer to define a ground path, and the ground path surrounds the signal path.

22 Claims, 63 Drawing Sheets

(51) Int. Cl.
    *H05K 3/00*         (2006.01)
    *H05K 3/40*         (2006.01)
    *H05K 3/46*         (2006.01)

(52) U.S. Cl.
    CPC ......... *H05K 3/4038* (2013.01); *H05K 3/4644* (2013.01); *H05K 2201/0187* (2013.01)

(58) Field of Classification Search
    CPC ... H05K 2201/0959; H05K 2201/0187; H05K 2201/09581
    See application file for complete search history.

(56) References Cited

U.S. PATENT DOCUMENTS

| | | | |
|---|---|---|---|
| 9,635,761 | B2 | 4/2017 | Brigham et al. |
| 10,249,943 | B2 | 4/2019 | Brigham |
| 10,375,838 | B2 | 8/2019 | Brigham et al. |
| 2006/0255876 | A1* | 11/2006 | Kushta ................... H05K 1/024 |
| | | | 333/33 |
| 2009/0056998 | A1* | 3/2009 | Booth, Jr. ............ H05K 1/0222 |
| | | | 174/262 |
| 2010/0163296 | A1 | 7/2010 | Ko et al. |
| 2015/0014045 | A1* | 1/2015 | Brigham .............. H05K 1/0222 |
| | | | 174/266 |

FOREIGN PATENT DOCUMENTS

| | | |
|---|---|---|
| TW | I393490 | 4/2013 |
| TW | 201417644 | 5/2014 |

* cited by examiner

CIRCUIT BOARD, MANUFACTURING METHOD THEREOF, AND ELECTRONIC DEVICE

CROSS-REFERENCE TO RELATED APPLICATION

This application claims the priority benefit of U.S. provisional application Ser. No. 63/310,103, filed on Feb. 15, 2022 and U.S. provisional application Ser. No. 63/344,634, filed on May 23, 2022. This application also claims the priority benefit of Taiwan application serial no. 111129444, filed on Aug. 5, 2022. The entirety of each of the above-mentioned patent applications is hereby incorporated by reference herein and made a part of this specification.

BACKGROUND

Technical Field

The disclosure relates to a substrate structure and a manufacturing method thereof, and more particularly to a circuit board, a manufacturing method thereof, and an electronic device using the circuit board.

Description of Related Art

In the conventional circuit board, the design of the coaxial via requires one or more insulating layers for insulation between the inner conductor layer and the outer conductor layer. The manner of forming the insulating layer is achieved through build-up lamination. Therefore, there will be impedance mismatch at two ends of the coaxial via and an electromagnetic interference (EMI) shielding notch will appear, thereby affecting the integrity of high-frequency signals. In addition, in the design of the coaxial via, two ends of the signal path are respectively located on different planes as two ends of the ground path, and the noise interference cannot be reduced.

SUMMARY

The disclosure provides a circuit board, which has a good signal loop and can have a preferred signal integrity.

The disclosure also provides a manufacturing method of a circuit board, which is used to manufacture the circuit board.

The disclosure further provides an electronic device, which includes the circuit board, has preferred electromagnetic interference (EMI) shielding and impedance matching effects, and can improve the signal transmission reliability.

The circuit board of the disclosure includes a first dielectric material, a second dielectric material, a third dielectric material, a fourth dielectric material, a first external circuit layer, a second external circuit layer, a conductive structure, a first conductive via, and multiple second conductive vias. The first external circuit layer is disposed on the first dielectric material. The second external circuit layer is at least disposed on the third dielectric material. The second dielectric material is disposed between the first dielectric material and the third dielectric material. The conductive structure is at least disposed between the first dielectric material and the second dielectric material, between the second dielectric material and the third dielectric material, and between the second dielectric material and the fourth dielectric material. The first conductive via at least passes through the first dielectric material and the fourth dielectric material, and is electrically connected to the first external circuit layer and the second external circuit layer to define a signal path. The second conductive vias pass through the first dielectric material, the second dielectric material, the third dielectric material, and a part of the conductive structure, and surround the first conductive via. The second conductive vias are electrically connected to the first external circuit layer, the conductive structure, and the second external circuit layer to define a ground path, and the ground path surrounds the signal path.

The manufacturing method of the circuit board of the disclosure includes the following steps. A substrate is provided. The substrate includes a first dielectric material, a second dielectric material, a third dielectric material, a fourth dielectric material, and a conductive structure. The second dielectric material is disposed between the first dielectric material and the third dielectric material. The conductive structure is at least disposed between the first dielectric material and the second dielectric material, between the second dielectric material and the third dielectric material, and between the second dielectric material and the fourth dielectric material. A first conductive via and multiple second conductive vias are formed. The first conductive via at least passes through the first dielectric material and the fourth dielectric material. The second conductive vias pass through the first dielectric material, the second dielectric material, the third dielectric material, and a part of the conductive structure, and surround the first conductive via. A first external circuit layer and a second external circuit layer are respectively formed on the first dielectric material and the third dielectric material. The first conductive via is electrically connected to the first external circuit layer and the second external circuit layer to define a signal path. The second conductive vias are electrically connected to the first external circuit layer, the conductive structure, and the second external circuit layer to define a ground path, and the ground path surrounds the signal path.

The electronic device of the disclosure includes a circuit board and an electronic element. The circuit board includes a first dielectric material, a second dielectric material, a third dielectric material, a fourth dielectric material, a first external circuit layer, a second external circuit layer, a conductive structure, a first conductive via, and multiple second conductive vias. The first external circuit layer is disposed on the first dielectric material. The second external circuit layer is at least disposed on the third dielectric material. The second dielectric material is disposed between the first dielectric material and the third dielectric material. The conductive structure is at least disposed between the first dielectric material and the second dielectric material, between the second dielectric material and the third dielectric material, and between the second dielectric material and the fourth dielectric material. The first conductive via at least passes through the first dielectric material and the fourth dielectric material, and is electrically connected to the first external circuit layer and the second external circuit layer to define a signal path. The second conductive vias pass through the first dielectric material, the second dielectric material, the third dielectric material, and a part of the conductive structure, and surround the first conductive via. The second conductive vias are electrically connected to the first external circuit layer, the conductive structure, and the second external circuit layer to define a ground path, and the ground path surrounds the signal path. The electronic element is electrically connected to the circuit board.

Based on the above, in the design of the circuit board of the disclosure, the first conductive via is electrically connected to the first external circuit layer and the second external circuit layer to define the signal path, and the second conductive vias are electrically connected to the first external circuit layer, the conductive structure, and the second external circuit layer to define the ground path, and the ground path surrounds the signal path. In this way, a good high-frequency high-speed signal loop can be formed, and the subsequent application in the integrated circuit and the antenna can also solve the issue of signal interference on the same plane, and can reduce signal energy loss and reduce noise interference, thereby improving the signal transmission reliability.

In order for the features and advantages of the disclosure to be more comprehensible, the following specific embodiments are described in detail in conjunction with the drawings.

DETAILED DESCRIPTION OF DISCLOSED EMBODIMENTS

Figure 1A:
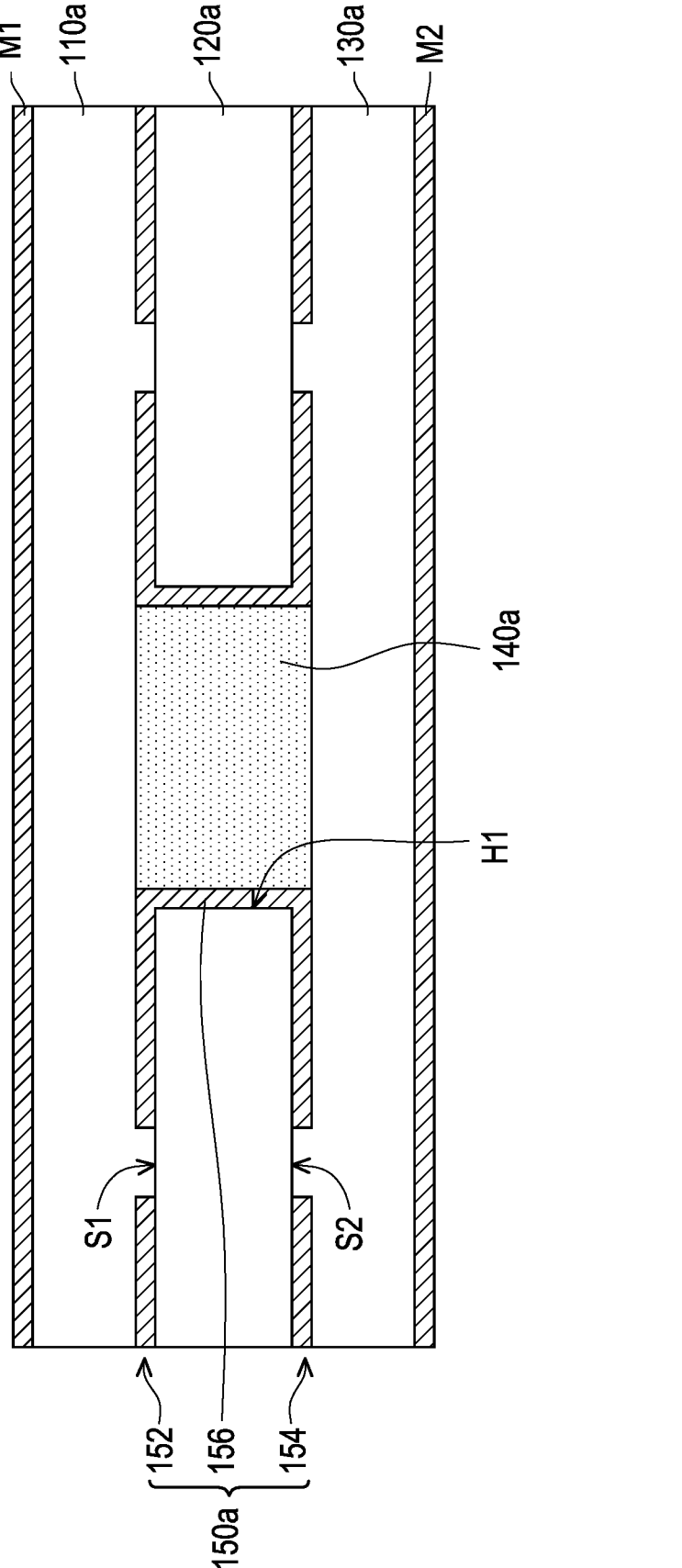
FIG. 1A to FIG. 1D are schematic cross-sectional views of a manufacturing method of a circuit board according to an embodiment of the disclosure.

FIG. 1A to FIG. 1D are schematic cross-sectional views of a manufacturing method of a circuit board according to an embodiment of the disclosure. FIG. 1E is a schematic top view of the circuit board of FIG. 1D. FIG. 1F is a schematic cross-sectional view of an electronic device including the circuit board of FIG. 1D. Regarding the manufacturing method of the circuit board of this embodiment, firstly, please refer to FIG. 1A. A second dielectric material 120$a$ is provided, wherein the second dielectric material 120$a$ has a first surface S1 and a second surface S2 opposite to each other and an opening H1. The opening H1 passes through the second dielectric material 120$a$. Next, a conductive structure 150$a$ is formed on the second dielectric material 120$a$, wherein the conductive structure 150$a$ includes a first circuit layer 152, a second circuit layer 154, and a conductive connection layer 156. The first circuit layer 152 is disposed on the first surface S1 of the second dielectric material 120*a*, and the second circuit layer 154 is disposed on the second surface S2 of the second dielectric material 120*a*. The conductive connection layer 156 covers an inner wall of the opening H1 and connects the first circuit layer 152 and the second circuit layer 154. Next, a fourth dielectric material 140*a* is formed to fill the opening H1 of the second dielectric material 120*a*. Next, a first dielectric material 110*a* and a first metal layer M1 formed on the first dielectric material 110*a* are provided, and a third dielectric material 130*a* and a second metal layer M2 formed on the third dielectric material 130*a* are provided. After that, a thermal lamination process is performed to laminate the first metal layer M1, the first dielectric material 110*a*, the second dielectric material 120*a*, the conductive structure 150*a*, the fourth dielectric material 140*a*, the third dielectric material 130*a*, and the second metal layer M2, so as to form the substrate.

In other words, the substrate of this embodiment includes the first metal layer M1, the first dielectric material 110*a*, the second dielectric material 120*a*, the third dielectric material 130*a*, the fourth dielectric material 140*a*, the conductive structure 150*a*, and the second metal layer M2. The first metal layer M1 and the second metal layer M2 are respectively on the first dielectric material 110*a* and the third dielectric material 130*a*. The second dielectric material 120*a* is disposed between the first dielectric material 110*a* and the third dielectric material 130*a*, and the conductive structure 150*a* is at least disposed between the first dielectric material 110*a* and the second dielectric material 120*a*, between the second dielectric material 120*a* and the third dielectric material 130*a*, and between the second dielectric material 120*a* and the fourth dielectric material 140*a*. The fourth dielectric material 140*a* is disposed between the first dielectric material 110*a* and the third dielectric material 130*a*, and fills the opening H1 of the second dielectric material 120*a*.

Further, in this embodiment, the first dielectric material 110*a*, the second dielectric material 120*a*, the third dielectric material 130*a*, and the fourth dielectric material 140*a* should use high-frequency high-speed materials. In addition, the dielectric constant of the fourth dielectric material 140*a* should consider impedance matching, and the dielectric loss of the fourth dielectric material 140*a* is greater than 0 and less than 0.1. The lower the dielectric loss, the higher the signal quality.

Figure 1B:
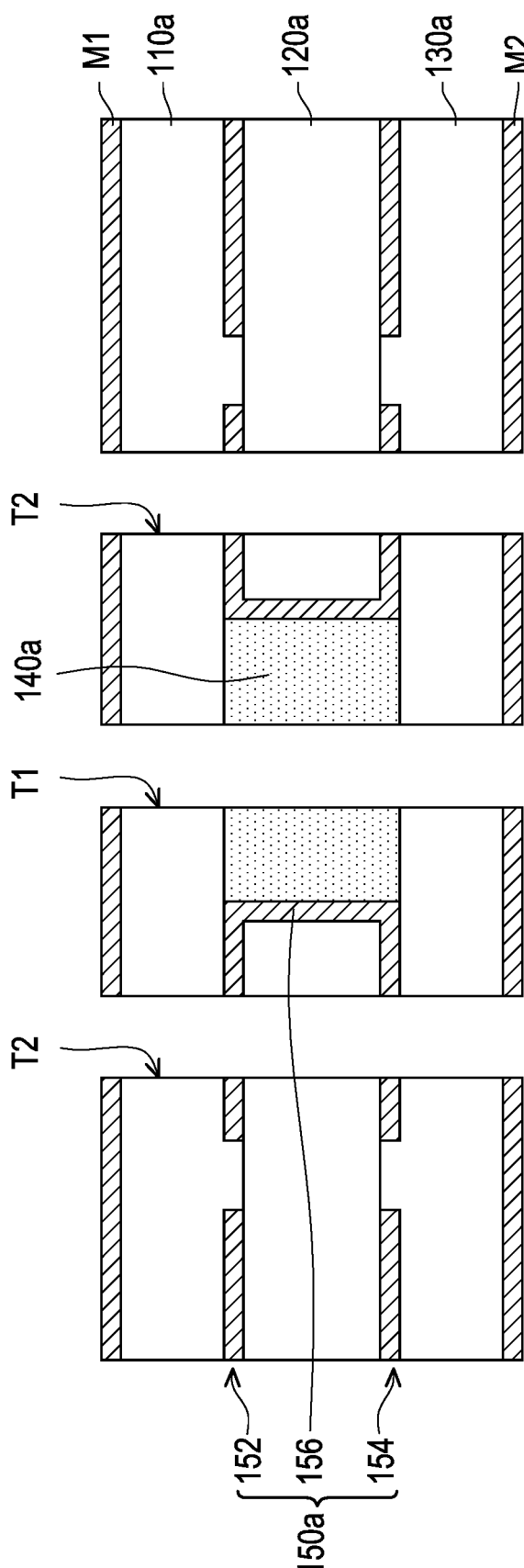

Next, please refer to FIG. 1B. A first through hole T1 and multiple second through holes T2 are formed. The first through hole T1 passes through the first metal layer M1, the first dielectric material 110*a*, the fourth dielectric material 140*a*, the third dielectric material 130*a*, and the second metal layer M2, and each second through hole T2 passes through the first metal layer M1, the first dielectric material 110*a*, the first circuit layer 152, the second dielectric material 120*a*, the second circuit layer 154, the third dielectric material 130*a*, and the second metal layer M2. Then, please refer to FIG. 1C. A conductive material layer E1 is formed to cover an inner wall of the first through hole T1, an inner wall of each second through hole T2, the first metal layer M1, and the second metal layer M2.

Figure 1C:
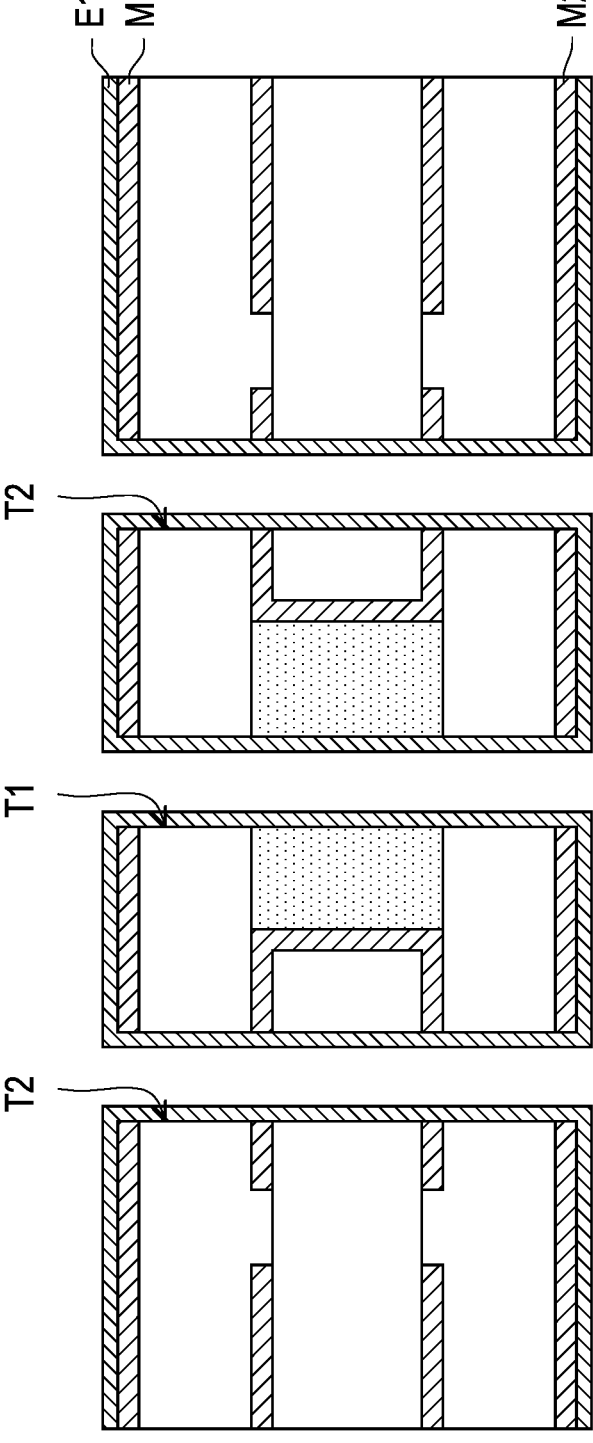
Figure 1D:
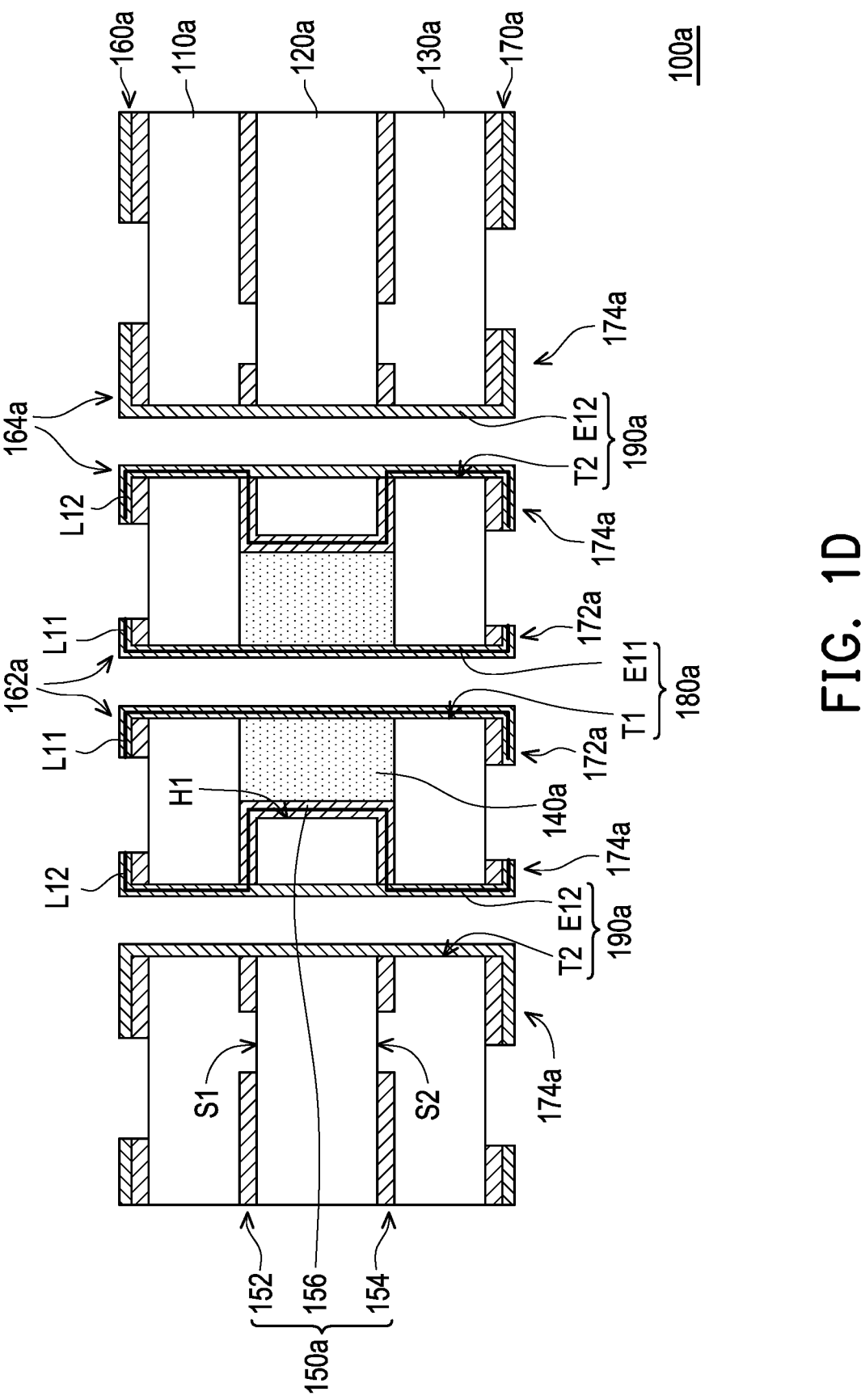
Figure 1E:
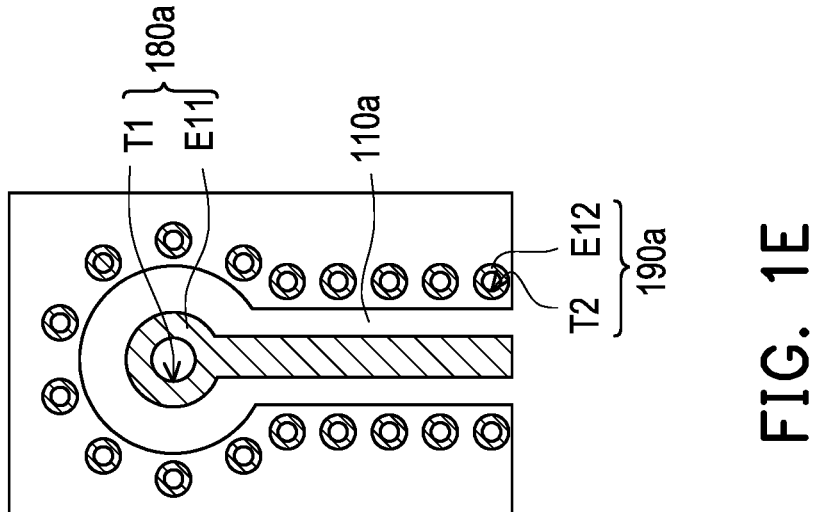
FIG. 1E is a schematic top view of the circuit board of FIG. 1D.
Figure 1F:
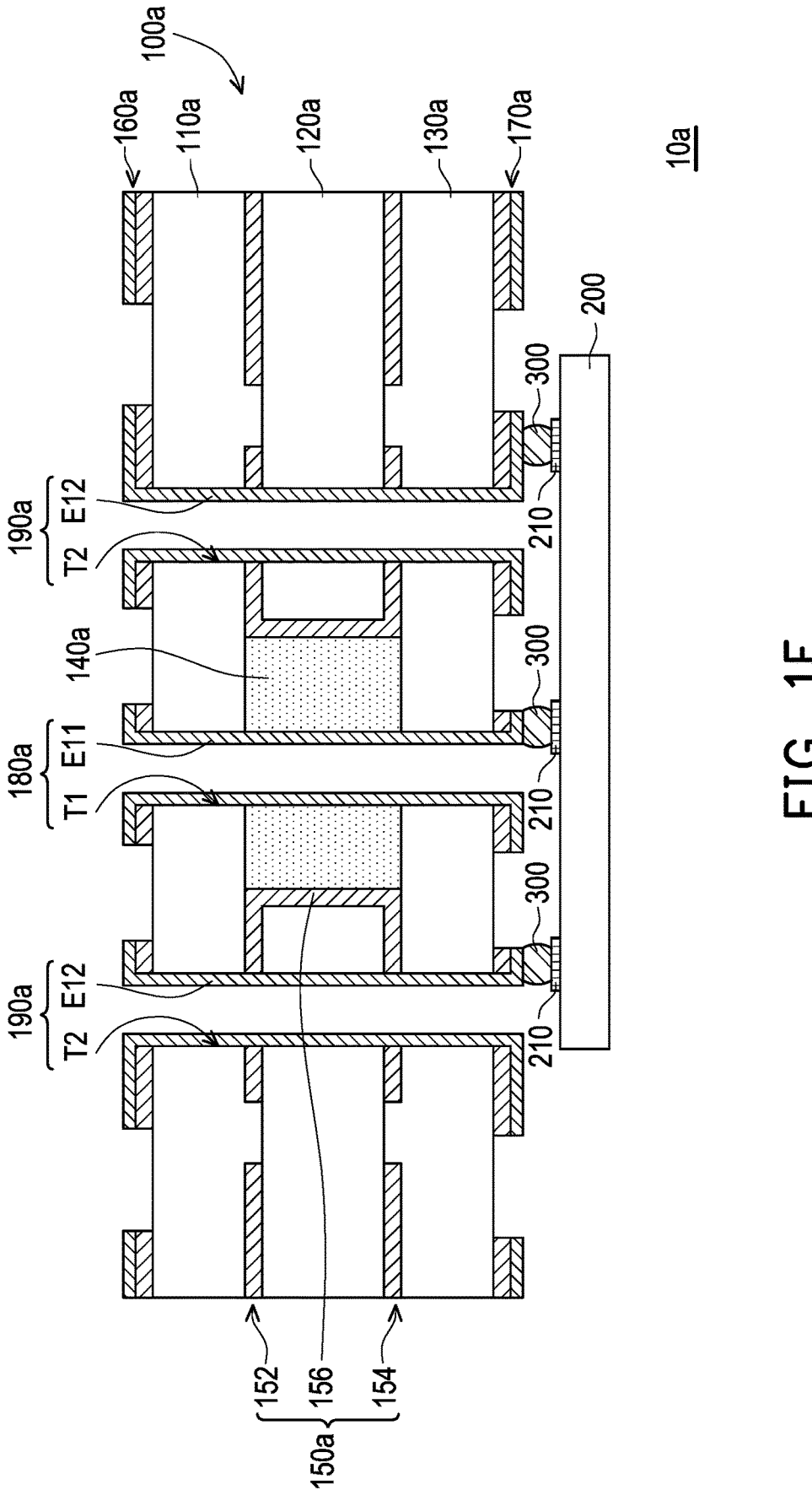
FIG. 1F is a schematic cross-sectional view of an electronic device including the circuit board of FIG. 1D.

Finally, please refer to FIG. 1C and FIG. 1D at the same time. The conductive material layer E1, the first metal layer M1, and the second metal layer M2 are patterned to form a first external circuit layer 160*a*, a second external circuit layer 170*a*, a first conductive via 180*a*, and a second conductive via 190*a*. In other words, the first conductive via 180*a*, the second conductive via 190*a*, the first external circuit layer 160*a*, and the second external circuit layer 170*a* of this embodiment are formed simultaneously. In detail, the first external circuit layer 160*a* and the second external circuit layer 170*a* are respectively formed on the first dielectric material 110*a* and the third dielectric material 130*a*, and the first conductive via 180*a* is electrically connected to the first external circuit layer 160*a* and the second external circuit layer 170*a* to define a signal path L11. The second conductive via 190*a* is electrically connected to the first external circuit layer 160*a*, the conductive structure 150*a*, and the second external circuit layer 170*a* to define a ground path L12, and the ground path L12 surrounds the signal path L11. It should be noted that according to a magnetic force generated by Ampere's right-hand rule, the ground path L12 preferably passes through the first circuit layer 152, the conductive connection layer 156, and the second circuit layer 154 of the conductive structure 150*a*, as shown in FIG. 1D.

Further, the first external circuit layer 160*a* includes a first signal circuit 162*a* and a first ground circuit 164*a*, and the second external circuit layer 170*a* includes a second signal circuit 172*a* and a second ground circuit 174*a*. The first signal circuit 162*a*, the first conductive via 180*a*, and the second signal circuit 172*a* define the signal path L11. The first ground circuit 164*a*, the second conductive via 190*a*, the first circuit layer 152, the conductive connection layer 156, the second circuit layer 154, the second conductive via 190*a*, and the second ground circuit 174*a* define the ground path L12. The first conductive via 180*a* includes the first through hole T1 and a first conductive material layer E11. The first through hole T1 of the first conductive via 180*a* passes through the first dielectric material 110*a*, the fourth dielectric material 140*a*, and the third dielectric material 130*a*, and the first conductive material layer E11 covers the inner wall of the first through hole T1 and is electrically connected to the first external circuit layer 160*a* and the second external circuit layer 170*a*. Each second conductive via 190*a* includes each second through hole T2 and a second conductive material layer E12. The second through hole T2 of the second conductive via 190*a* passes through the first dielectric material 110*a*, the second dielectric material 120*a*, the third dielectric material 130*a*, and a part of the conductive structure 150*a*, and surrounds the first conductive via 180*a*, and the second conductive material layer E12 covers the inner wall of each second through hole T2 and is electrically connected to the first external circuit layer 160*a*, the first circuit layer 152, the second circuit layer 154, and the second external circuit layer 170*a*. So far, the manufacturing of a circuit board 100*a* is completed.

Structurally, please refer to FIG. 1D and FIG. 1E at the same time. The circuit board 100*a* of this embodiment includes the first dielectric material 110*a*, the second dielectric material 120*a*, the third dielectric material 130*a*, the fourth dielectric material 140*a*, the conductive structure 150*a*, the first external circuit layer 160*a*, the second external circuit layer 170*a*, the first conductive via 180*a*, and the second conductive via 190*a*. The first external circuit layer 160*a* is disposed on the first dielectric material 110*a*, the second external circuit layer 170*a* is disposed on the third dielectric material 130*a*, and the second dielectric material 120*a* is disposed between the first dielectric material 110*a* and the third dielectric material 130*a*. The conductive structure 150*a* is disposed between the first dielectric material 110*a* and the second dielectric material 120*a*, between the second dielectric material 120*a* and the third dielectric material 130*a*, and between the second dielectric material 120*a* and the fourth dielectric material 140*a*. The first conductive via 180*a* passes through the first dielectric material 110*a*, the fourth dielectric material 140*a*, and the third dielectric material 130a, and is electrically connected to the first external circuit layer 160a and the second external circuit layer 170a to define the signal path L11. The second conductive via 190a passes through the first dielectric material 110a, the second dielectric material 120a, the third dielectric material 130a, and a part of the conductive structure 150a, and surrounds the first conductive via 180a, wherein the second conductive via 190a is electrically connected to the first external circuit layer 160a, the conductive structure 150a, and the second external circuit layer 170a to define the ground path L12, and the ground path L12 surrounds the signal path L11.

Specifically, the conductive structure 150a of this embodiment includes the first circuit layer 152, the second circuit layer 154, and the conductive connection layer 156. The second dielectric material 120a has the first surface S1 and the second surface S2 opposite to each other and the opening H1. The opening H1 passes through the second dielectric material 120a, the first circuit layer 152 is disposed on the first surface S1, the second circuit layer 154 is disposed on the second surface S2, and the conductive connection layer 156 covers the inner wall of the opening H1 and connects the first circuit layer 152 and the second circuit layer 154. The fourth dielectric material 140a is disposed between the first dielectric material 110a and the third dielectric material 130a, and fills the opening H1 of the second dielectric material 120a. Furthermore, the first conductive via 180a of this embodiment includes the first through hole T1 and the first conductive material layer E11. The first through hole T1 passes through the first dielectric material 110a, the fourth dielectric material 140a, and the third dielectric material 130a, and the first conductive material layer E11 covers the inner wall of the first through hole T1 and is electrically connected to the first external circuit layer 160a and the second external circuit layer 170a. Each second conductive via 190a includes the second through hole T2 and the second conductive material layer E12. The second through hole T2 passes through the first dielectric material 110a, the second dielectric material 120a, and the third dielectric material 130a, and the second conductive material layer E12 covers the inner wall of the second through hole T2 and is electrically connected to the first external circuit layer 160a, the first circuit layer 152, the second circuit layer 154, and the second external circuit layer 170a.

In addition, the first external circuit layer 160a includes the first signal circuit 162a and the first ground circuit 164a, and the second external circuit layer 170a includes the second signal circuit 172a and the second ground circuit 174a. The first signal circuit 162a, the first conductive via 180a, and the second signal circuit 172a define the signal path L11. The first ground circuit 164a, the second conductive via 190a, the first circuit layer 152, the conductive connection layer 156, the second circuit layer 154, the second conductive via 190a, and the second ground circuit 174a define the ground path L12. Since the signal path L11 is surrounded by the ground path L12 and is enclosed in a closed manner, a good high-frequency high-speed loop can be formed.

In short, in this embodiment, the signal path L11 defined by the first signal circuit 162a, the first conductive via 180a, and the second signal circuit 172a is surrounded and enclosed by the ground path L12 defined by the first ground circuit 164a, the second conductive via 190a, the first circuit layer 152, the conductive connection layer 156, the second circuit layer 154, the second conductive via 190a, and the second ground circuit 174a. That is, the ground path L12 with good closure is disposed around the signal path L11 that can transmit high-frequency high-speed signals such as 5G signals, such that a good high-frequency high-speed loop can be formed, so that the circuit board 100a of this embodiment can have a preferred signal integrity. Here, the high frequency refers to frequencies greater than 1 GHz; and the high speed refers to data transmission speed greater than 100 Mbps. Furthermore, it is generally known that a high-frequency circuit focuses on the speed and the quality of signal transmission, and the main factors affecting the two are the electrical characteristics of the transmission material, that is, the dielectric constant (Dk) and the dielectric loss (DO of the material. By reducing the dielectric constant and the dielectric loss of the substrate, the signal propagation delay time can be effectively shortened, the signal transmission rate can be increased, and the signal transmission loss can be reduced. Furthermore, the first conductive via 180a, the conductive connection layer 156 of the conductive structure 150a, and the fourth dielectric material 140a define a high-frequency high-speed special through via. On any cross-section of the special through via, a high-frequency and high-speed signal generates a return signal through the first conductive via 180a and the corresponding conductive connection layer 156 to form a high-frequency high-speed equivalent circuit on the cross-section. Compared with the prior art of a build-up manner of laminating an insulating layer to insulate an inner conductor layer and an outer conductor layer of a coaxial via, the manufacturing method of the circuit board 100a of this embodiment can avoid the issue of impedance mismatch that affects the integrity of high-frequency signals. In addition, since this embodiment does not use the build-up manner of laminating the insulating layer to increase the number of layers of the circuit board, the stacking design of through vias is not used to conduct adjacent structural layers. Therefore, the manufacturing method of the circuit board 100a of this embodiment can not only overcome the energy loss of the through vias, but also avoid the issue of poor reliability of thermal stress of the stacked through vias.

Next, please refer to FIG. 1F. In this embodiment, the electronic device 10a includes, for example, the circuit board 100a of FIG. 1D and an electronic element 200, wherein the electronic element 200 is electrically connected to the circuit board 100a, and the electronic element 200 includes multiple pads 210. In addition, the electronic device 10a of this embodiment further includes multiple connectors 300, which are disposed between the second external circuit layer 170a of the circuit board 100a and the pads 210 of the electronic element 200, wherein the electronic element 200 is electrically connected to the circuit board 100a through the connectors 300. Here, the connector 300 is, for example, a solder ball, but not limited thereto. In terms of application, an antenna structure may be disposed on the other side of the circuit board 100a opposite to the electronic element 200, and the antenna structure may be electrically connected to the first external circuit layer 160a of the circuit board 100a. For the application in the integrated circuit and the antenna, the circuit board 100a of this embodiment can solve the issue of signal interference on the same plane, and can reduce signal energy loss and reduce noise interference, thereby improving the signal transmission reliability.

Figure 2A:
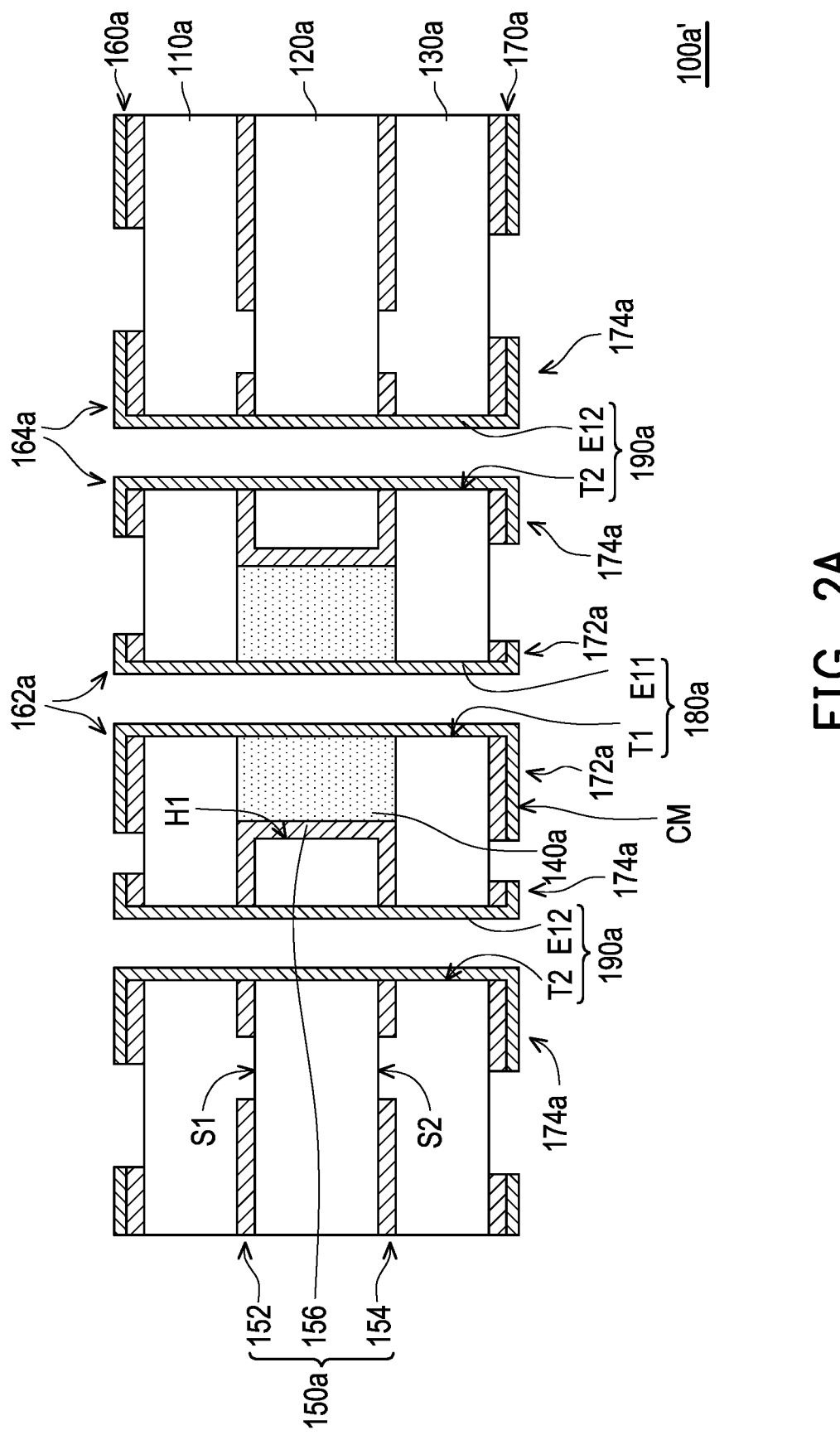
FIG. 2A is a schematic cross-sectional view of a circuit board according to an embodiment of the disclosure.
Figure 2B:
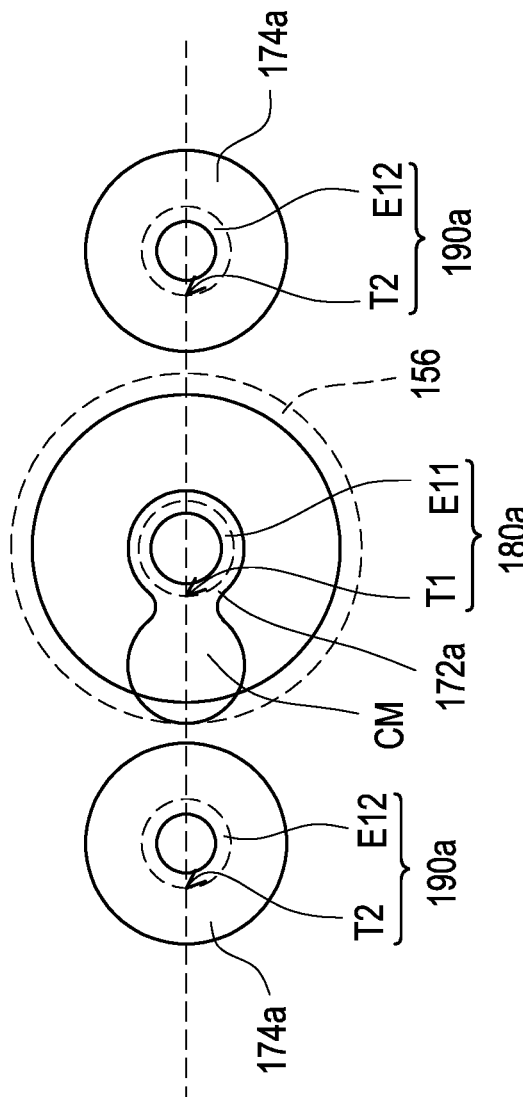
FIG. 2B is a schematic top view of the circuit board of FIG. 2A.

FIG. 2A is a schematic cross-sectional view of a circuit board according to an embodiment of the disclosure. FIG. 2B is a schematic top view of the circuit board of FIG. 2A. Please refer to FIG. 1D, FIG. 2A, and FIG. 2B at the same time. In order to improve the bonding force between the circuit board and the electronic element, in this embodiment, a circuit board 100a' may include a connecting metal layer CM, which is disposed on a third dielectric material 130a and is electrically connected to a first conductive via 180a and/or a second conductive via 190a. Here, through the configuration of the connecting metal layer CM, the contact area between the first conductive via 180a of the circuit board 100a' and the connectors 300 may be extended and increased, thereby improving the bonding force with the electronic element 200, so that the electronic device can have a preferred structural reliability.

It must be noted here that the following embodiments continue to use the reference numerals and some content of the foregoing embodiments, wherein the same reference numerals are used to represent the same or similar elements, and the description of the same technical contents is omitted. For the description of the omitted part, reference may be made to the foregoing embodiments, which will not be repeated in the following embodiments.

Figure 3A:
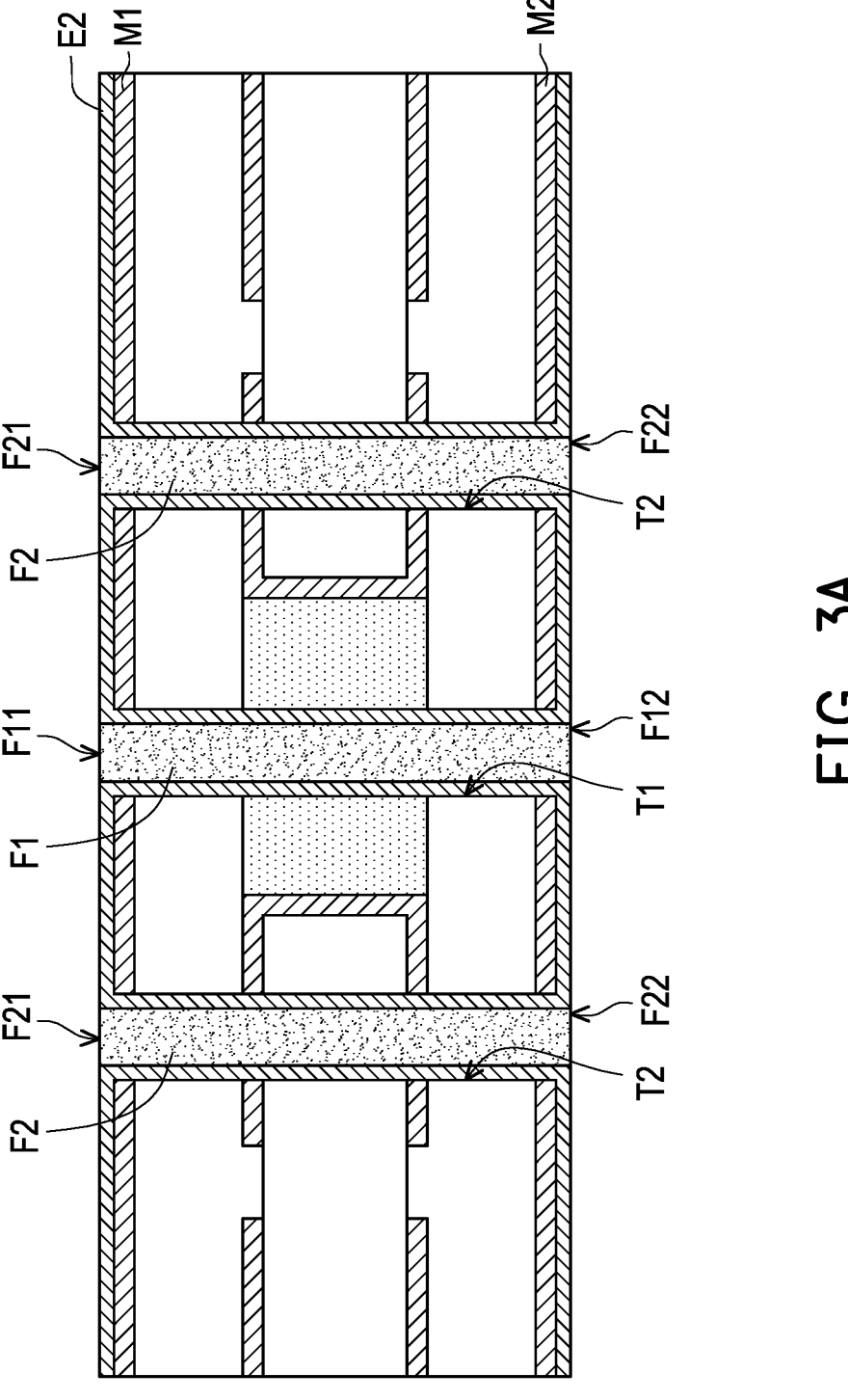
FIG. 3A to FIG. 3B are schematic cross-sectional views of partial steps of another manufacturing method of a circuit board according to another embodiment of the disclosure.
Figure 3B:
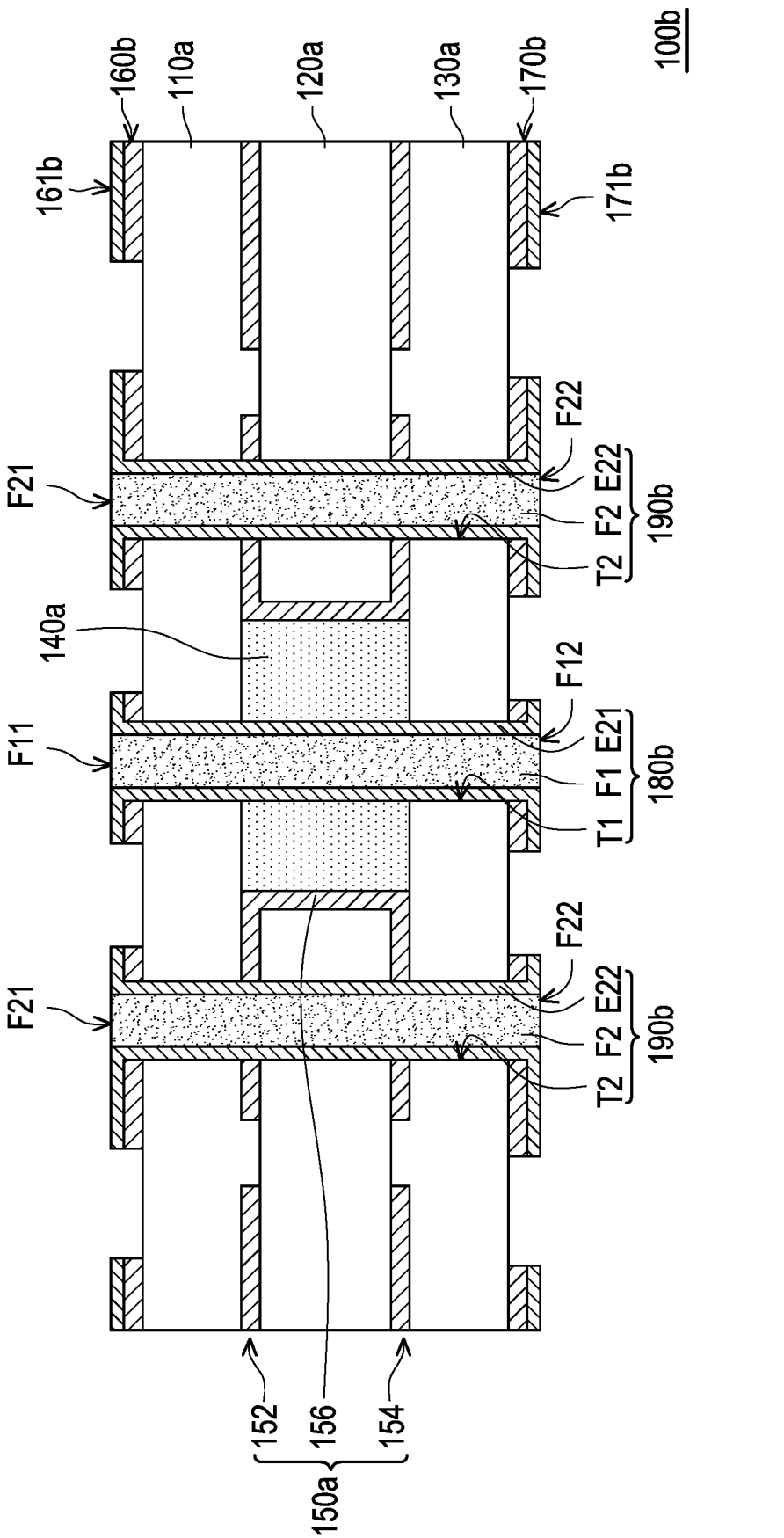
Figure 3C:
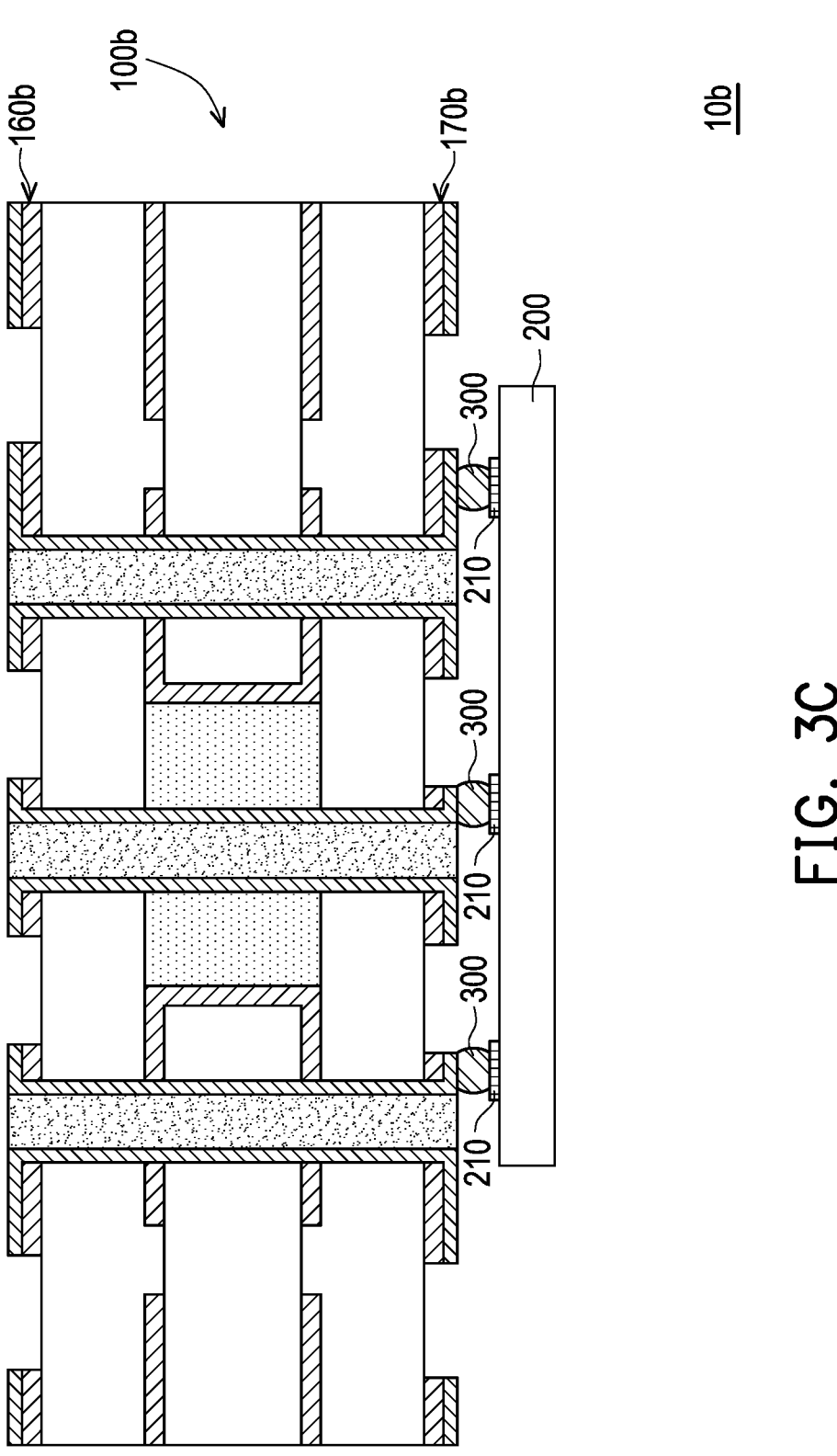
FIG. 3C is a schematic cross-sectional view of an electronic device including the circuit board of FIG. 3B.

FIG. 3A to FIG. 3B are schematic cross-sectional views of partial steps of another manufacturing method of a circuit board according to another embodiment of the disclosure. FIG. 3C is a schematic cross-sectional view of an electronic device including the circuit board of FIG. 3B. Please refer to FIG. 1C and FIG. 3A at the same time. A manufacturing method of a circuit board of this embodiment is similar to the above-mentioned manufacturing method of the circuit board, and the difference between the two is as follows. Please refer to FIG. 3A. After forming a conductive material layer E2, a plugging process is performed. A first hole filling material F1 and a second hole filling material F2 are respectively filled in a first through hole T1 and a second through hole T2, wherein the first hole filling material F1 fills the first through hole T1, and the second hole filling material F2 fills the second through hole T2. Preferably, a first upper surface F11 and a first lower surface F12 opposite to each other of the first hole filling material F1 and a second upper surface F21 and a second lower surface F22 opposite to each other of the second hole filling material F2 are respectively flush with the conductive material layer E2. If the first hole filling material F1 and the second hole filling material F2 are higher than the conductive material layer E2, a grinding manner may be selected, so that the first upper surface F11 and the first lower surface F12 of the first hole filling material F1 and the second upper surface F21 and the second lower surface F22 of the second hole filling material F2 are respectively flush with the conductive material layer E2, thereby maintaining a preferred flatness. Here, the materials of the first hole filling material F1 and the second hole filling material F2 are, for example, resin, which may be regarded as a plugging agent or a dielectric material with a dielectric constant of higher than 3.6 and a dielectric loss of lower than 0.05.

After that, please refer to FIG. 3A and FIG. 3B at the same time. A lithography process is performed to pattern the conductive material layer E2, a first metal layer M1, and a second metal layer M2, so as to form a first external circuit layer 160b, a second external circuit layer 170b, a first conductive via 180b, and a second conductive via 190b. Here, the first external circuit layer 160b and the second external circuit layer 170b are respectively formed on a first dielectric material 110a and a third dielectric material 130a. The first conductive via 180b includes the first through hole T1, a first conductive material layer E21, and the first hole filling material F1, wherein the first hole filling material F1 fills the first through hole T1, and the first upper surface F11 and the first lower surface F12 opposite to each other of the first hole filling material T1 are respectively flush with a top surface 161b of the first external circuit layer 160b and a bottom surface 171b of the second external circuit layer 170b. Each second conductive via 190b includes the second through hole T2, a second conductive material layer E22, and the second hole filling material F2, wherein the second hole filling material F2 fills the second through hole T2, and the second upper surface F21 and the second lower surface F22 opposite to each other of the second hole filling material F2 are respectively flush with the top surface 161b of the first external circuit layer 160b and the bottom surface 171b of the second external circuit layer 170b. So far, the manufacturing of a circuit board 100b is completed.

Next, please refer to FIG. 3C. In this embodiment, an electronic device 10b includes, for example, the circuit board 100b of FIG. 3B and an electronic element 200, wherein the electronic element 200 is electrically connected to the circuit board 100b, and the electronic element 200 includes multiple pads 210. In addition, the electronic device 10b of this embodiment further includes multiple connectors 300, which are disposed between the second external circuit layer 170b of the circuit board 100b and the pads 210 of the electronic element 200, wherein the electronic element 200 is electrically connected to the circuit board 100b through the connectors 300. Here, the connector 300 is, for example, a solder ball, but not limited thereto. In terms of application, an antenna structure may be disposed on the other side of the circuit board 100b opposite to the electronic element 200, and the antenna structure may be electrically connected to the first external circuit layer 160b of the circuit board 100b. For the application in the integrated circuit and the antenna, the circuit board 100b of this embodiment can solve the issue of signal interference on the same plane, and can reduce signal energy loss and noise interference, thereby improving the signal transmission reliability.

Please refer to FIG. 2A and FIG. 3C at the same time. In order to improve the bonding force between the circuit board and the electronic element, in an embodiment not shown, the circuit board may include the connecting metal layer CM shown in FIG. 2A, which is disposed on the third dielectric material 130a and is electrically connected to the first conductive via 180b and/or the second conductive via 190b. Here, through the configuration of the connecting metal layer CM, the contact area between the first conductive via 180b and/or the second conductive via 190b of the circuit board and the connectors 300 may be extended and increased, thereby improving the bonding force with the electronic element 200, so that the electronic device can have a preferred structural reliability.

Figure 4A:
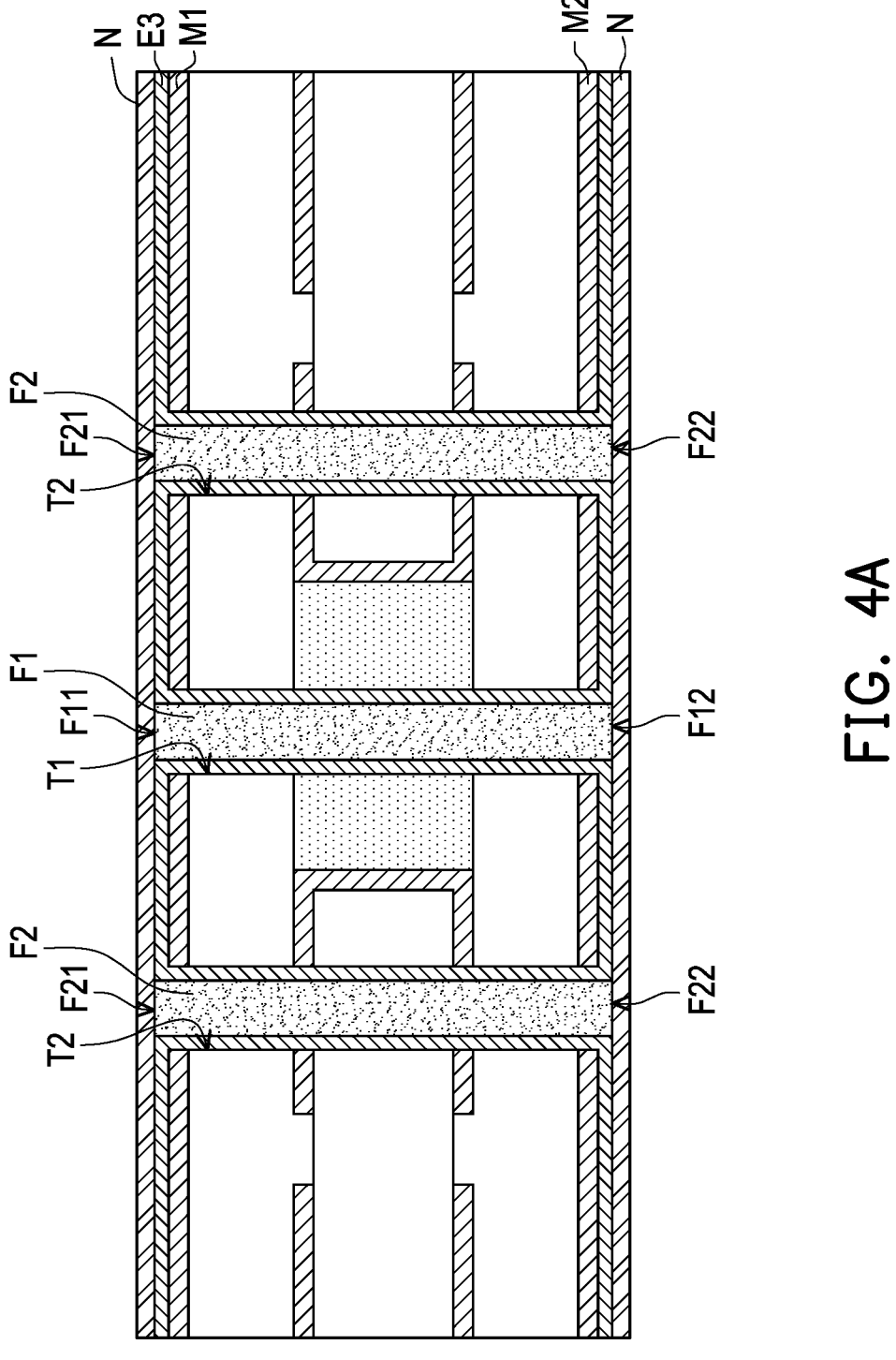
FIG. 4A to FIG. 4B are schematic cross-sectional views of partial steps of another manufacturing method of a circuit board according to another embodiment of the disclosure.
Figure 4B:
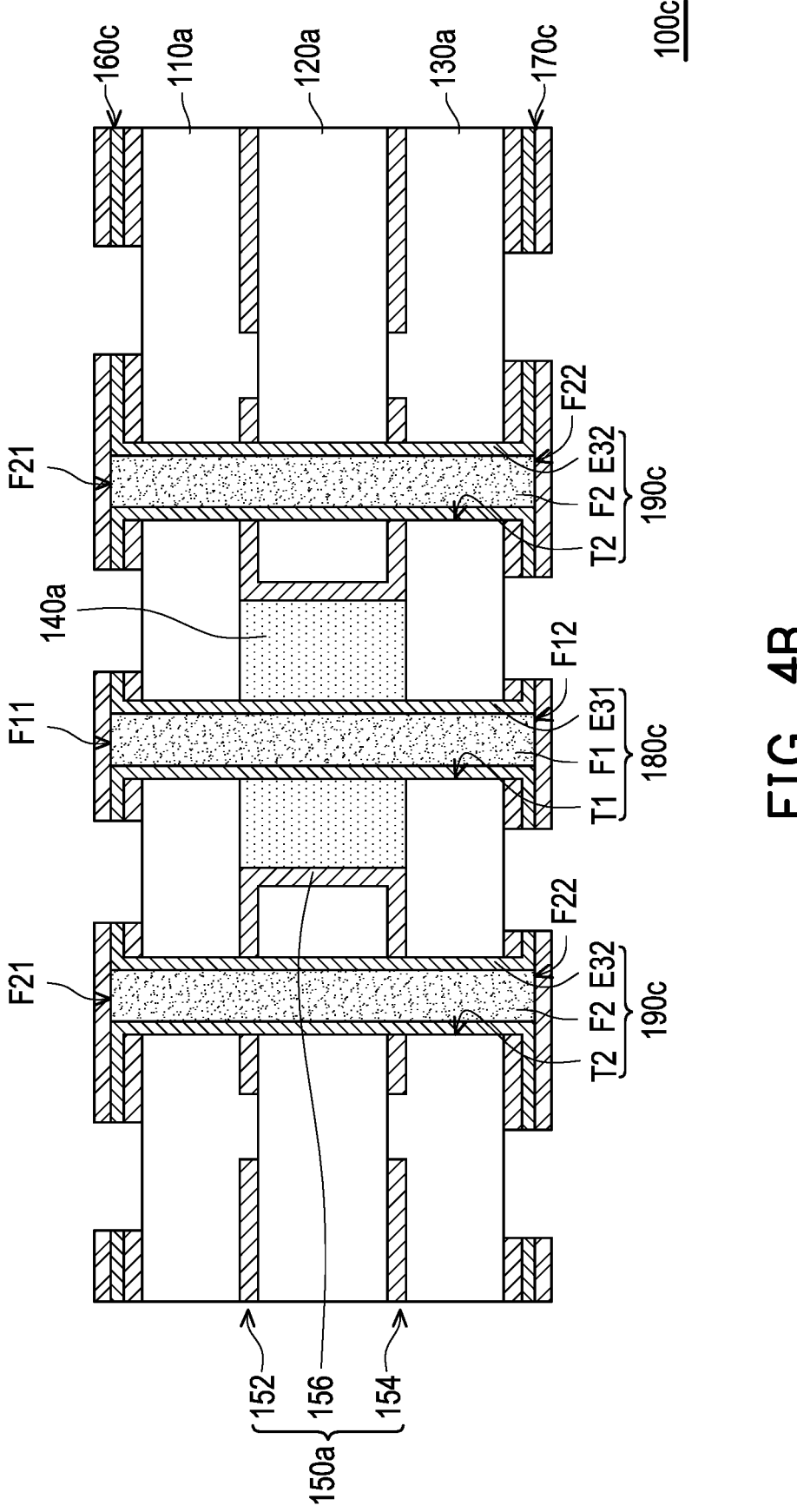
Figure 4C:
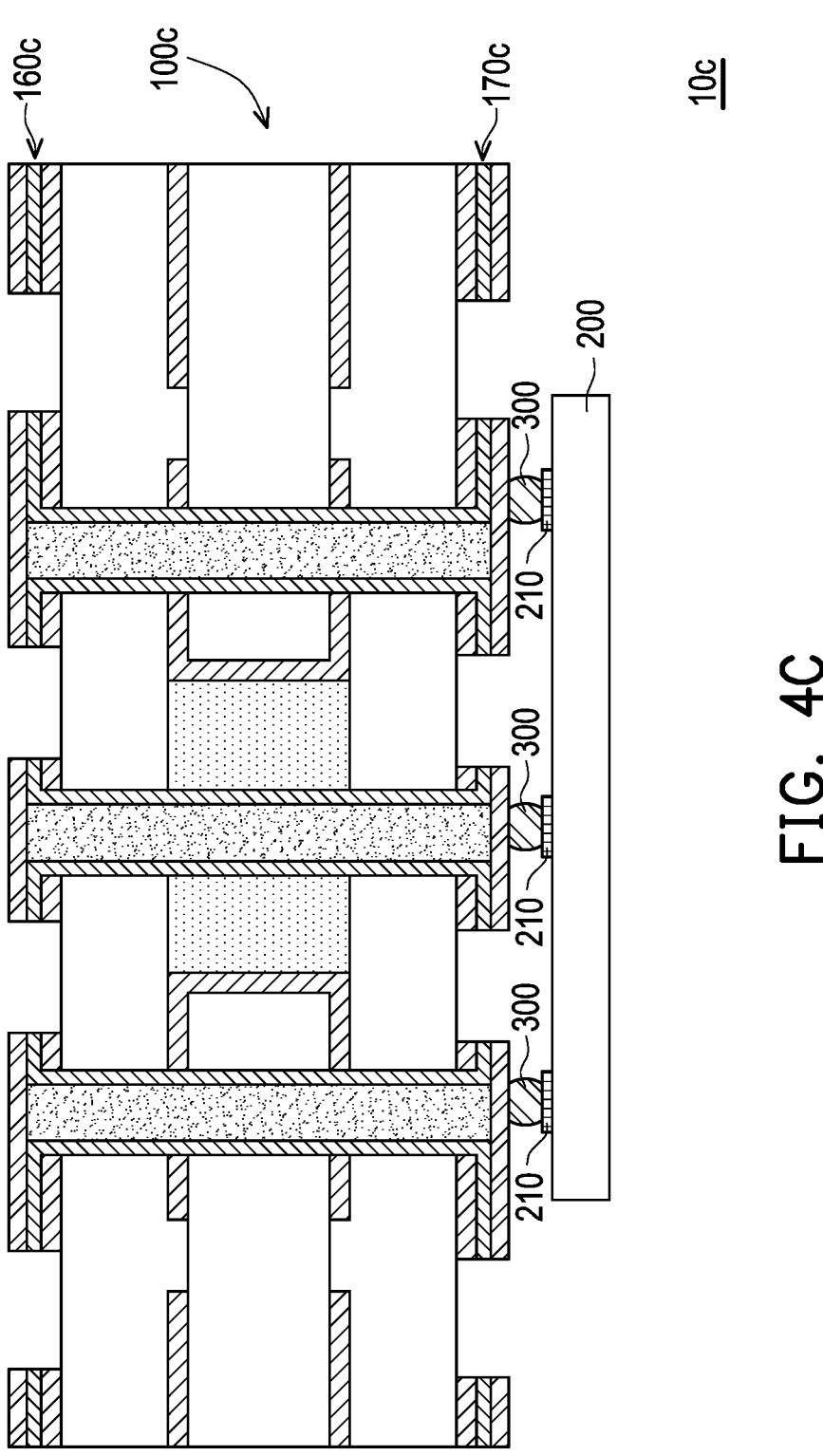
FIG. 4C is a schematic cross-sectional view of an electronic device including the circuit board of FIG. 4B.

FIG. 4A to FIG. 4B are schematic cross-sectional views of partial steps of another manufacturing method of a circuit board according to another embodiment of the disclosure. FIG. 4C is a schematic cross-sectional view of an electronic device including the circuit board of FIG. 4B. Please refer to FIG. 3A and FIG. 4A at the same time. A manufacturing method of a circuit board of this embodiment is similar to the above-mentioned manufacturing method of the circuit board, and the difference between the two is as follows. After the step of respectively filling the first hole filling material F1 and the second hole filling material F2 in the first through hole T1 and each second through hole T2 in FIG. 3A, please refer to FIG. 4A. A cover layer N is formed on the conductive material layer E3, wherein the cover layer N covers the conductive material layer E3, the first upper surface F11 and the first lower surface F12 of the first hole filling material F1, and the second upper surface F21 and the second lower surface F22 of the second hole filling material F2. Here, the material of the cover layer N is, for example, copper, but not limited thereto.

After that, please refer to FIG. 4A and FIG. 4B at the same time. A lithography process is performed to pattern the cover layer N, the conductive material layer E3, the first metal layer M1, and the second metal layer M2, so as to form a first external circuit layer 160c and a second external circuit layer 170c. Here, a first conductive via 180c includes the first through hole T1, a first conductive material layer E31, and the first hole filling material F1, wherein the first hole filling material F1 fills the first through hole T1, and the first external circuit layer 160c and the second external circuit layer 170c respectively cover the first upper surface F11 and the first lower surface F12 of the first hole filling material F1. Each second conductive via 190c includes the second through hole T2, a second conductive material layer E32, and the second hole filling material F2, wherein the second hole filling material F2 fills the second through hole T2, and the first external circuit layer 160c and the second external circuit layer 170c respectively cover the second upper surface F21 and the second lower surface F22 of the second hole filling material F2. So far, the manufacturing of a circuit board 100c is completed.

Next, please refer to FIG. 4C. In this embodiment, an electronic device 10c includes, for example, the circuit board 100c of FIG. 4B and an electronic element 200, wherein the electronic element 200 is electrically connected to the circuit board 100c, and the electronic element 200 includes multiple pads 210. In addition, the electronic device 10c of this embodiment further includes multiple connectors 300, which are disposed between the second external circuit layer 170c of the circuit board 100c and the pads 210 of the electronic element 200, wherein the electronic element 200 is electrically connected to the circuit board 100c through the connectors 300. Here, the connector 300 is, for example, a solder ball, but not limited thereto. In terms of application, an antenna structure may be disposed on the other side of the circuit board 100c opposite to the electronic element 200, and the antenna structure may be electrically connected to the first external circuit layer 160c of the circuit board 100c. For the application in the integrated circuit and the antenna, the circuit board 100c of this embodiment can solve the issue of signal interference on the same plane, and can reduce signal energy loss and reduce noise interference, thereby improving the signal transmission reliability.

Figure 5A:
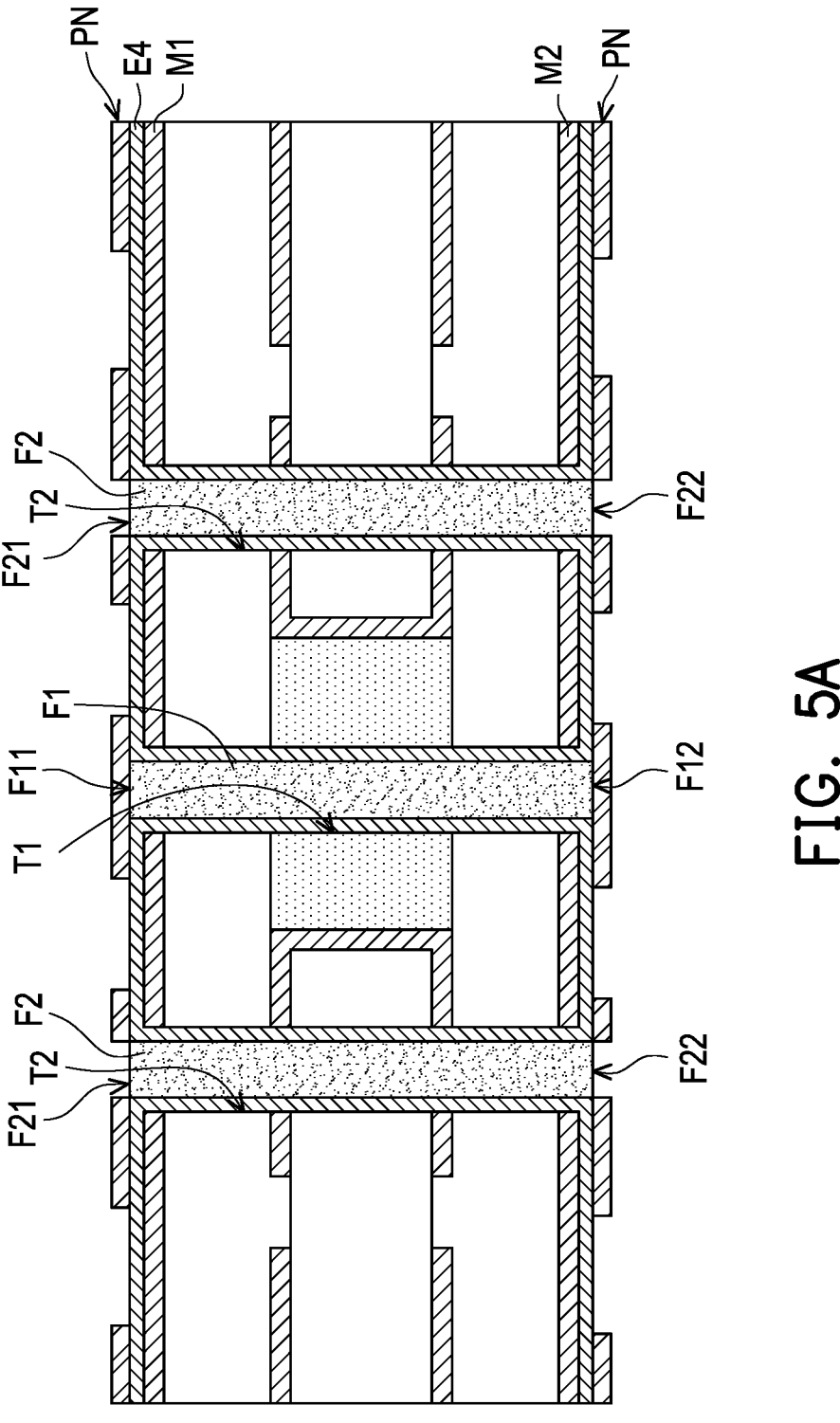
FIG. 5A to FIG. 5B are schematic cross-sectional views of partial steps of another manufacturing method of a circuit board according to another embodiment of the disclosure.
Figure 5B:
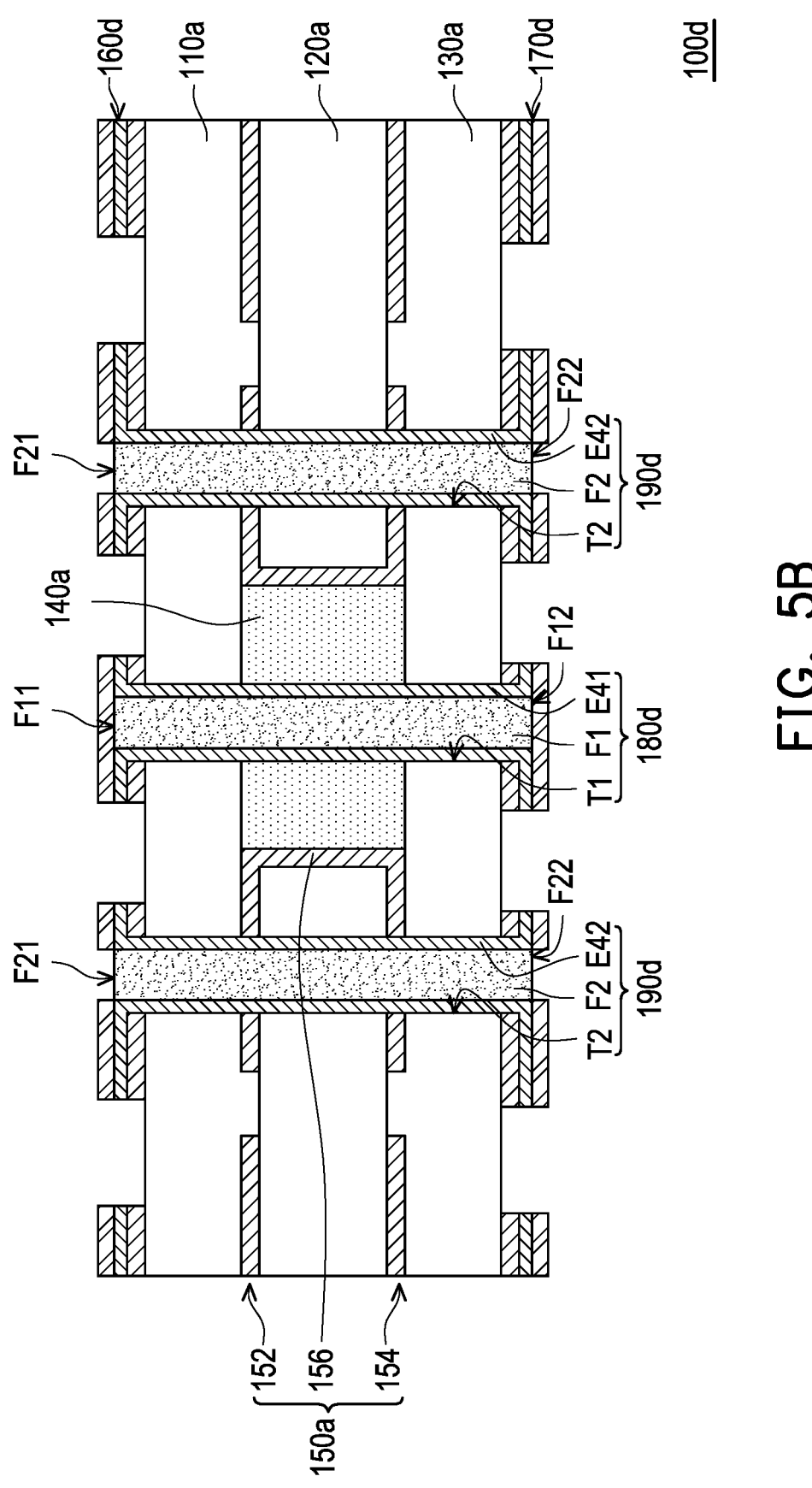
Figure 5C:
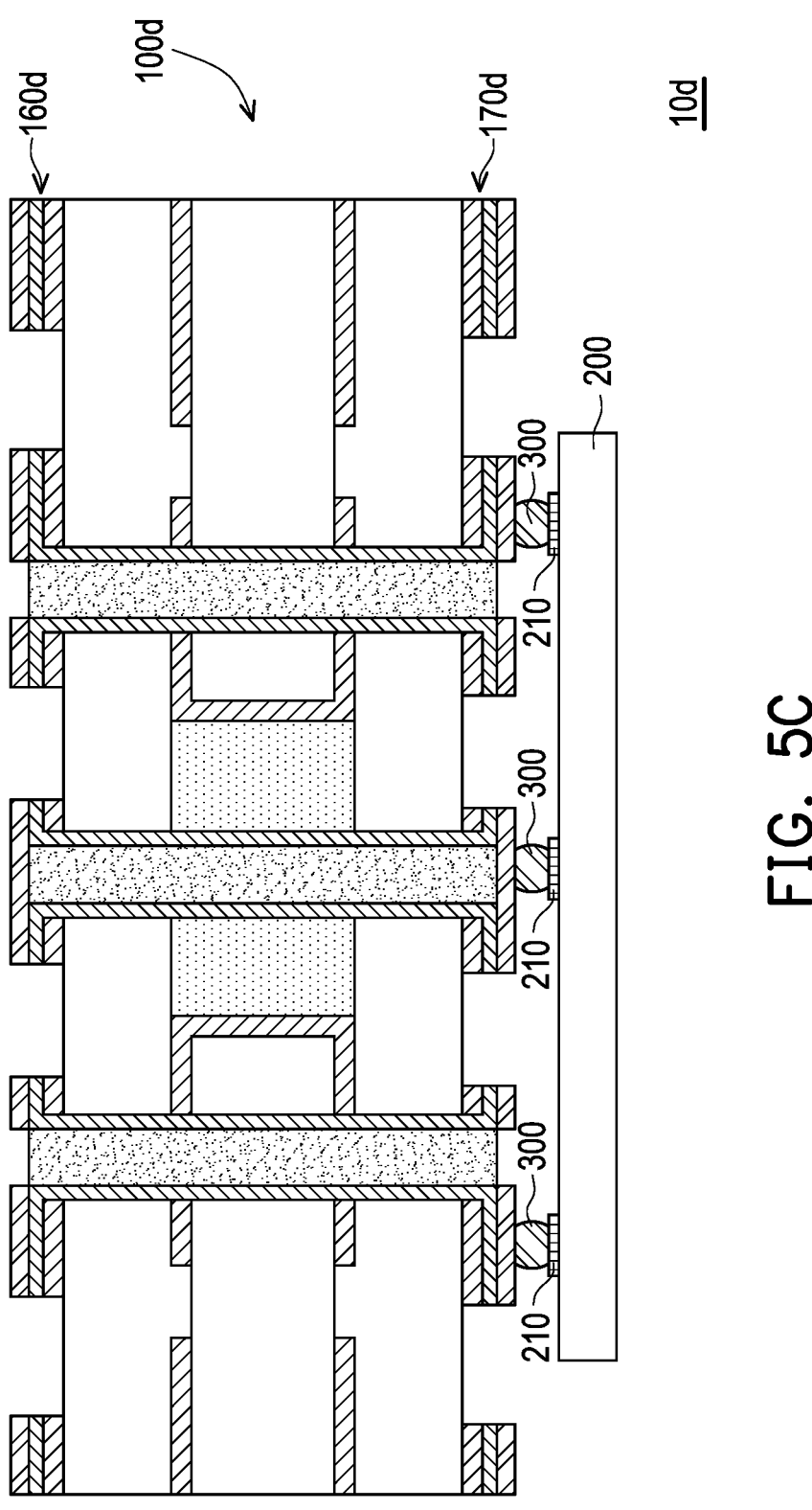
FIG. 5C is a schematic cross-sectional view of an electronic device including the circuit board of FIG. 5B.

FIG. 5A to FIG. 5B are schematic cross-sectional views of partial steps of another manufacturing method of a circuit board according to another embodiment of the disclosure. FIG. 5C is a schematic cross-sectional view of an electronic device including the circuit board of FIG. 5B. Please refer to FIG. 3A and FIG. 5A at the same time. A manufacturing method of a circuit board of this embodiment is similar to the above-mentioned manufacturing method of the circuit board, and the difference between the two is as follows. After the step of respectively filling the first hole filling material F1 and the second hole filling material F2 in the first through hole T1 and each second through hole T2 in FIG. 3A, please refer to FIG. 5A. A patterned cover layer PN is formed on a conductive material layer E4, wherein the patterned cover layer PN covers a part of the conductive material layer E4 and the first upper surface F11 and the first lower surface F12 of the first hole filling material F1. Here, the material of the patterned cover layer PN is, for example, copper, but not limited thereto.

Next, please refer to FIG. 5A and FIG. 5B at the same time. A lithography process is performed to pattern the conductive material layer E4, the first metal layer M1, and the second metal layer M2 with the patterned cover layer PN as a mask, so as to form a first external circuit layer 160d and a second external circuit layer 170d. Here, a first conductive via 180d includes the first through hole T1, a first conductive material layer E41, and the first hole filling material F1, wherein the first hole filling material F1 fills the first through hole T1, and the first external circuit layer 160d and the second external circuit layer 170d respectively cover the first upper surface F11 and the first lower surface F12 of the first hole filling material F1. Each second conductive via 190d includes the second through hole T2, a second conductive material layer E42, and the second hole filling material F2, wherein the second hole filling material F2 fills the second through hole T2, and the first external circuit layer 160d and the second external circuit layer 170d respectively expose the second upper surface F21 and the second lower surface F22 of the second hole filling material F2. So far, the manufacturing of a circuit board 100d is completed.

Next, please refer to FIG. 5C. In this embodiment, an electronic device 10d includes, for example, the circuit board 100d of FIG. 5B and an electronic element 200, wherein the electronic element 200 is electrically connected to the circuit board 100d, and the electronic element 200 includes multiple pads 210. In addition, the electronic device 10d of this embodiment further includes multiple connectors 300, which are disposed between the second external circuit layer 170d of the circuit board 100d and the pads 210 of the electronic element 200, wherein the electronic element 200 is electrically connected to the circuit board 100d through the connectors 300. Here, the connector 300 is, for example, a solder ball, but not limited thereto. In terms of application, an antenna structure may be disposed on the other side of the circuit board 100d opposite to the electronic element 200, and the antenna structure may be electrically connected to the first external circuit layer 160d of the circuit board 100d. For the application in the integrated circuit and the antenna, the circuit board 100d of this embodiment can solve the issue of signal interference on the same plane, and can reduce signal energy loss and reduce noise interference, thereby improving the signal transmission reliability.

FIG. 6A to FIG. 6D are schematic cross-sectional views of a manufacturing method of a circuit board according to another embodiment of the disclosure. FIG. 6E is a schematic cross-sectional view of an electronic device including the circuit board of FIG. 6D. Please refer to FIG. 1A and FIG. 6A at the same time. A manufacturing method of a circuit board of this embodiment is similar to the above-mentioned manufacturing method of the circuit board, and the difference between the two is as follows. In this embodiment, after forming a fourth dielectric material 140e to fill an opening H2 of a second dielectric material 120e, a fifth dielectric material 115e is formed, wherein the fifth dielectric material 115e has a first opening 117e. Next, a first dielectric material 110e is formed in the first opening 117e of the fifth dielectric material 115e. Next, a sixth dielectric material 135e is formed, wherein the sixth dielectric material 135e has a second opening 137e. Next, a third dielectric material 130e is formed in the second opening 137e of the sixth dielectric material 135e. At this time, the fourth dielectric material 140e is disposed between the first dielectric material 110e and the third dielectric material 130e, and fills the opening H2 of the second dielectric material 120e. Next, a first metal layer M3 is formed by thermal lamination to cover the first dielectric material 110e and the fifth dielectric material 115e, and a second metal layer M4 is formed to cover the third dielectric material 130e and the sixth dielectric material 135e, so as to complete the manufacturing of a substrate.

Further, in this embodiment, the first dielectric material 110e, the fifth dielectric material 115e, the second dielectric material 120e, the fourth dielectric material 140e, the third dielectric material 130e, and the sixth dielectric material 135e preferably use high-frequency high-speed materials. In addition, the dielectric constant of the first dielectric material 110e, the dielectric constant of the fourth dielectric material 140e, and the dielectric constant of the third dielectric material 130e should consider impedance matching, and the dielectric loss of the first dielectric material 110e, the dielectric loss of the fourth dielectric material 140e, and the dielectric loss of the third dielectric material 130e are, preferably, respectively greater than 0 and less than 0.1. The lower the dielectric loss, the higher the signal quality.

Figure 6A:
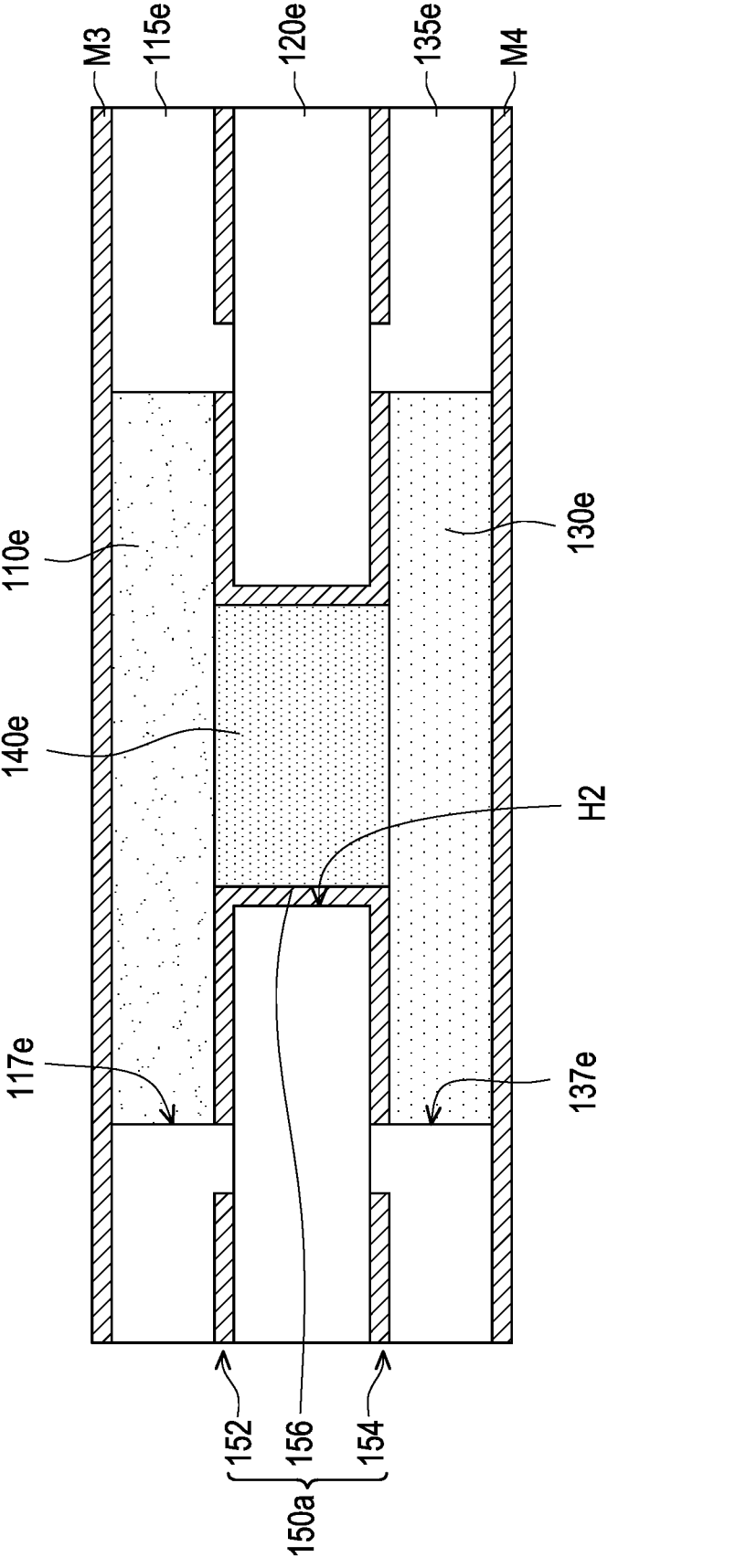
FIG. 6A to FIG. 6D are schematic cross-sectional views of a manufacturing method of a circuit board according to another embodiment of the disclosure.
Figure 6B:
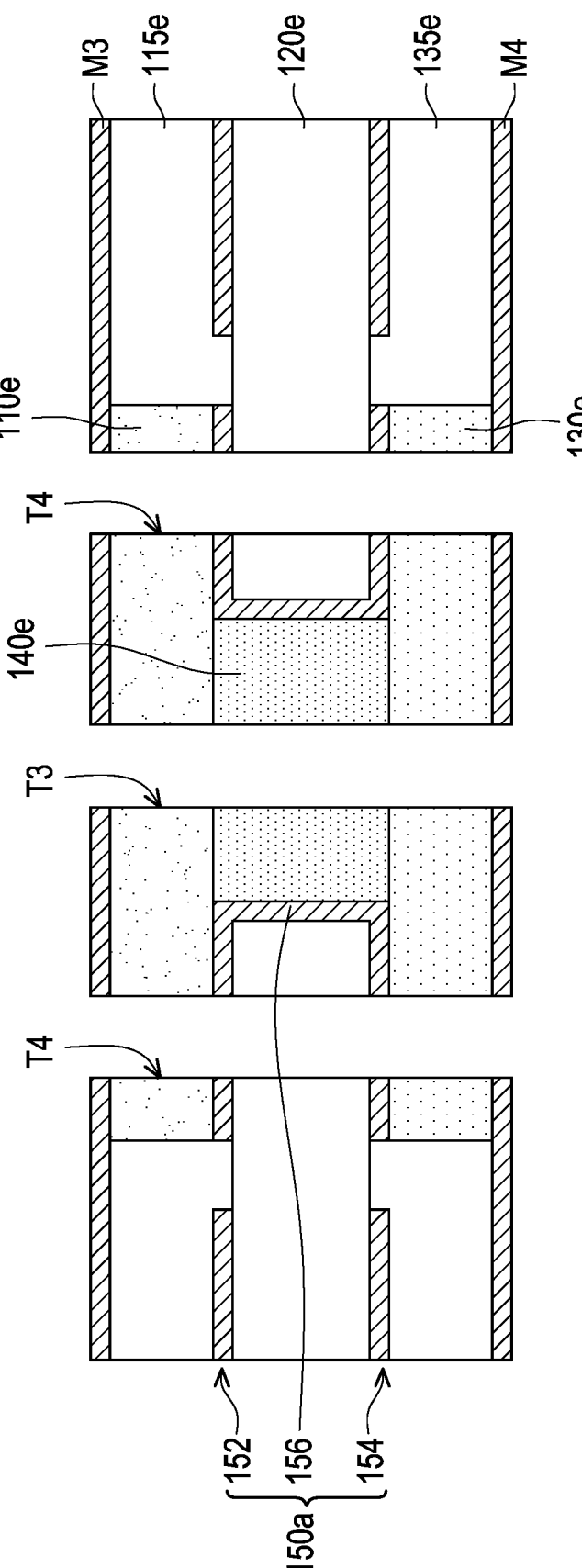

Next, please refer to FIG. 6B. A first through hole T3 and multiple second through holes T4 are formed. The first through hole T3 passes through the first metal layer M3, the first dielectric material 110e, the fourth dielectric material 140e, the third dielectric material 130e, and the second metal layer M4. Each second through hole T4 passes through the first metal layer M3, the first dielectric material 110e, the first circuit layer 152, the second dielectric material 120e, the second circuit layer 154, the third dielectric material 130e, and the second metal layer M4. After that, please refer to FIG. 6C. A conductive material layer E5 is formed to cover an inner wall of the first through hole T3, an inner wall of each second through hole T4, the first metal layer M3, and the second metal layer M4.

Figure 6C:
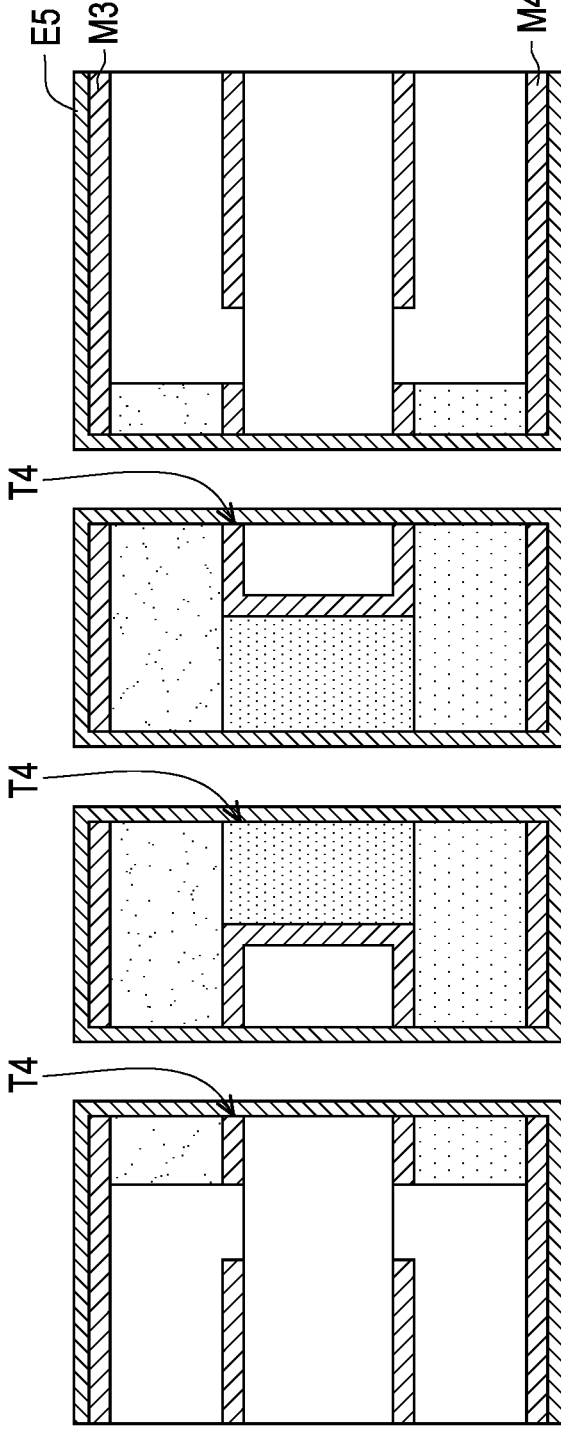
Figure 6D:
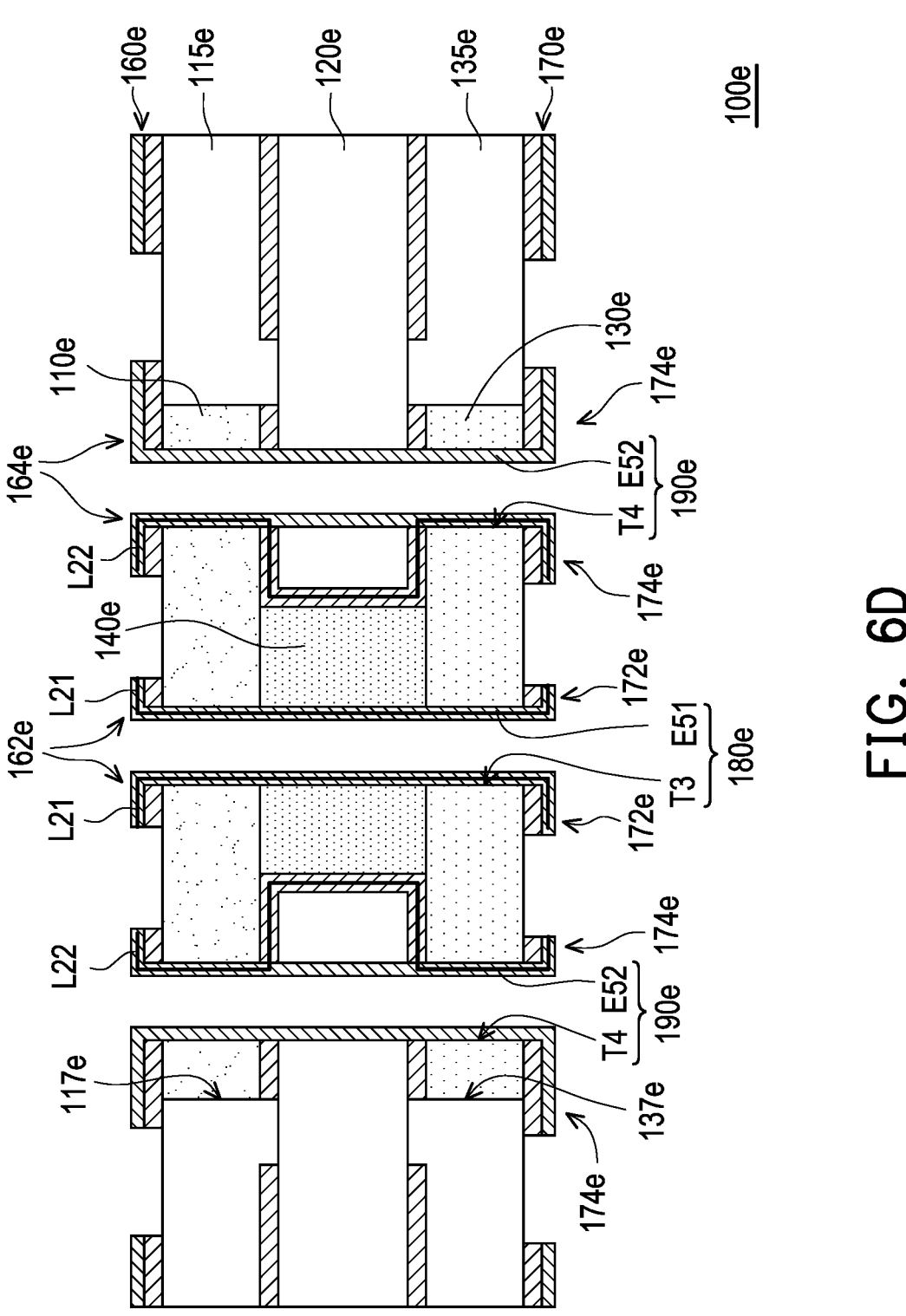
Figure 6E:
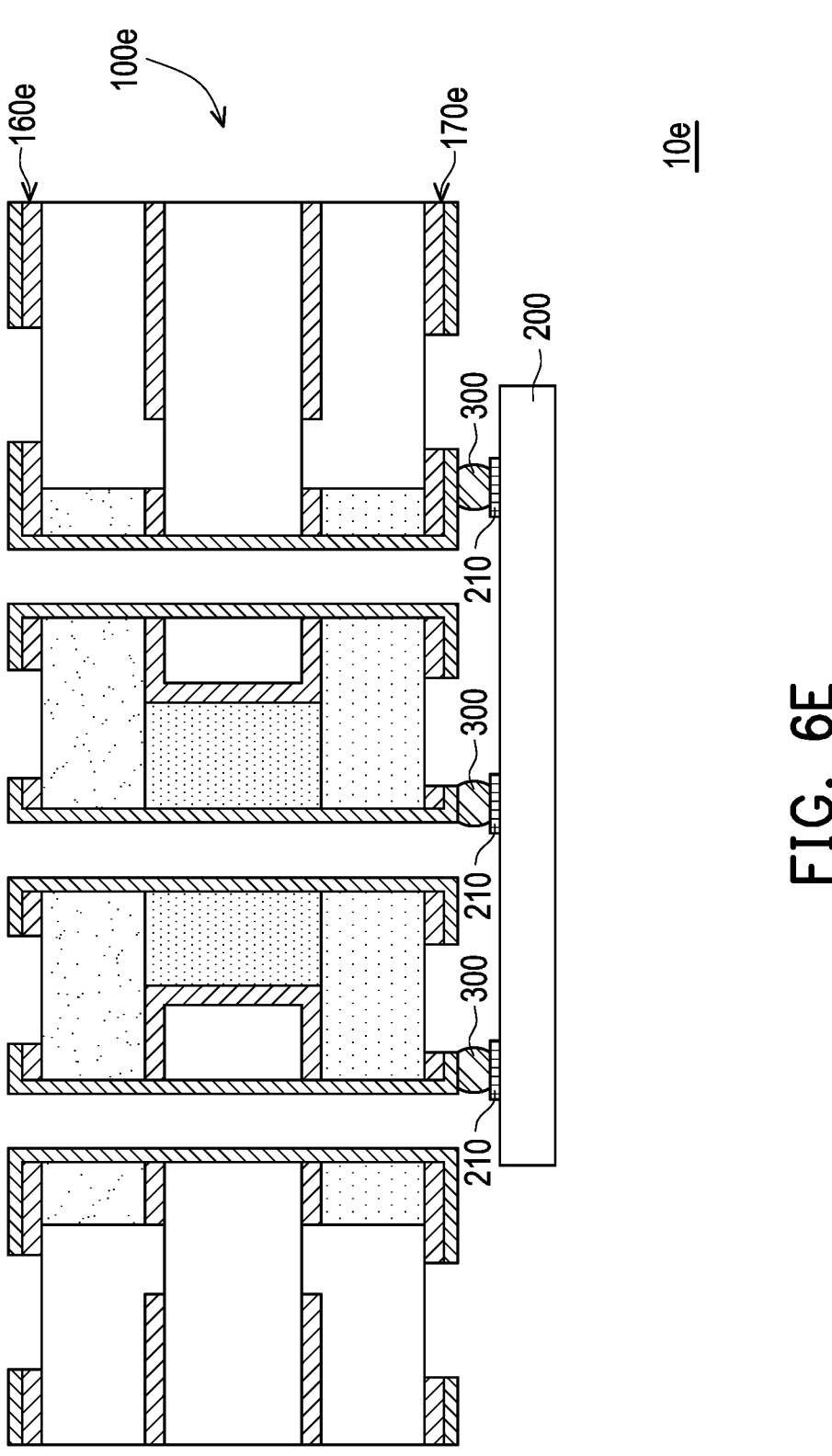
FIG. 6E is a schematic cross-sectional view of an electronic device including the circuit board of FIG. 6D.

Finally, please refer to FIG. 6C and FIG. 6D at the same time. The conductive material layer E5, the first metal layer M3, and the second metal layer M4 are patterned to form a first external circuit layer 160e, a second external circuit layer 170e, a first conductive via 180e, and a second conductive via 190e. In other words, the first conductive via 180e, the second conductive via 190e, the first external circuit layer 160e, and the second external circuit layer 170e of this embodiment are formed simultaneously. In detail, the first external circuit layer 160e is formed on the first dielectric material 110e and the fifth dielectric material 115e, and the second external circuit layer 170e is formed on the third dielectric material 130e and the sixth dielectric material 135e. The first conductive via 180e is electrically connected to the first external circuit layer 160e and the second external circuit layer 170e to define a signal path L21, and the second conductive via 190e is electrically connected to the first external circuit layer 160e, the conductive structure 150a, and the second external circuit layer 170e to define a ground path L22, and the ground path L22 surrounds the signal path L21. It should be noted that according to a magnetic force generated by Ampere's right-hand rule, the ground path L22 preferably passes through the first circuit layer 152, the conductive connection layer 156, and the second circuit layer 154 of the conductive structure 150a, as shown in FIG. 6D.

Further, the first external circuit layer 160e includes a first signal circuit 162e and a first ground circuit 164e, and the second external circuit layer 170e includes a second signal circuit 172e and a second ground circuit 174e. The first signal circuit 162e, the first conductive via 180e, and the second signal circuit 172e define the signal path L21. The first ground circuit 164e, the second conductive via 190e, the first circuit layer 152, the conductive connection layer 156, the second circuit layer 154, the second conductive via 190e, and the second ground circuit 174e define the ground path L22. The first conductive via 180e includes a first through hole T3 and a first conductive material layer E51. The first through hole T3 of the first conductive via 180e passes through the first dielectric material 110e, the fourth dielectric material 140e, and the third dielectric material 130e, and the first conductive material layer E51 covers an inner wall of the first through hole T3 and is electrically connected to the first external circuit layer 160e and the second external circuit layer 170e. Each second conductive via 190e includes each second through hole T4 and a second conductive material layer E52. The second through hole T4 of the second conductive via 190e passes through the first dielectric material 110e, the second dielectric material 120e, the third dielectric material 130e, and a part of the conductive structure 150a, and surrounds the first conductive via 180e, and the second conductive material layer E52 covers an inner wall of each second through hole T4 and is electrically connected to the first external circuit layer 160e, the first circuit layer 152, the second circuit layer 154, and the second external circuit layer 170e. So far, the manufacturing of a circuit board 100e is completed.

Next, please refer to FIG. 6E. In this embodiment, an electronic device 10e includes, for example, the circuit board 100e of FIG. 6D and an electronic element 200, wherein the electronic element 200 is electrically connected to the circuit board 100e, and the electronic element 200 includes multiple pads 210. In addition, the electronic device 10e of this embodiment further includes multiple connectors 300, which are disposed between the second external circuit layer 170e of the circuit board 100e and the pads 210 of the electronic element 200, wherein the electronic element 200 is electrically connected to the circuit board 100e through the connectors 300. Here, the connector 300 is, for example, a solder ball, but not limited thereto. In terms of application, an antenna structure may be disposed on the other side of the circuit board 100e opposite to the electronic element 200, and the antenna structure may be electrically connected to the first external circuit layer 160e of the circuit board 100e. For the application in the integrated circuit and the antenna, the circuit board 100e of this embodiment can solve the issue of signal interference on the same plane, and can reduce signal energy loss and reduce noise interference, thereby improving the signal transmission reliability.

Please refer to FIG. 2A and FIG. 6E at the same time. In order to improve the bonding force between the circuit board and the electronic element, in an embodiment not shown, the circuit board may include the connecting metal layer CM shown in FIG. 2A, which is disposed on the third dielectric material 130e and/or the sixth dielectric material 135e, and is electrically connected to the first conductive via 180e and/or the second conductive via 190e. Here, through the configuration of the connecting metal layer CM, the contact area between the first conductive via 180e and/or the second conductive via 190e of the circuit board and the connectors 300 may be extended and increased, thereby improving the bonding force with the electronic element 200, so that the electronic device can have a preferred structural reliability.

Figure 7A:
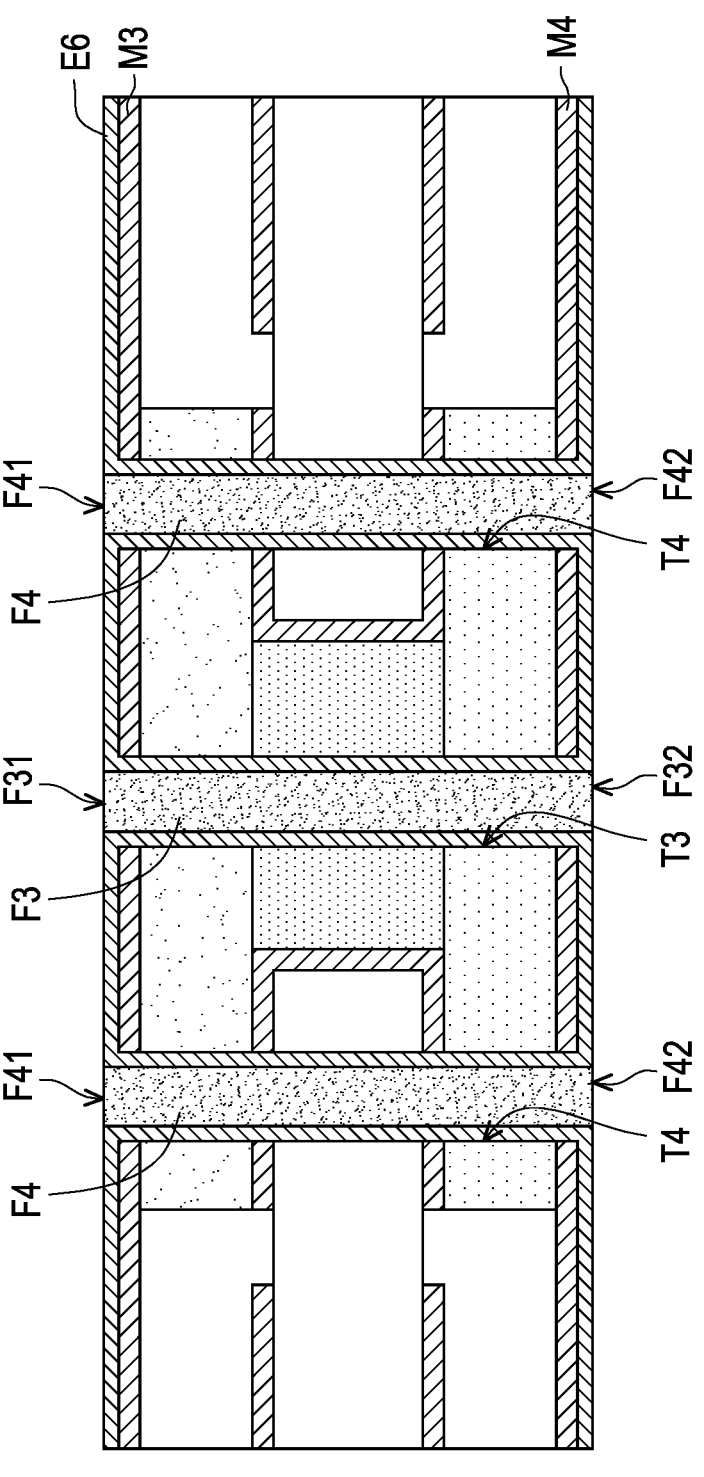
FIG. 7A to FIG. 7B are schematic cross-sectional views of partial steps of another manufacturing method of a circuit board according to another embodiment of the disclosure.
Figure 7B:
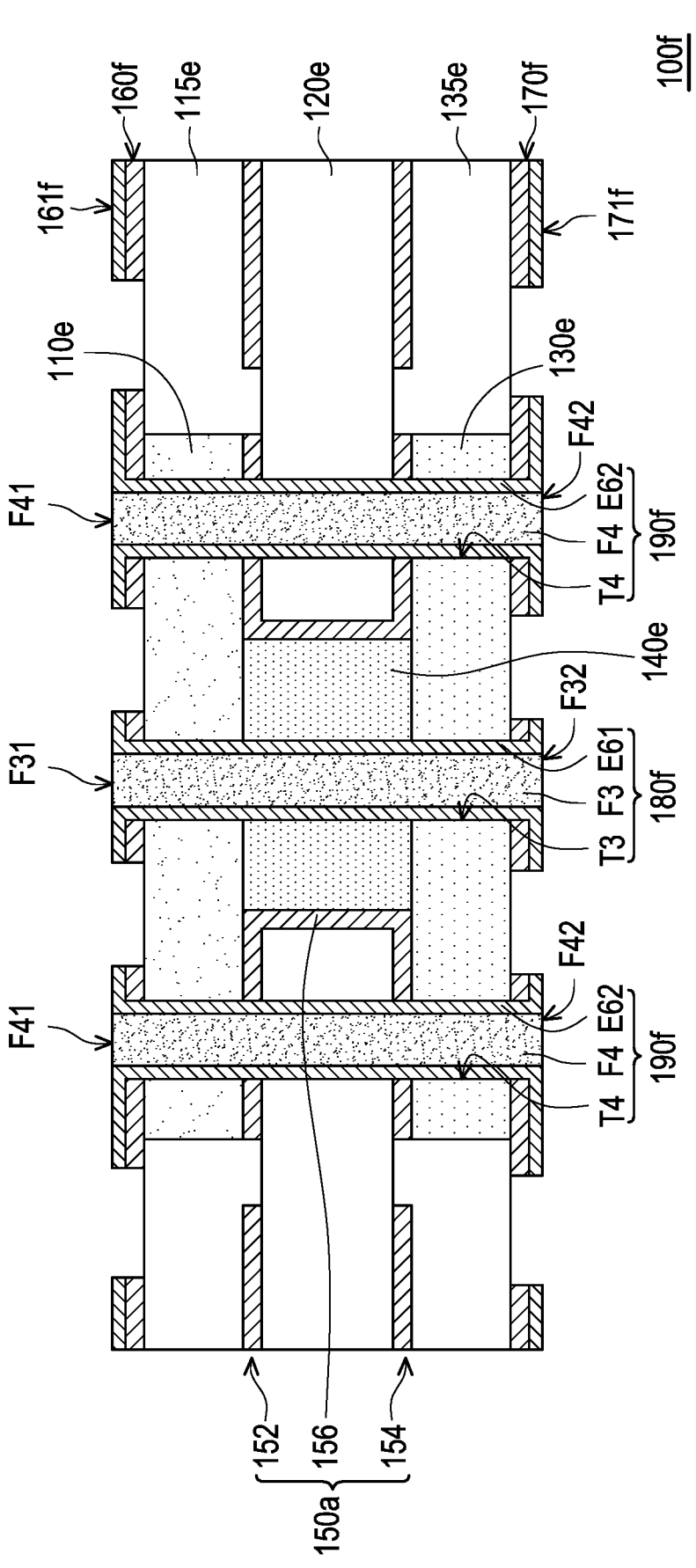
Figure 7C:
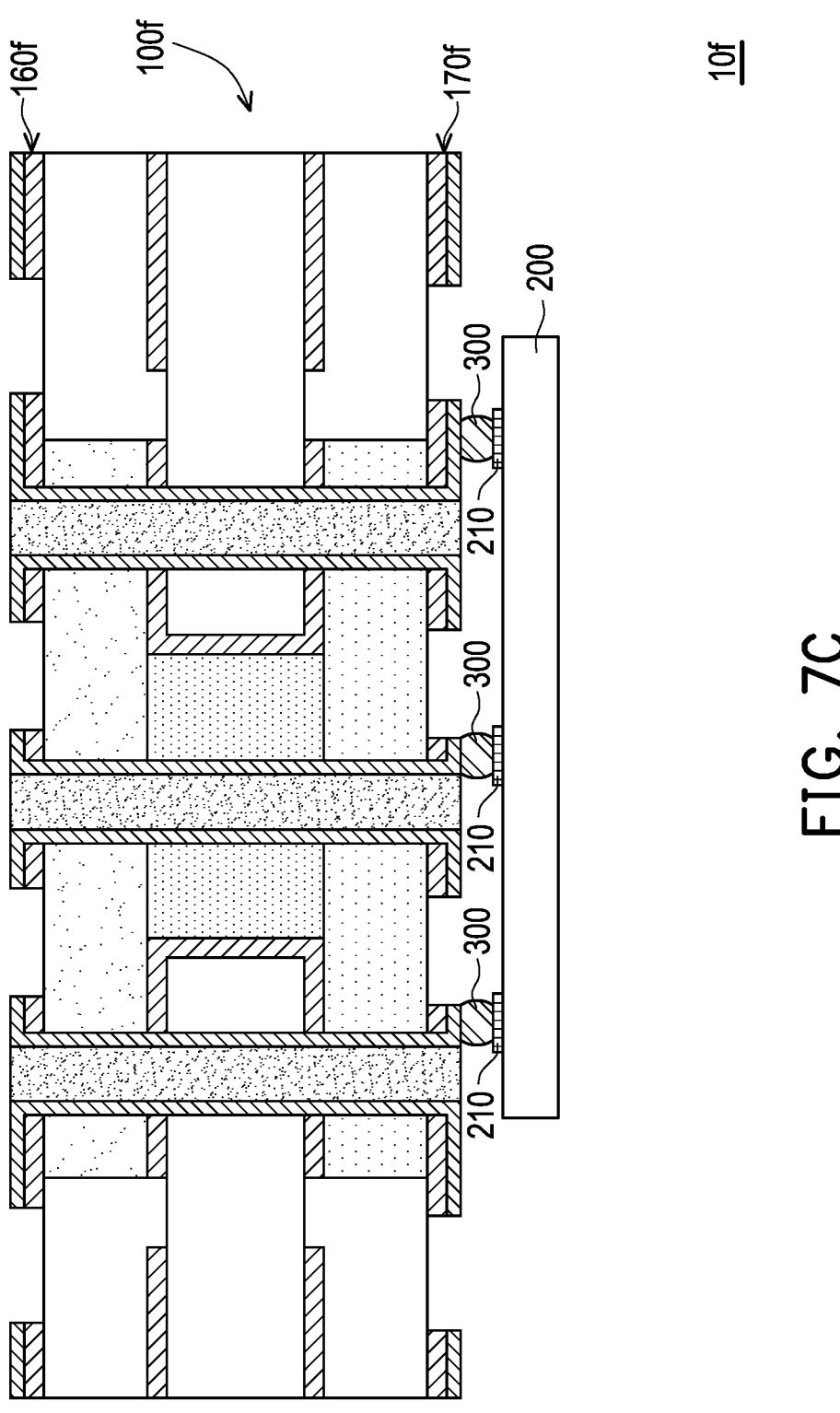
FIG. 7C is a schematic cross-sectional view of an electronic device including the circuit board of FIG. 7B.

FIG. 7A to FIG. 7B are schematic cross-sectional views of partial steps of another manufacturing method of a circuit board according to another embodiment of the disclosure. FIG. 7C is a schematic cross-sectional view of an electronic device including the circuit board of FIG. 7B. Please refer to FIG. 6C and FIG. 7A at the same time. A manufacturing method of a circuit board of this embodiment is similar to the above-mentioned manufacturing method of the circuit board, and the difference between the two is as follows. Please refer to FIG. 7A. After forming a conductive material layer E6, a plugging process is performed. A first hole filling material F3 and a second hole filling material F4 are respectively filled in the first through hole T3 and each second through hole T4, wherein the first hole filling material F3 fills the first through hole T3, and the second hole filling material F4 fills the second through hole T4. Preferably, a first upper surface F31 and a first lower surface F32 opposite to each other of the first hole filling material F3 and a second upper surface F41 and a second lower surface F42 opposite to each other of the second hole filling material F4 are respectively flush with the conductive material layer E6. If the first hole filling material F3 and the second hole filling material F4 are higher than the conductive material layer E6, a grinding manner may be selected, so that the first upper surface F31 and the first lower surface F32 of the first hole filling material F3 and the second upper surface F41 and the second lower surface F42 of the second hole filling material F4 are respectively flush with the conductive material layer E6, thereby maintaining a preferred flatness. Here, the materials of the first hole filling material F3 and the second hole filling material F4 are, for example, resin, which may be regarded as a plugging agent or a dielectric material with a dielectric constant of higher than 3.6 and a dielectric loss of lower than 0.05.

After that, please refer to FIG. 7A and FIG. 7B at the same time. A lithography process is performed to pattern the conductive material layer E6, the first metal layer M3, and the second metal layer M4, so as to form a first external circuit layer 160f, a second external circuit layer 170f, a first conductive via 180f, and a second conductive via 190f. Here, the first external circuit layer 160f is formed on the first dielectric material 110e and the fifth dielectric material 115e, and the second external circuit layer 170f is formed on the third dielectric material 130e and the sixth dielectric material 135e. The first conductive via 180f includes the first through hole T3, a first conductive material layer E61, and the first hole filling material F3, wherein the first hole filling material F3 fills the first through hole T3, and the first upper surface F31 and the first lower surface F32 opposite to each other of the first hole filling material F3 are respectively flush with a top surface 161f of the first external circuit layer 160f and a bottom surface 171f of the second external circuit layer 170f. Each second conductive via 190f includes the second through hole T4, a second conductive material layer E62, and the second hole filling material F4, wherein the second hole filling material F4 fills the second through hole T4, and the second upper surface F41 and the second lower surface F42 opposite to each other of the second hole filling material F4 are respectively flush with the top surface 161f of the first external circuit layer 160f and the bottom surface 171f of the second external circuit layer 170f. So far, the manufacturing of a circuit board 100f is completed.

Next, please refer to FIG. 7C. In this embodiment, an electronic device 10f includes, for example, the circuit board 100f of FIG. 7B and an electronic element 200, wherein the electronic element 200 is electrically connected to the circuit board 100f, and the electronic element 200 includes multiple pads 210. In addition, the electronic device 10f of this embodiment further includes multiple connectors 300, which are disposed between the second external circuit layer 170f of the circuit board 100f and the pads 210 of the electronic element 200, wherein the electronic element 200 is electrically connected to the circuit board 100f through the connectors 300. Here, the connector 300 is, for example, a solder ball, but not limited thereto. In terms of application, an antenna structure may be disposed on the other side of the circuit board 100f opposite to the electronic element 200, and the antenna structure may be electrically connected to the first external circuit layer 160f of the circuit board 100f. For the application in the integrated circuit and the antenna, the circuit board 100f of this embodiment can solve the issue of signal interference on the same plane, and can reduce signal energy loss and reduce noise interference, thereby improving the signal transmission reliability.

Please refer to FIG. 2A and FIG. 7C at the same time. In order to improve the bonding force between the circuit board and the electronic element, in an embodiment not shown, the circuit board may include the connecting metal layer CM shown in FIG. 2A, which is disposed on the third dielectric material 130e and/or the sixth dielectric material 135e, and is electrically connected to the first conductive via 180f and/or the second conductive via 190f. Here, through the configuration of the connecting metal layer CM, the contact area between the first conductive via 180f and/or the second conductive via 190f of the circuit board and the connectors 300 may be extended and increased, thereby improving the bonding force with the electronic element 200, so that the electronic device can have a preferred structural reliability.

Figure 8A:
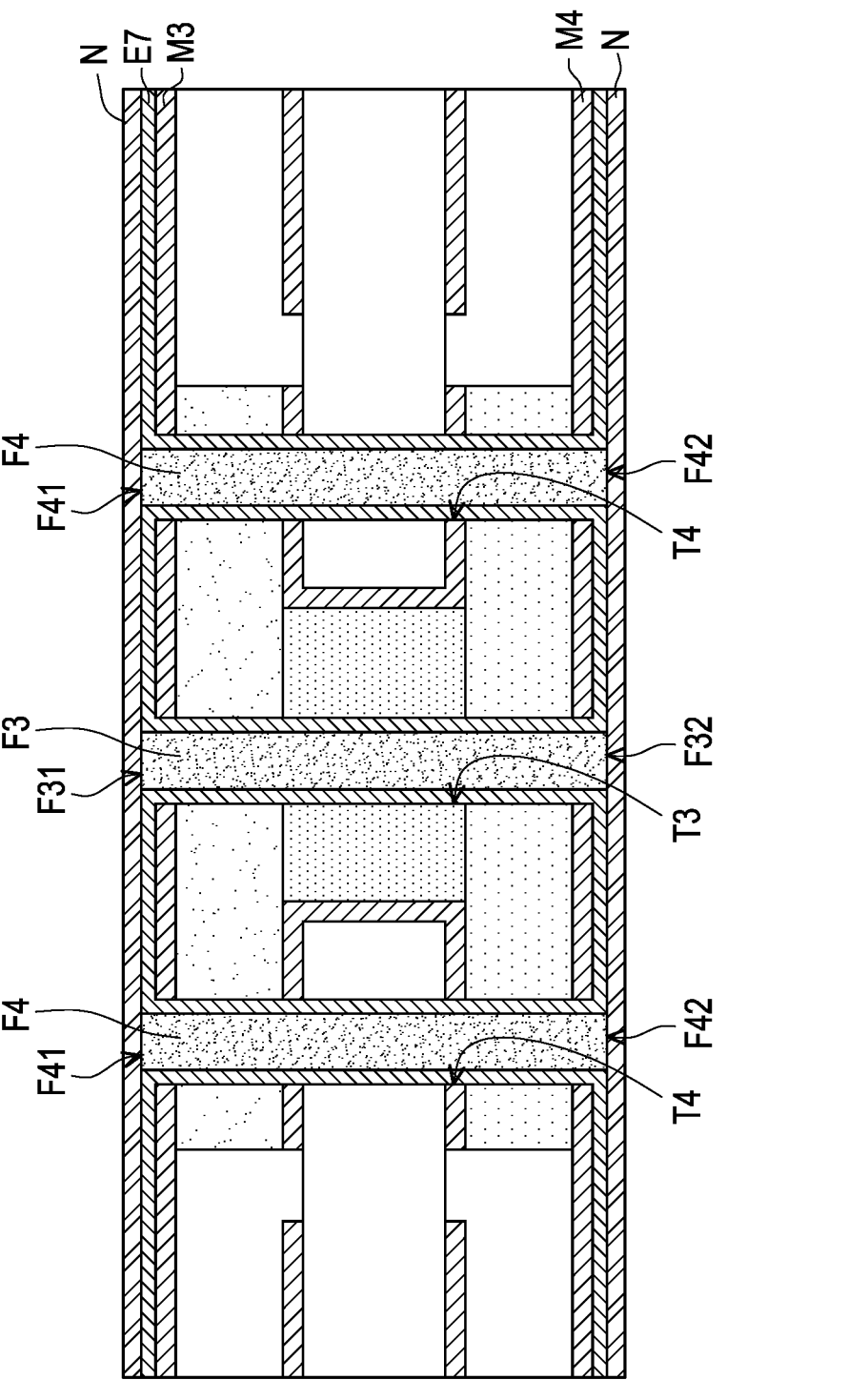
FIG. 8A to FIG. 8B are schematic cross-sectional views of partial steps of another manufacturing method of a circuit board according to another embodiment of the disclosure.
Figure 8B:
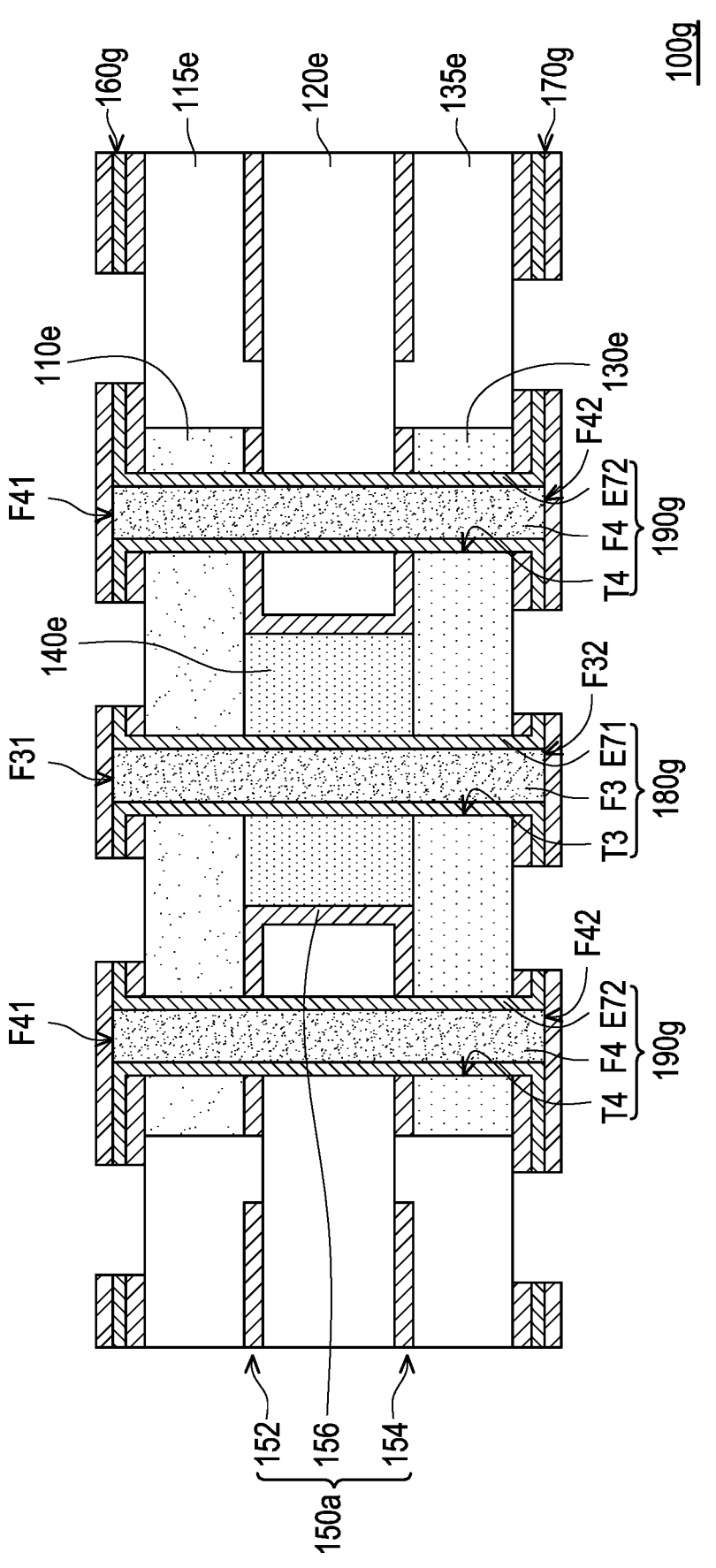
Figure 8C:
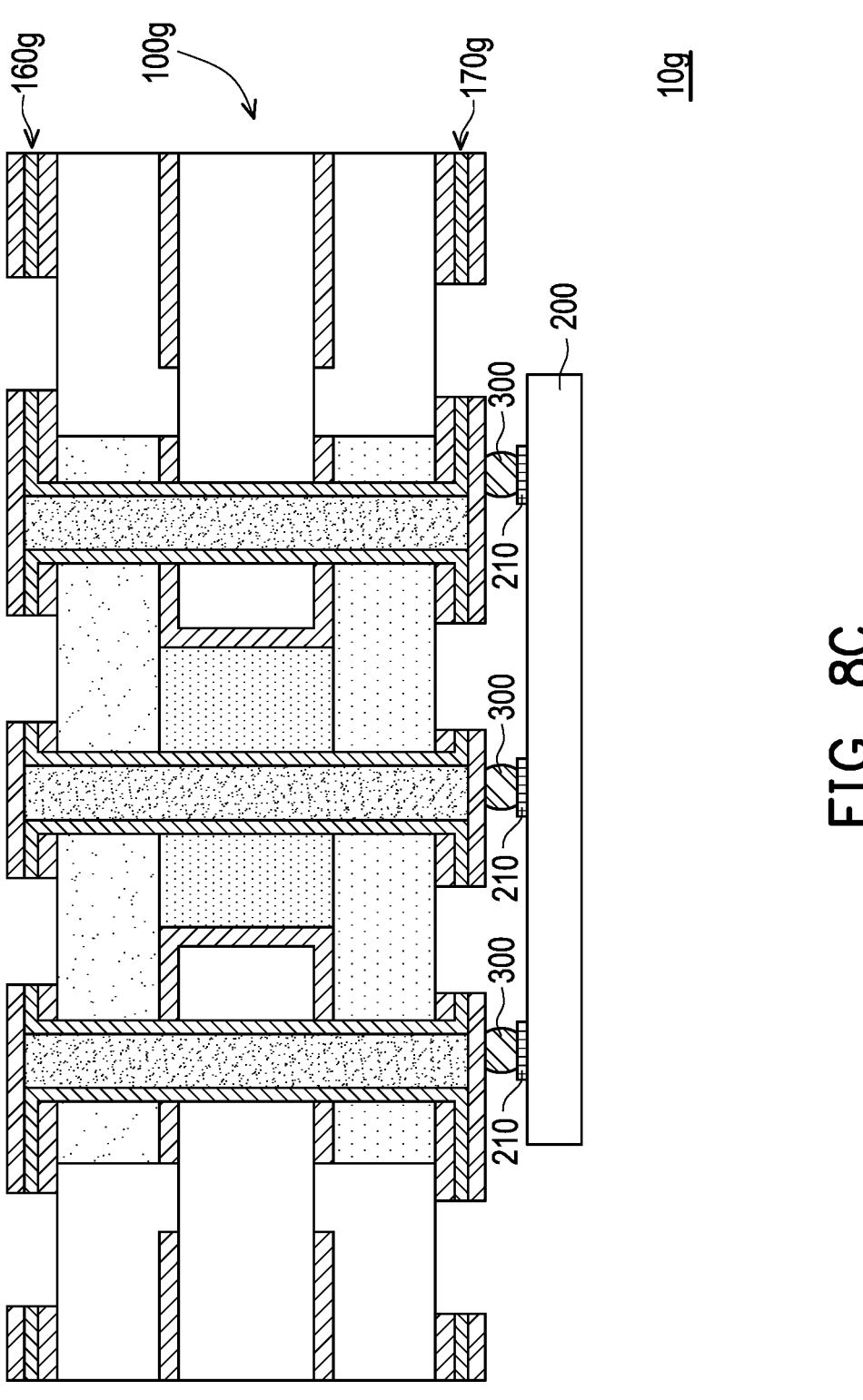
FIG. 8C is a schematic cross-sectional view of an electronic device including the circuit board of FIG. 8B.

FIG. 8A to FIG. 8B are schematic cross-sectional views of partial steps of another manufacturing method of a circuit board according to another embodiment of the disclosure. FIG. 8C is a schematic cross-sectional view of an electronic device including the circuit board of FIG. 8B. Please refer to FIG. 7A and FIG. 8A at the same time. A manufacturing method of a circuit board of this embodiment is similar to the above-mentioned manufacturing method of the circuit board, and the difference between the two is as follows. After the step of respectively filling the first hole filling material F3 and the second hole filling material F4 in the first through hole T3 and each second through hole T4 in FIG. 7A, please refer to FIG. 8A. A cover layer N is formed on a conductive material layer E7, wherein the cover layer N covers the conductive material layer E7, the first upper surface F31 and the first lower surface F32 of the first hole filling material F3, and the second upper surface F41 and the second lower surface F42 of the second hole filling material F4. Here, the material of the cover layer N is, for example, copper, but not limited thereto.

After that, please refer to FIG. 8A and FIG. 8B at the same time. A lithography process is performed to pattern the cover layer N, the conductive material layer E7, the first metal layer M3, and the second metal layer M4, so as to form a first external circuit layer 160g and a second external circuit layer 170g. Here, a first conductive via 180g includes the first through hole T3, a first conductive material layer E71, and the first hole filling material F3, wherein the first hole filling material F3 fills the first through hole T3, and the first external circuit layer 160g and the second external circuit layer 170g respectively cover the first upper surface F31 and the first lower surface F32 of the first hole filling material F3. Each second conductive via 190g includes the second through hole T4, a second conductive material layer E72, and the second hole filling material F4, wherein the second hole filling material F4 fills the second through hole T4, and the first external circuit layer 160g and the second external circuit layer 170g respectively cover the second upper surface F41 and the second lower surface F42 of the second hole filling material F4. So far, the manufacturing of a circuit board 100g is completed.

Next, please refer to FIG. 8C. In this embodiment, an electronic device 10g includes, for example, the circuit board 100g of FIG. 8B and an electronic element 200, wherein the electronic element 200 is electrically connected to the circuit board 100g, and the electronic element 200 includes multiple pads 210. In addition, the electronic device 10g of this embodiment further includes multiple connectors 300, which are disposed between the second external circuit layer 170g of the circuit board 100g and the pads 210 of the electronic element 200, wherein the electronic element 200 is electrically connected to the circuit board 100g through the connectors 300. Here, the connector 300 is, for example, a solder ball, but not limited thereto. In terms of application, an antenna structure may be disposed on the other side of the circuit board 100g opposite to the electronic element 200, and the antenna structure may be electrically connected to the first external circuit layer 160g of the circuit board 100g. For the application in the integrated circuit and the antenna, the circuit board 100g of this embodiment can solve the issue of signal interference on the same plane, and can reduce signal energy loss and reduce noise interference, thereby improving the signal transmission reliability.

Figure 9A:
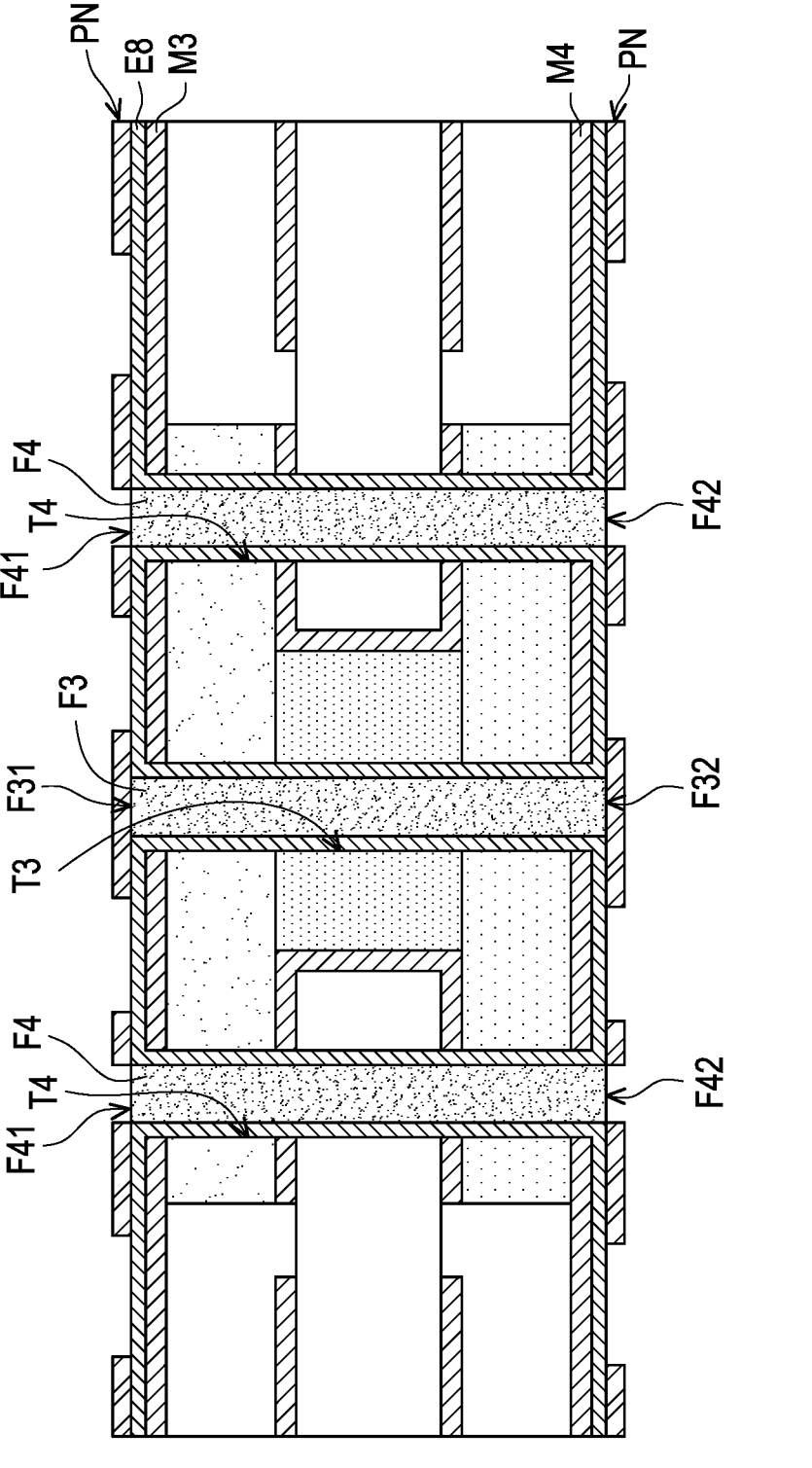
FIG. 9A to FIG. 9B are schematic cross-sectional views of partial steps of another manufacturing method of a circuit board according to another embodiment of the disclosure.
Figure 9B:
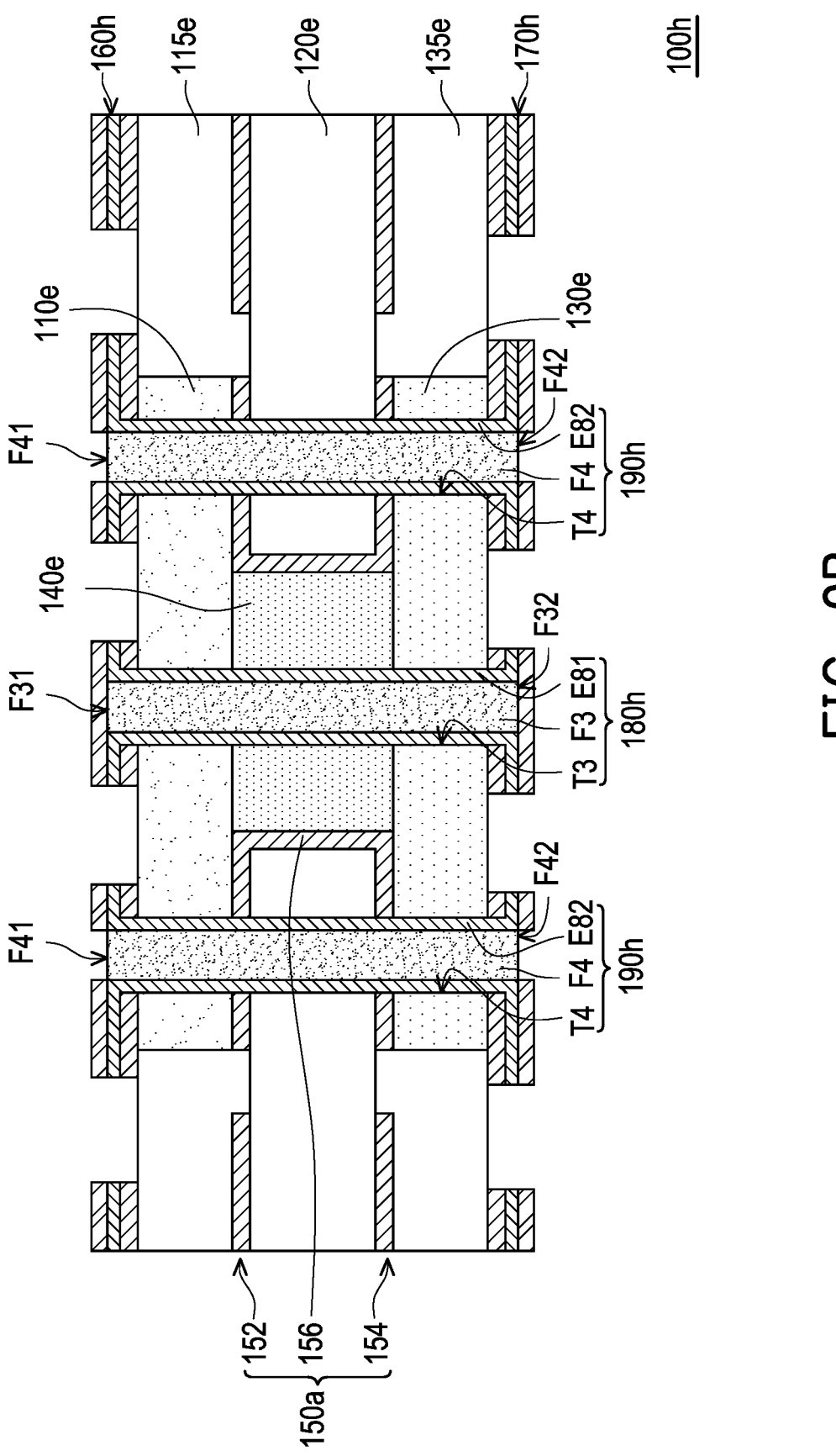
Figure 9C:
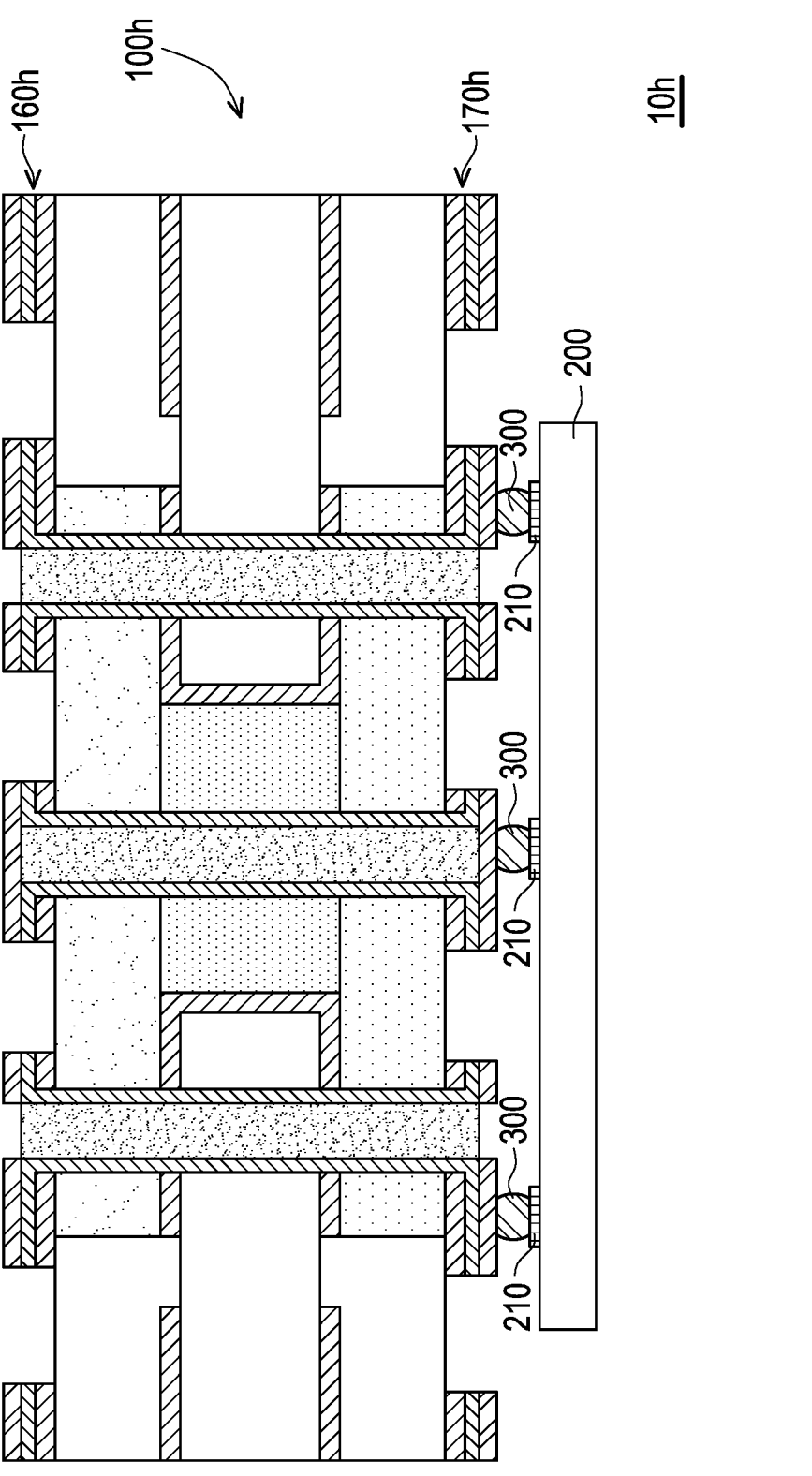
FIG. 9C is a schematic cross-sectional view of an electronic device including the circuit board of FIG. 9B.

FIG. 9A to FIG. 9B are schematic cross-sectional views of partial steps of another manufacturing method of a circuit board according to another embodiment of the disclosure. FIG. 9C is a schematic cross-sectional view of an electronic device including the circuit board of FIG. 9B. Please refer to FIG. 7A and FIG. 9A at the same time. A manufacturing method of a circuit board of this embodiment is similar to the above-mentioned manufacturing method of the circuit board, and the difference between the two is as follows. After the step of respectively filling the first hole filling material F3 and the second hole filling material F4 in the first through hole T3 and each second through hole T4 in FIG. 7A, please refer to FIG. 9A. A patterned cover layer PN is formed on a conductive material layer E8, wherein the patterned cover layer PN covers a part of the conductive material layer E8 and the first upper surface F31 and the first lower surface F32 of the first hole filling material F3. Here, the material of the patterned cover layer PN is, for example, copper, but not limited thereto.

Next, please refer to FIG. 9A and FIG. 9B at the same time. A lithography process is performed to pattern the conductive material layer E8, the first metal layer M3, and the second metal layer M4 with the patterned cover layer PN as a mask, so as to form a first external circuit layer 160h and a second external circuit layer 170h. Here, a first conductive via 180h includes the first through hole T3, a first conductive material layer E81, and the first hole filling material F3, wherein the first hole filling material F3 fills the first through hole T3, and the first external circuit layer 160h and the second external circuit layer 170h respectively cover the first upper surface F31 and the first lower surface F32 of the first hole filling material F3. Each second conductive via 190h includes the second through hole T4, a second conductive material layer E82, and the second hole filling material F4, wherein the second hole filling material F4 fills the second through hole T4, and the first external circuit layer 160h and the second external circuit layer 170h respectively expose the second upper surface F41 and the second lower surface F42 of the second hole filling material F4. So far, the manufacturing of a circuit board 100h is completed.

Next, please refer to FIG. 9C. In this embodiment, an electronic device 10h includes, for example, the circuit board 100h of FIG. 9B and an electronic element 200, wherein the electronic element 200 is electrically connected to the circuit board 100h, and the electronic element 200 includes multiple pads 210. In addition, the electronic device 10h of this embodiment further includes multiple connectors 300, which are disposed between the second external circuit layer 170h of the circuit board 100h and the pads 210 of the electronic element 200, wherein the electronic element 200 is electrically connected to the circuit board 100h through the connectors 300. Here, the connector 300 is, for example, a solder ball, but not limited thereto. In terms of application, an antenna structure may be disposed on the other side of the circuit board 100h opposite to the electronic element 200, and the antenna structure may be electrically connected to the first external circuit layer 160h of the circuit board 100h. For the application in the integrated circuit and the antenna, the circuit board 100h of this embodiment can solve the issue of signal interference on the same plane, and can reduce signal energy loss and reduce noise interference, thereby improving the signal transmission reliability.

FIG. 10A to FIG. 10D are schematic cross-sectional views of a manufacturing method of a circuit board according to another embodiment of the disclosure. FIG. 10E is a schematic cross-sectional view of an electronic device including the circuit board of FIG. 10D. Please refer to FIG. 1A and FIG. 10A at the same time. A manufacturing method of a circuit board of this embodiment is similar to the above-mentioned manufacturing method of the circuit board, and the difference between the two is as follows. In this embodiment, firstly, a second dielectric material 120i and the first circuit layer 152 and the second circuit layer 154 disposed on two opposite sides of the second dielectric material 120i are provided. Next, a third dielectric material 130i and a third circuit layer 158 disposed on the third dielectric material 130i are laminated on the second dielectric material 120i, wherein the third dielectric material 130i is located between the second circuit layer 154 and the third circuit layer 158. Next, vias passing through the first circuit layer 152, the second dielectric material 120i, the second circuit layer 154, the third dielectric material 130i, and the third circuit layer 158 are formed by the manner of laser drilling or mechanical drilling, so that the second dielectric material 120i has a first opening H3, and the third dielectric material 130i has a second opening H4. Next, a conductive connection layer 155 is formed on an inner wall of the first opening H3 of the second dielectric material 120i and an inner wall of the second opening H4 of the third dielectric material 130i. Here, the first circuit layer 152, the second circuit layer 154, the third circuit layer 158, and the conductive connection layer 155 are defined as a conductive structure 150i. The second dielectric material 120i has a first surface S3 and a second surface S4 opposite to each other, and the third dielectric material 130i has a third surface S5 relatively far from the second dielectric material 120i. The first circuit layer 152 is disposed on the first surface S3 of the second dielectric material 120i, the second circuit layer 154 is disposed on the second surface S4 of the second dielectric material 120i, and the third circuit layer 158 is disposed on the third surface S5 of the third dielectric material 130i. The conductive connection layer 155 covers the inner wall of the first opening H3 and the inner wall of the second opening H4, and connects the first circuit layer 152, the second circuit layer 154, and the third circuit layer 158. Next, a plugging process is performed, so that a fourth dielectric material 140i fills the first opening H3 of the second dielectric material 120i and the second opening H4 of the third dielectric material 130i. After that, a first dielectric material 110i and a metal layer M formed on the first dielectric material 110i are laminated on the second dielectric material 120i by thermal lamination, wherein the first dielectric material 110i is located between the metal layer M and the first circuit layer 152 and the fourth dielectric material 140i. So far, the manufacturing of a substrate is completed.

Further, in this embodiment, the first dielectric material 110i, the second dielectric material 120i, the third dielectric material 130*i*, and the fourth dielectric material 140*i* preferably use high-frequency high-speed materials. In addition, the dielectric constant of the fourth dielectric material 140*i* should consider impedance matching, and the dielectric loss of the fourth dielectric material 140*i* is greater than 0 and less than 0.1. The lower the dielectric loss, the higher the signal quality.

Figure 10A:
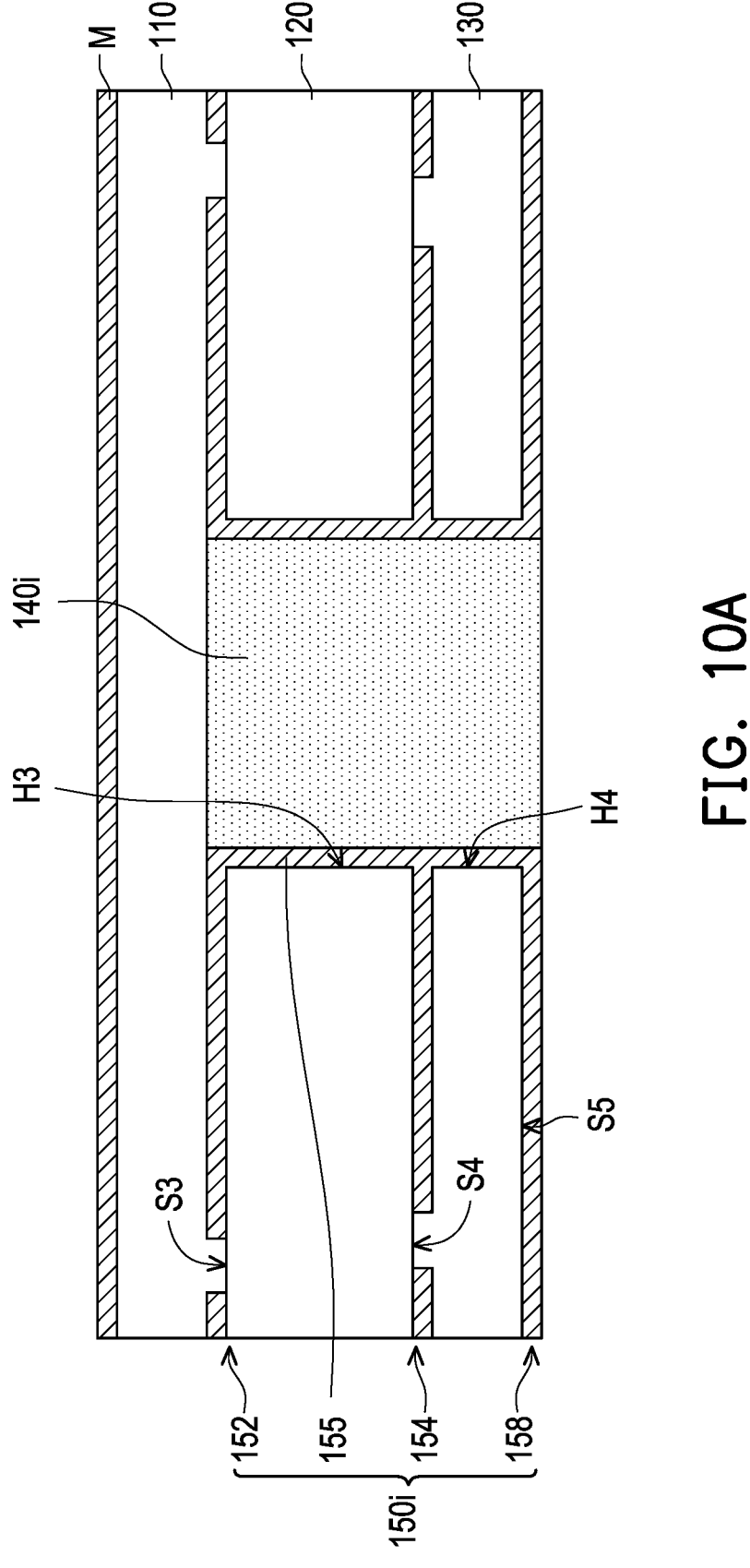
FIG. 10A to FIG. 10D are schematic cross-sectional views of a manufacturing method of a circuit board according to another embodiment of the disclosure.
Figure 10B:
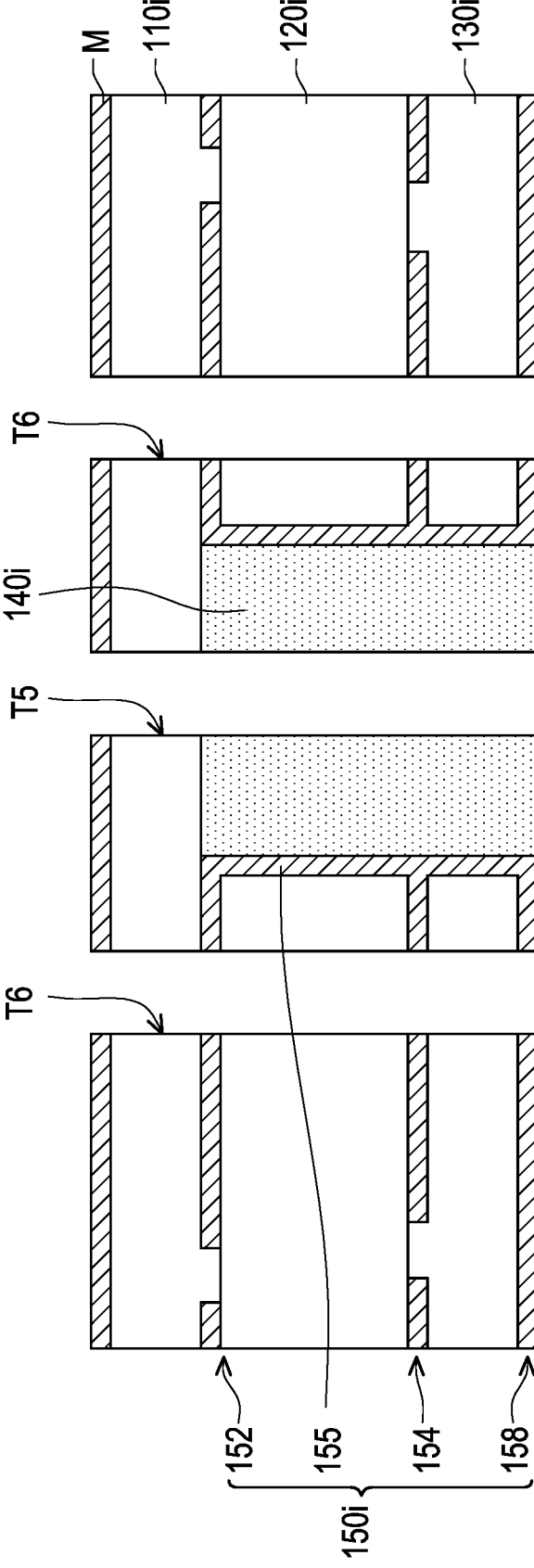

Next, please refer to FIG. 10B. A first through hole T5 and multiple second through holes T6 are formed. The first through hole T5 passes through the metal layer M, the first dielectric material 110*i*, and the fourth dielectric material 140*i*. The second through hole T6 passes through the metal layer M, the first dielectric material 110*i*, the first circuit layer 152, the second dielectric material 120*i*, the second circuit layer 154, the third dielectric material 130*i*, and the third circuit layer 158. After that, please refer to FIG. 10C. A conductive material layer G1 is formed to cover an inner wall of the first through hole T5, an inner wall of each second through hole T6, the metal layer M, the third circuit layer 158, and the fourth dielectric material 140*i*.

Figure 10C:
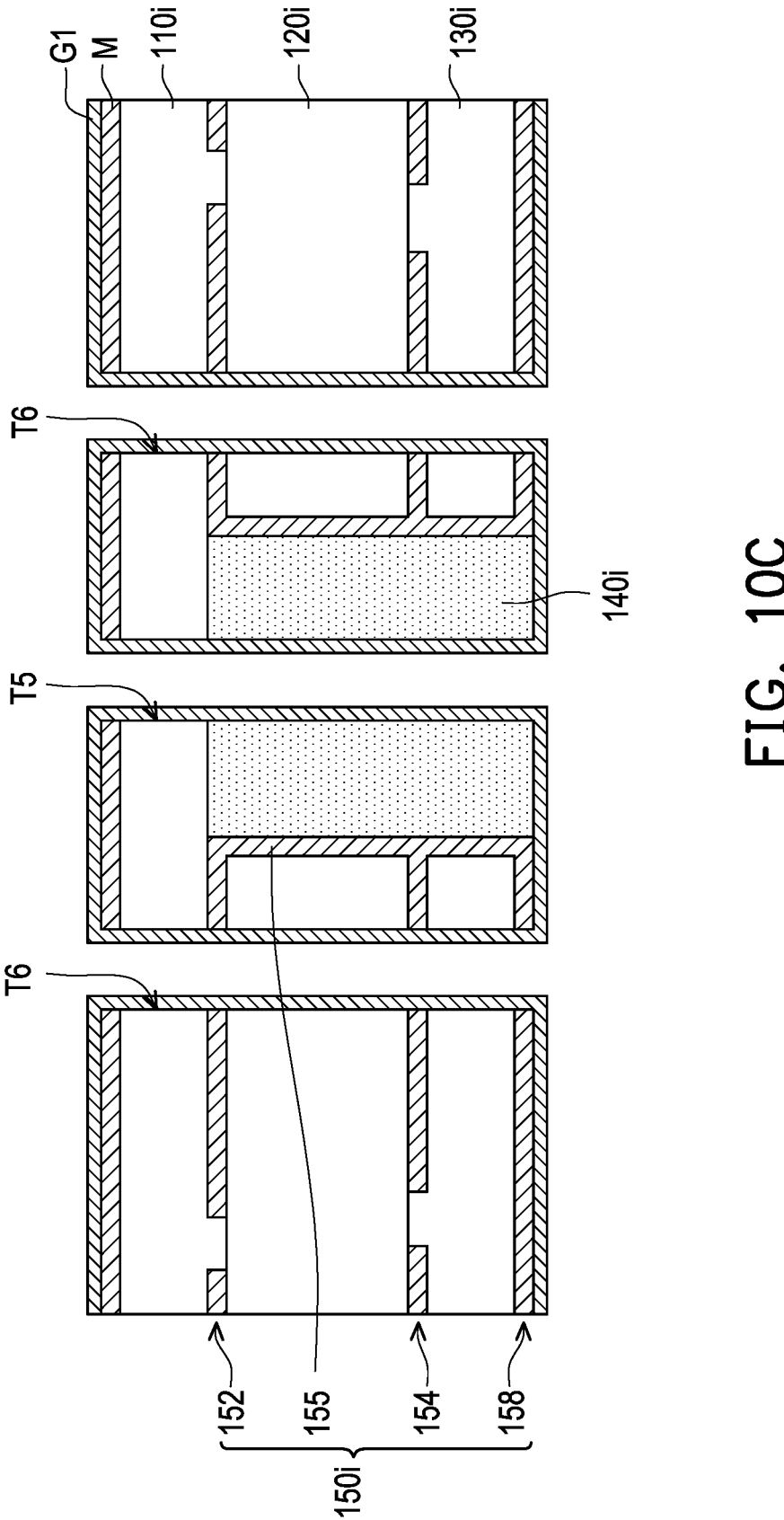
Figure 10D:
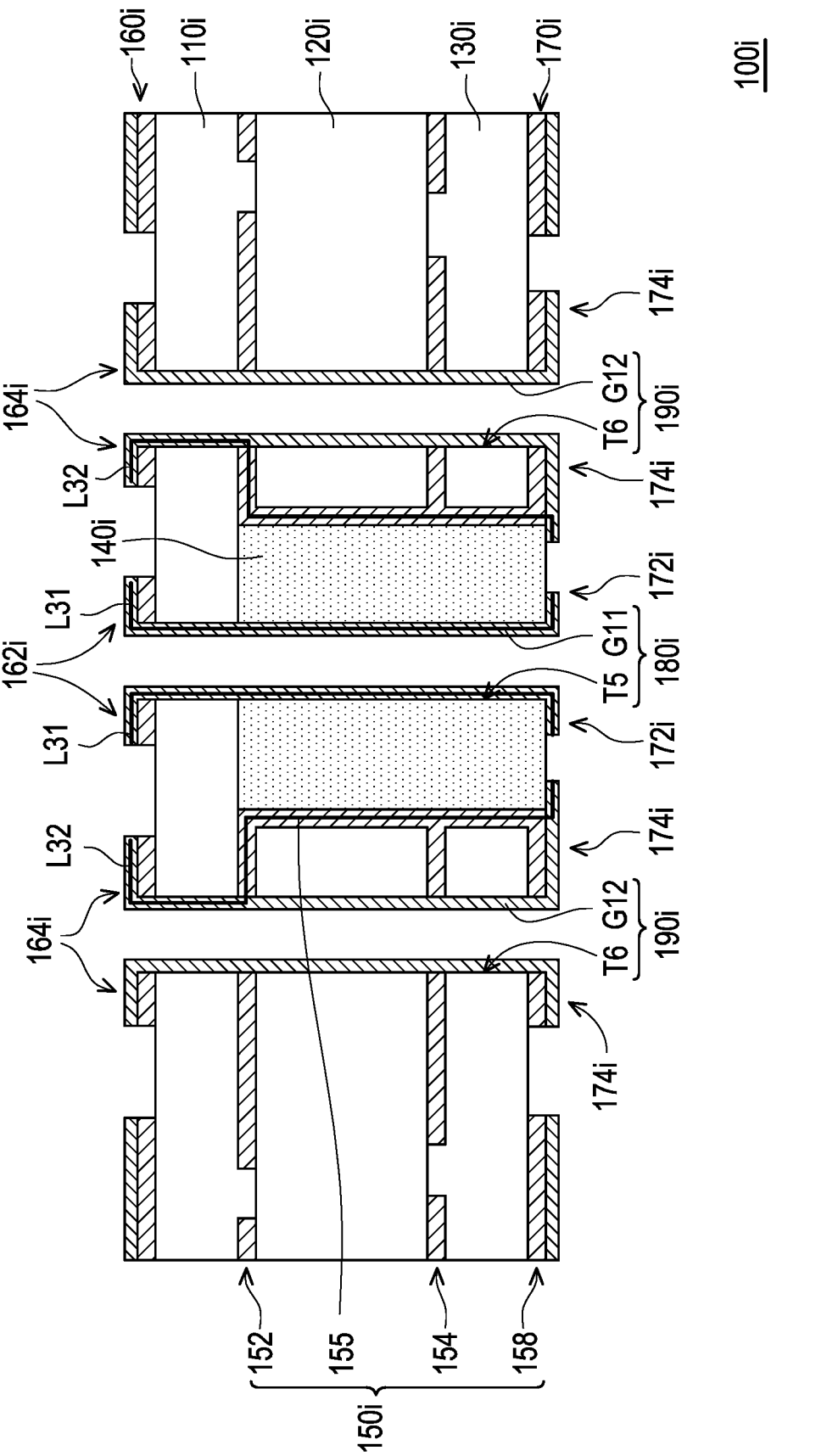
Figure 10E:
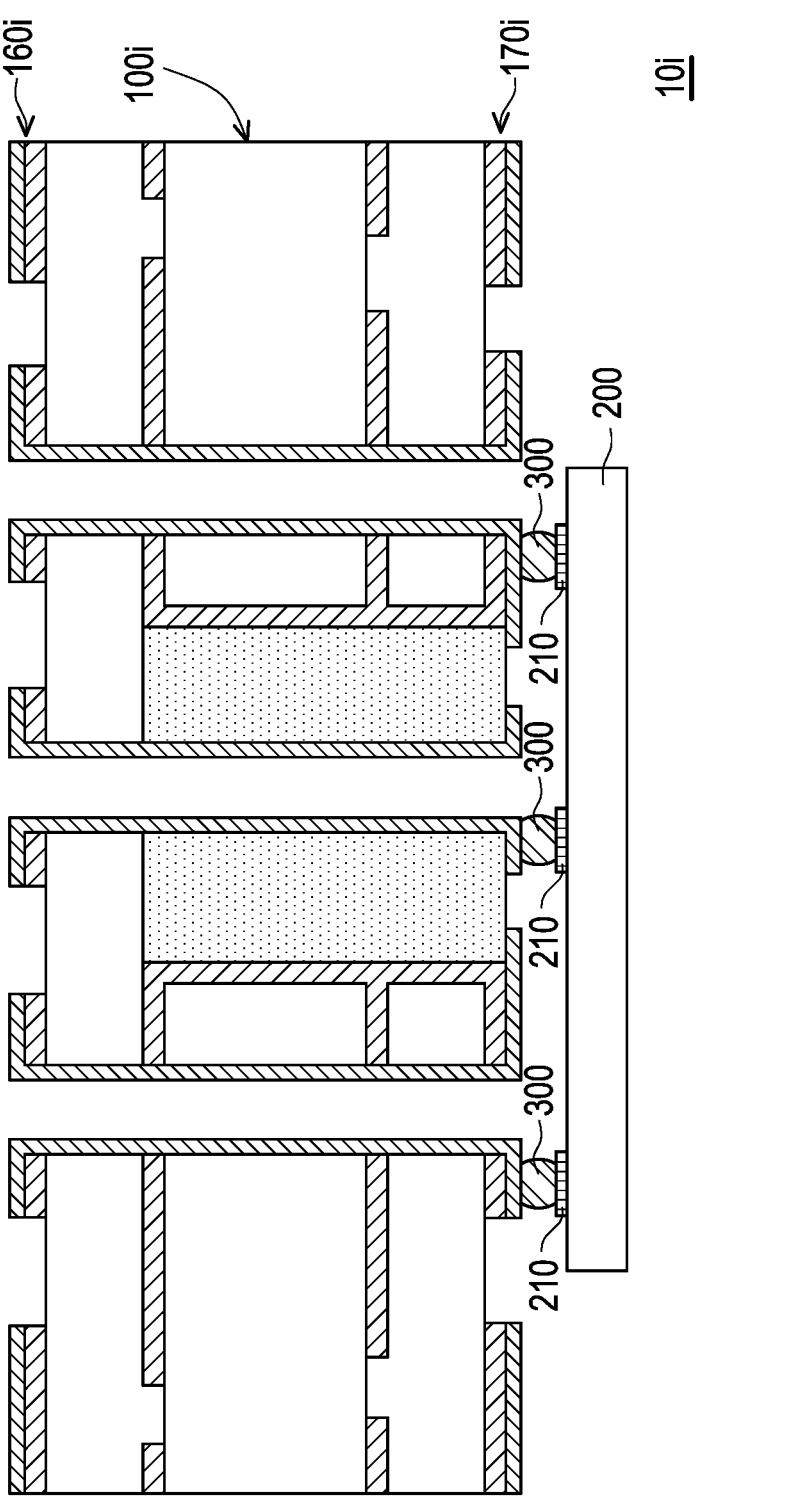
FIG. 10E is a schematic cross-sectional view of an electronic device including the circuit board of FIG. 10D.

Finally, please refer to FIG. 10C and FIG. 10D at the same time. The conductive material layer G1, the metal layer M, and the third circuit layer 158 are patterned to form a first external circuit layer 160*i*, a second external circuit layer 170*i*, a first conductive via 180*i*, and a second conductive via 190*i*. In other words, the first conductive via 180*i*, the second conductive via 190*i*, the first external circuit layer 160*i*, and the second external circuit layer 170*i* of this embodiment are formed simultaneously. Specifically, the first external circuit layer 160*i* is formed on the first dielectric material 110*i*, and the second external circuit layer 170*i* is formed on the third dielectric material 130*i* and the fourth dielectric material 140*i*. The first conductive via 180*i* is electrically connected to the first external circuit layer 160*i* and the second external circuit layer 170*i* to define a signal path L31, and the second conductive via 190*i* is electrically connected to the first external circuit layer 160*i*, the conductive structure 150*i*, and the second external circuit layer 170*i* to define a ground path L32, and the ground path L32 surrounds the signal path L31. It should be noted that according to a magnetic force generated by Ampere's right-hand rule, the ground path L32 preferably passes through the first circuit layer 152 and the conductive connection layer 155 of the conductive structure 150*i*, as shown in FIG. 10D.

Further, the first external circuit layer 160*i* includes a first signal circuit 162*i* and a first ground circuit 164*i*, and the second external circuit layer 170*i* includes a second signal circuit 172*i* and a second ground circuit 174*i*. The first signal circuit 162*i*, the first conductive via 180*i*, and the second signal circuit 172*i* define the signal path L31. The first ground circuit 164*i*, each second conductive via 190*i*, the first circuit layer 152, the conductive connection layer 155, and the second ground circuit 174*i* define the ground path L32. The first conductive via 180*i* includes the first through hole T5 and a first conductive material layer G11. The first conductive material layer G11 covers the inner wall of the first through hole T5 and is electrically connected to the first external circuit layer 160*i* and the second external circuit layer 170*i*. Each second conductive via 190*i* includes each second through hole T6 and a second conductive material layer G12. The second conductive material layer G12 covers the inner wall of each second through hole T6 and is electrically connected to the first external circuit layer 160*i*, the first circuit layer 152, the second circuit layer 154, the third circuit layer 158, and the second external circuit layer 170*i*. So far, the manufacturing of a circuit board 100*i* is completed.

Next, please refer to FIG. 10E. In this embodiment, an electronic device 10*i* includes, for example, the circuit board 100*i* of FIG. 10D and an electronic element 200, wherein the electronic element 200 is electrically connected to the circuit board 100*i*, and the electronic element 200 includes multiple pads 210. In addition, the electronic device 10*i* of this embodiment further includes multiple connectors 300, which are disposed between the second external circuit layer 170*i* of the circuit board 100*i* and the pads 210 of the electronic element 200, wherein the electronic element 200 is electrically connected to the circuit board 100*i* through the connectors 300. Here, the connector 300 is, for example, a solder ball, but not limited thereto. In terms of application, an antenna structure may be disposed on the other side of the circuit board 100*i* opposite to the electronic element 200, and the antenna structure may be electrically connected to the first external circuit layer 160*i* of the circuit board 100*i*. For the application in the integrated circuit and the antenna, the circuit board 100*i* of this embodiment can solve the issue of signal interference on the same plane, and can reduce signal energy loss and reduce noise interference, thereby improving the signal transmission reliability.

Please refer to FIG. 2A and FIG. 10E at the same time. In order to improve the bonding force between the circuit board and the electronic element, in an embodiment not shown, the circuit board may include the connecting metal layer CM shown in FIG. 2A, which is disposed on the fourth dielectric material 140*i* and/or the third dielectric material 130*i*, and is electrically connected to the first conductive via 180*i* and/or the second conductive via 190*i*. Here, through the configuration of the connecting metal layer CM, the contact area between the first conductive via 180*i* and/or the second conductive via 190*i* of the circuit board and the connectors 300 may be extended and increased, thereby improving the bonding force with the electronic element 200, so that the electronic device can have a preferred structural reliability.

Figure 11A:
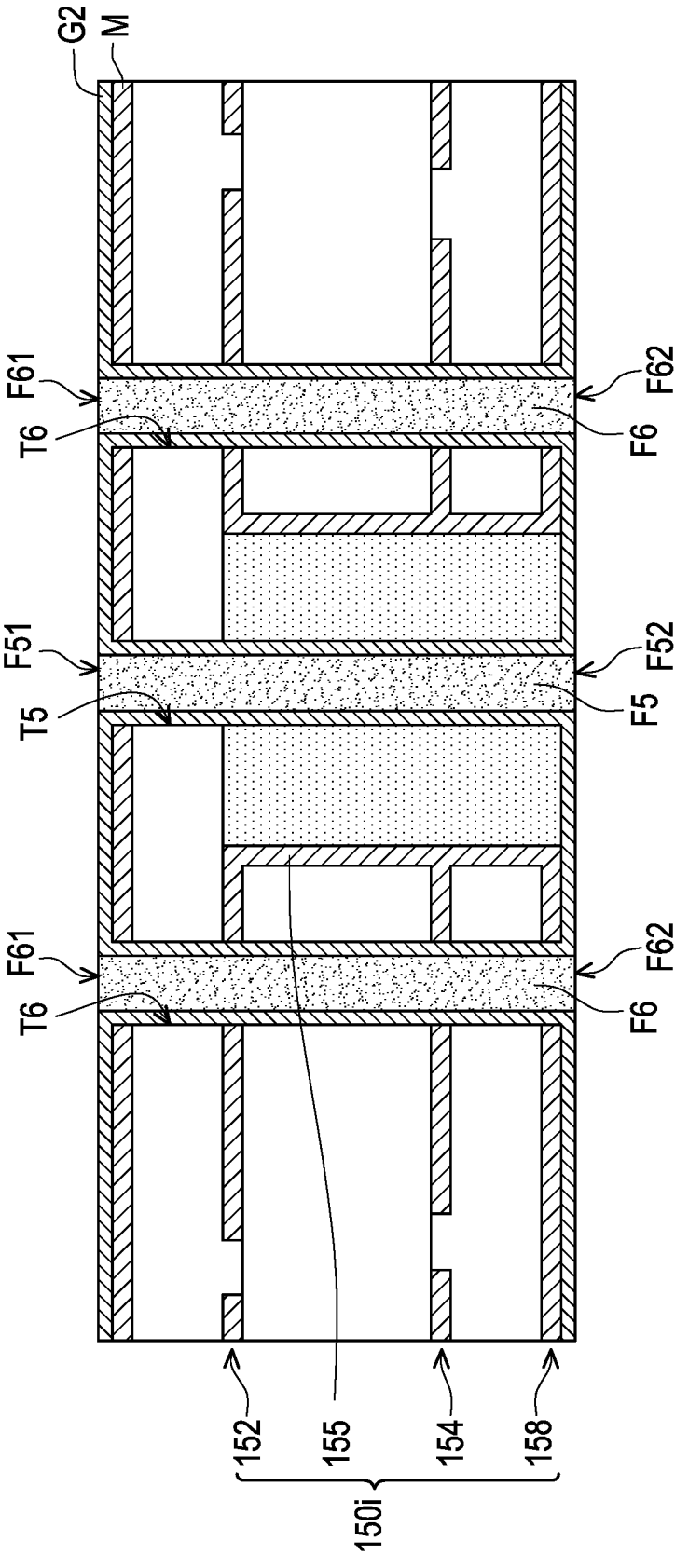
FIG. 11A to FIG. 11B are schematic cross-sectional views of partial steps of another manufacturing method of a circuit board according to another embodiment of the disclosure.
Figure 11B:
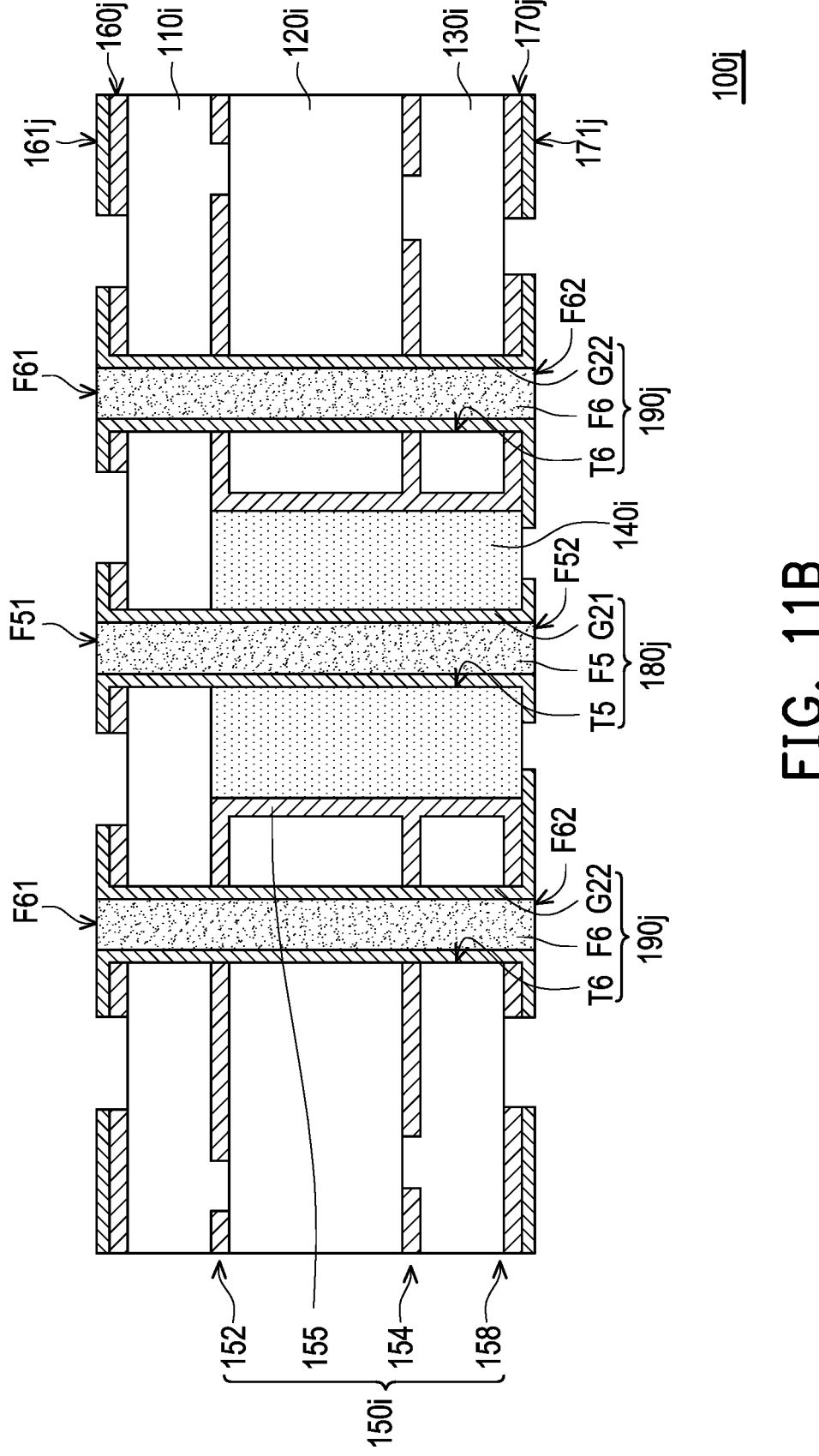
Figure 11C:
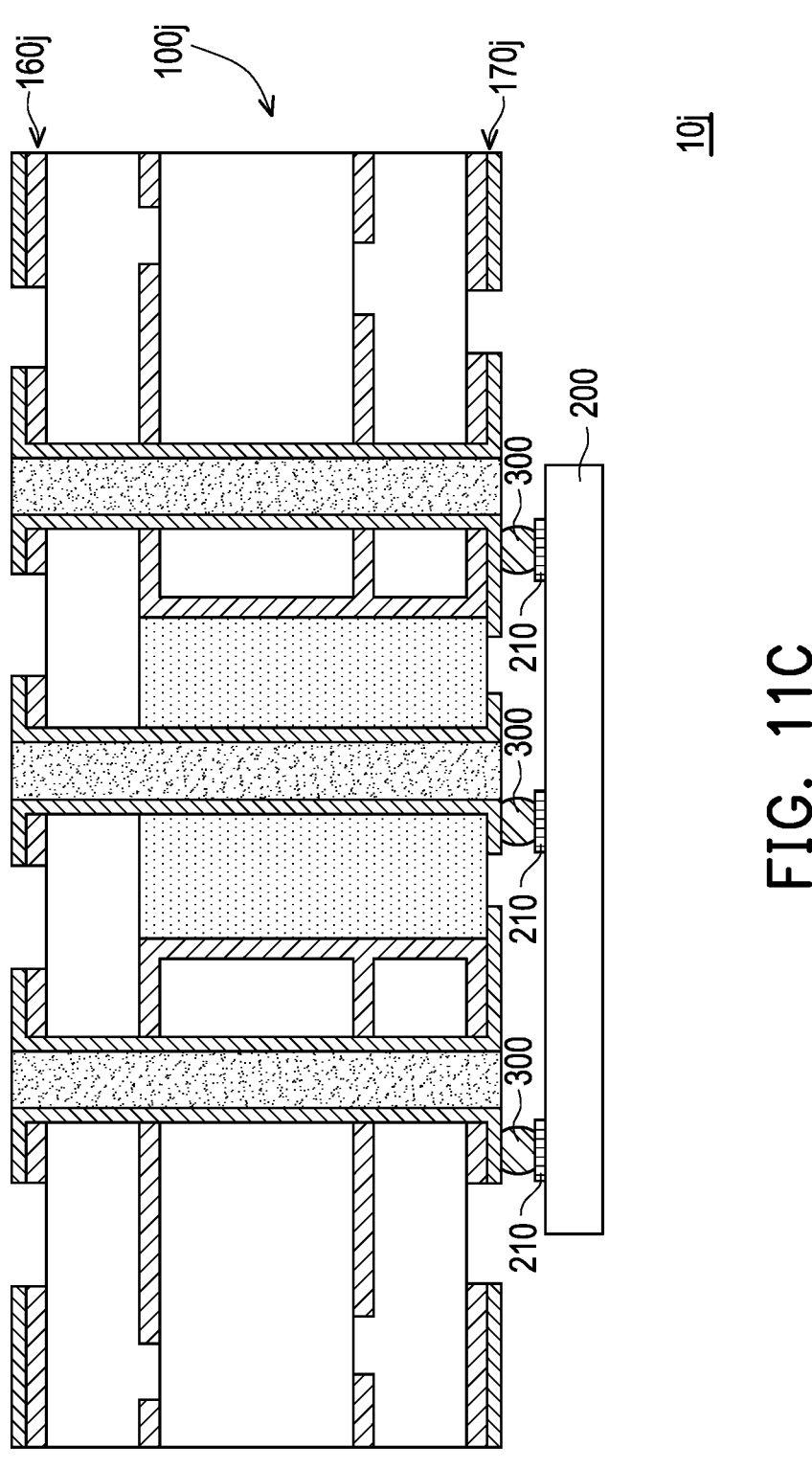
FIG. 11C is a schematic cross-sectional view of an electronic device including the circuit board of FIG. 11B.

FIG. 11A to FIG. 11B are schematic cross-sectional views of partial steps of another manufacturing method of a circuit board according to another embodiment of the disclosure. FIG. 11C is a schematic cross-sectional view of an electronic device including the circuit board of FIG. 11B. Please refer to FIG. 10C and FIG. 11A at the same time. A manufacturing method of a circuit board of this embodiment is similar to the above-mentioned manufacturing method of the circuit board, and the difference between the two is as follows. Please refer to FIG. 11A. After forming the conductive material layer G2, a first hole filling material F5 and a second hole filling material F6 are respectively filled in the first through hole 15 and each second through hole T6, wherein the first hole filling material F5 fills the first through hole 15, and the second hole filling material F6 fills the second through hole T6. Preferably, a first upper surface F51 and a first lower surface F52 opposite to each other of the first hole filling material F5 and a second upper surface F61 and a second lower surface F62 opposite to each other of the second hole filling material F6 are respectively flush with the conductive material layer G2. If the first hole filling material F5 and the second hole filling material F6 are higher than the conductive material layer G2, a grinding manner may be selected, so that the first upper surface F51 and the first lower surface F52 of the first hole filling material F5 and the second upper surface F61 and the second lower surface F62 of the second hole filling material F6 are respectively flush with the conductive material layer G2, thereby maintaining a preferred flatness. Here, the materials of the first hole filling material F5 and the second hole filling material F6 are, for example, resin, which may be regarded as a plugging agent or a dielectric material with a dielectric constant of higher than 3.6 and a dielectric loss of lower than 0.05.

After that, please refer to FIG. 11A and FIG. 11B at the same time. A lithography process is performed to pattern the conductive material layer G2, the metal layer M, and the third circuit layer 158, so as to form a first external circuit layer 160j, a second external circuit layer 170j, a first conductive via 180j, and a second conductive via 190j. Here, the first external circuit layer 160j is formed on the first dielectric material 110i, and the second external circuit layer 170j is formed on the third dielectric material 130i and the fourth dielectric material 140i. The first conductive via 180j includes the first through hole T5, a first conductive material layer G21, and the first hole filling material F5, wherein the first hole filling material F5 fills the first through hole T5, and the first upper surface F51 and the first lower surface F52 opposite to each other of the first hole filling material F5 are respectively flush with a top surface 161j of the first external circuit layer 160j and a bottom surface 171j of the second external circuit layer 170j. Each second conductive via 190j includes the second through hole T6, a second conductive material layer G22, and the second hole filling material F6, wherein the second hole filling material F6 fills the second through hole T6, and the second upper surface F61 and the second lower surface F62 opposite to each other of the second hole filling material F6 are respectively flush with the top surface 161j of the first external circuit layer 160j and the bottom surface 171j of the second external circuit layer 170j. So far, the manufacturing of a circuit board 100j is completed.

Next, please refer to FIG. 11C. In this embodiment, an electronic device 10j includes, for example, the circuit board 100j of FIG. 11B and an electronic element 200, wherein the electronic element 200 is electrically connected to the circuit board 100j, and the electronic element 200 includes multiple pads 210. In addition, the electronic device 10j of this embodiment further includes multiple connectors 300, which are disposed between the second external circuit layer 170j of the circuit board 100j and the pads 210 of the electronic element 200, wherein the electronic element 200 is electrically connected to the circuit board 100j through the connectors 300. Here, the connector 300 is, for example, a solder ball, but not limited thereto. In terms of application, an antenna structure may be disposed on the other side of the circuit board 100j opposite to the electronic element 200, and the antenna structure may be electrically connected to the first external circuit layer 160j of the circuit board 100j. For the application in the integrated circuit and the antenna, the circuit board 100j of this embodiment can solve the issue of signal interference on the same plane, and can reduce signal energy loss and reduce noise interference, thereby improving the signal transmission reliability.

Please refer to FIG. 2A and FIG. 11C at the same time. In order to improve the bonding force between the circuit board and the electronic element, in an embodiment not shown, the circuit board may include the connecting metal layer CM shown in FIG. 2A, which is disposed on the fourth dielectric material 140i and/or the third dielectric material 130i, and is electrically connected to the first conductive via 180j and/or the second conductive via 190j. Here, through the configuration of the connecting metal layer CM, the contact area between the first conductive via 180j and/or the second conductive via 190j of the circuit board and the connectors 300 may be extended and increased, thereby improving the bonding force with the electronic element 200, so that the electronic device can have a preferred structural reliability.

Figure 12A:
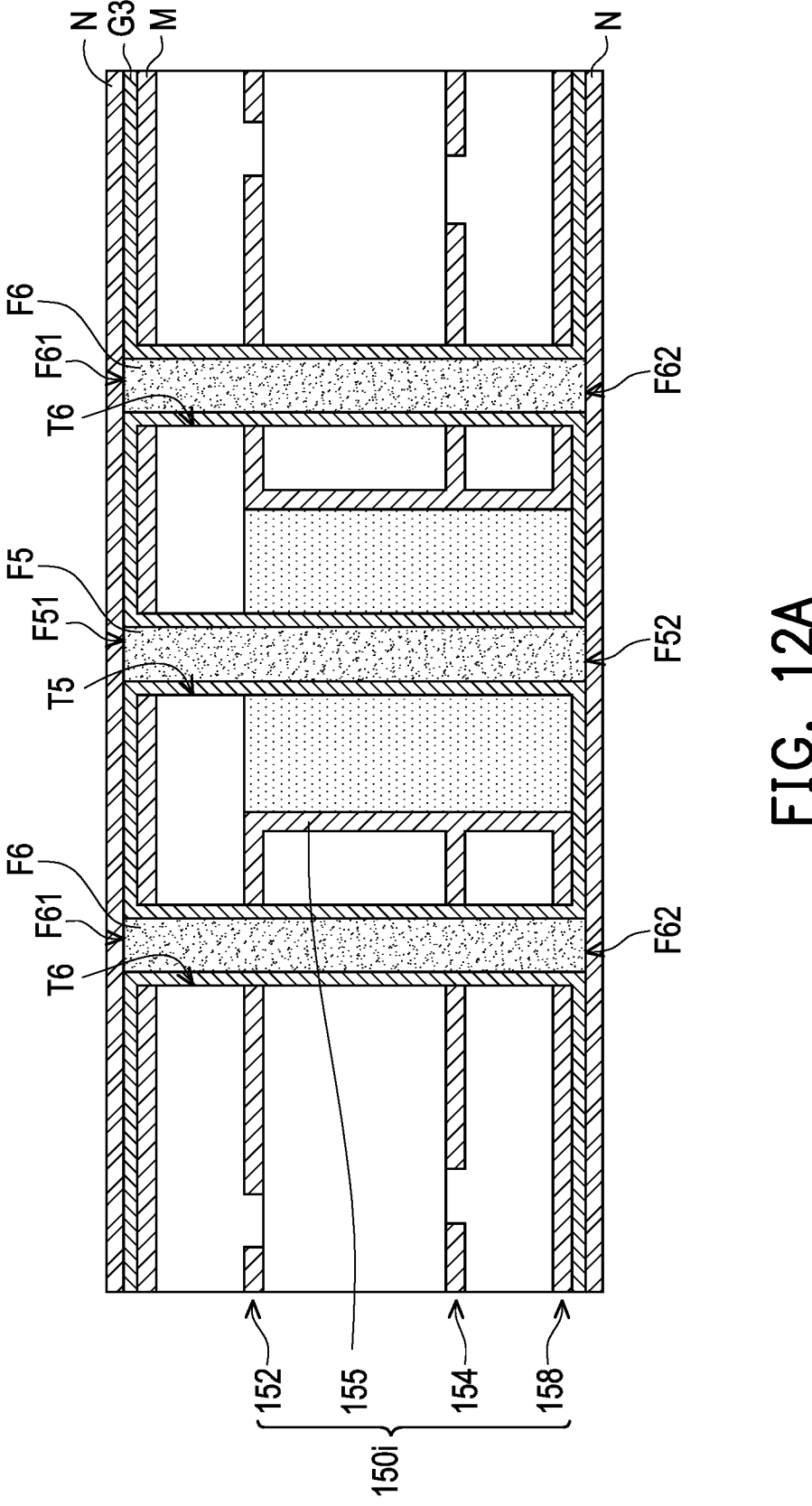
FIG. 12A to FIG. 12B are schematic cross-sectional views of partial steps of another manufacturing method of a circuit board according to another embodiment of the disclosure.
Figure 12B:
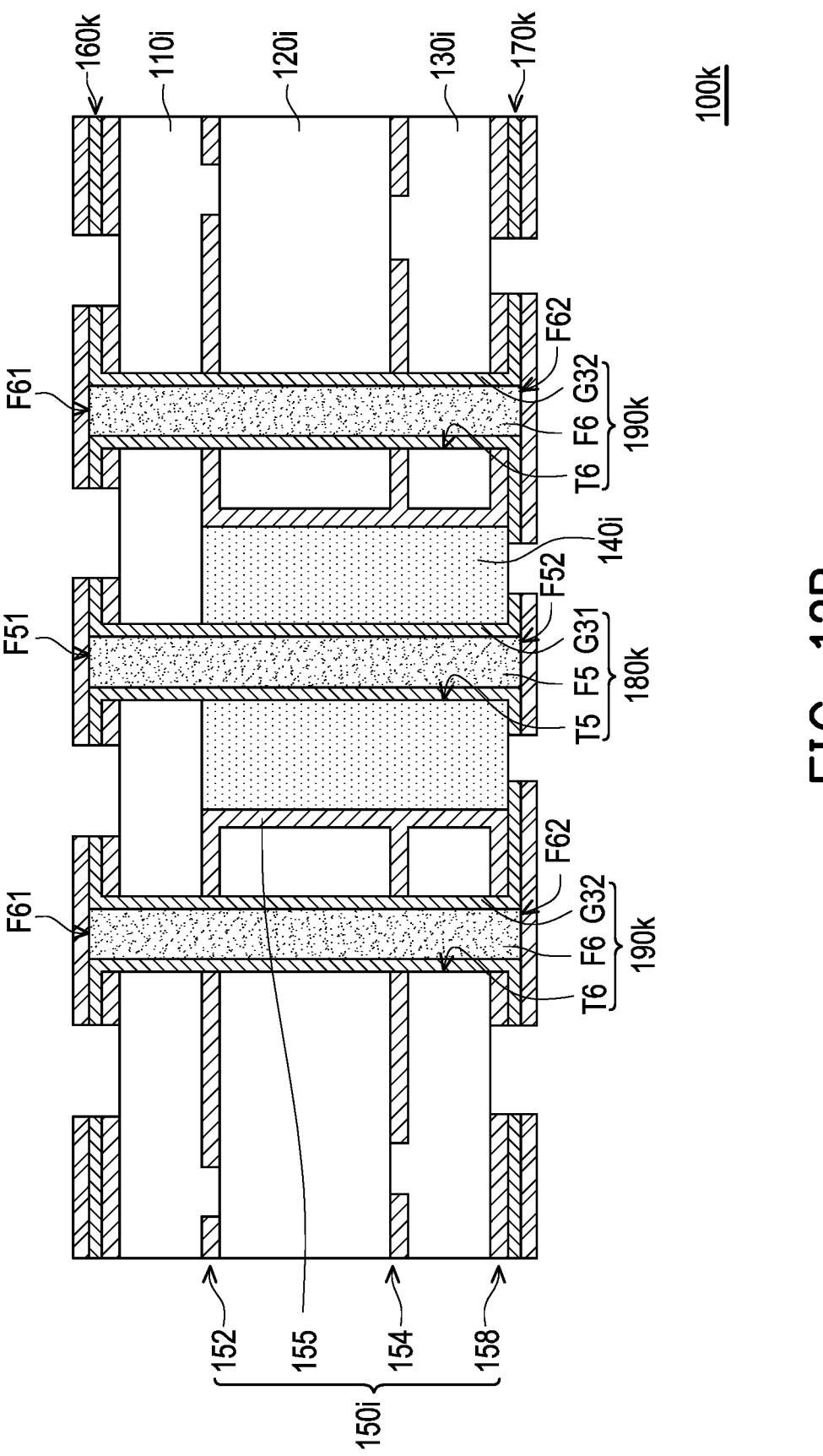
Figure 12C:
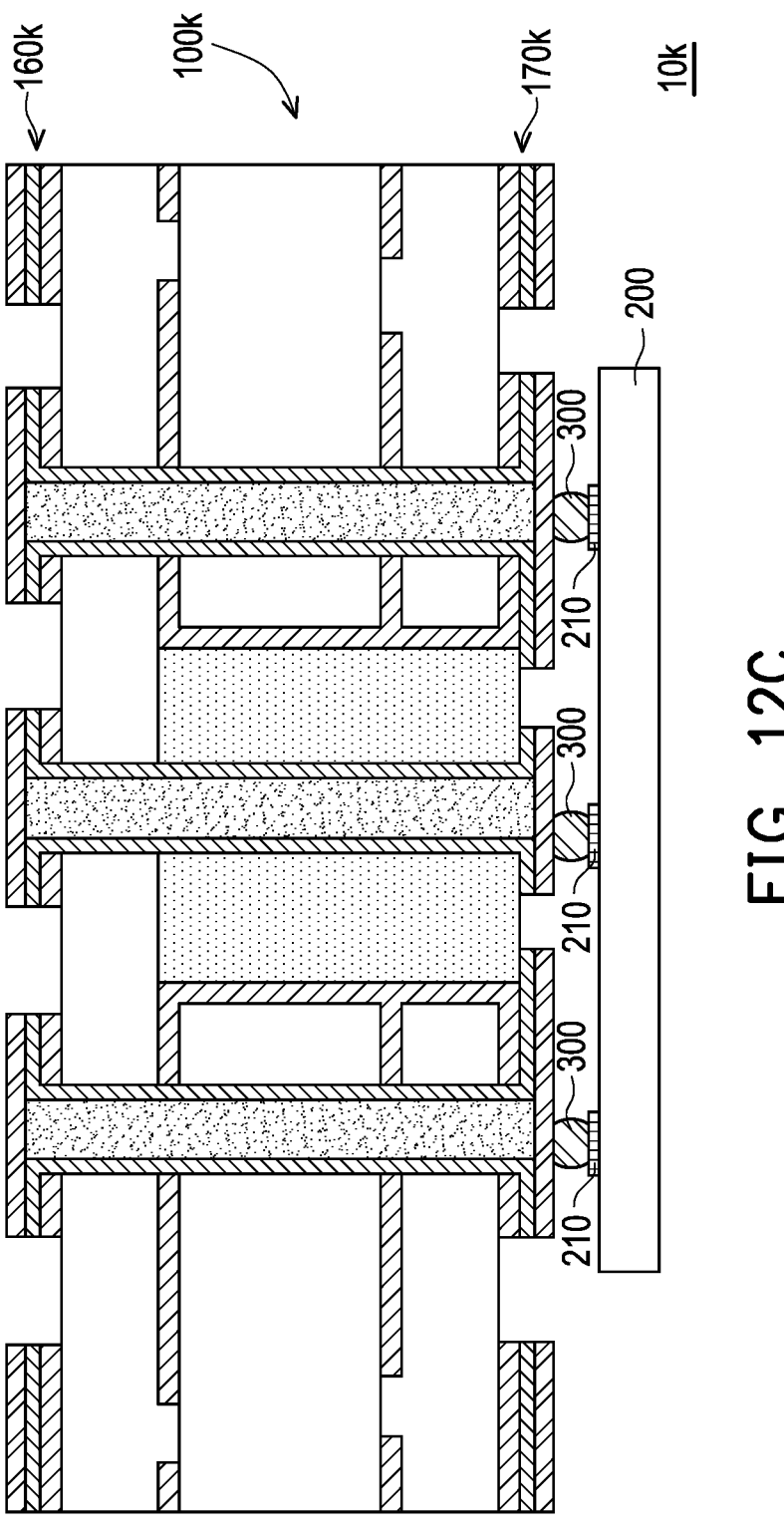
FIG. 12C is a schematic cross-sectional view of an electronic device including the circuit board of FIG. 12B.

FIG. 12A to FIG. 12B are schematic cross-sectional views of partial steps of another manufacturing method of a circuit board according to another embodiment of the disclosure. FIG. 12C is a schematic cross-sectional view of an electronic device including the circuit board of FIG. 12B. Please refer to FIG. 11A and FIG. 12A at the same time. A manufacturing method of a circuit board of this embodiment is similar to the above-mentioned manufacturing method of the circuit board, and the difference between the two is as follows. After the step of respectively filling the first hole filling material F5 and the second hole filling material F6 in the first through hole 15 and each second through hole T6 in FIG. 11A, please refer to FIG. 12A. A cover layer N is formed on a conductive material layer G3, wherein the cover layer N covers the conductive material layer G3, the first upper surface F51 and the first lower surface F52 of the first hole filling material F5, and the second upper surface F61 and the second lower surface F62 of the second hole filling material F6. Here, the material of the cover layer N is, for example, copper, but not limited thereto.

After that, please refer to FIG. 12A and FIG. 12B at the same time. A lithography process is performed to pattern the cover layer N, the conductive material layer G3, the metal layer M, and the third circuit layer 158, so as to form a first external circuit layer 160k and a second external circuit layer 170k. Here, the first conductive via 180k includes the first through hole 15, a first conductive material layer G31, and the first hole filling material F5, wherein the first hole filling material F5 fills the first through hole 15, and the first external circuit layer 160k and the second external circuit layer 170k respectively cover the first upper surface F51 and the first lower surface F52 of the first hole filling material F5. Each second conductive via 190k includes the second through hole T6, a second conductive material layer G32, and the second hole filling material F6, wherein the second hole filling material F6 fills the second through hole T6, and the first external circuit layer 160k and the second external circuit layer 170k respectively cover the second upper surface F61 and the second lower surface F62 of the second hole filling material F6. So far, the manufacturing of a circuit board 100k is completed.

Next, please refer to FIG. 12C. In this embodiment, an electronic device 10k includes, for example, the circuit board 100k of FIG. 12B and an electronic element 200, wherein the electronic element 200 is electrically connected to the circuit board 100k, and the electronic element 200 includes multiple pads 210. In addition, the electronic device 10k of this embodiment further includes multiple connectors 300, which are disposed between the second external circuit layer 170k of the circuit board 100k and the pads 210 of the electronic element 200, wherein the electronic element 200 is electrically connected to the circuit board 100k through the connectors 300. Here, the connector 300 is, for example, a solder ball, but not limited thereto. In terms of application, an antenna structure may be disposed on the other side of the circuit board 100k opposite to the electronic element 200, and the antenna structure may be electrically connected to the first external circuit layer 160k of the circuit board 100k. For the application in the integrated circuit and the antenna, the circuit board 100k of this embodiment can solve the issue of signal interference on the same plane, and can reduce signal energy loss and noise interference, thereby improving the signal transmission reliability.

Figure 13A:
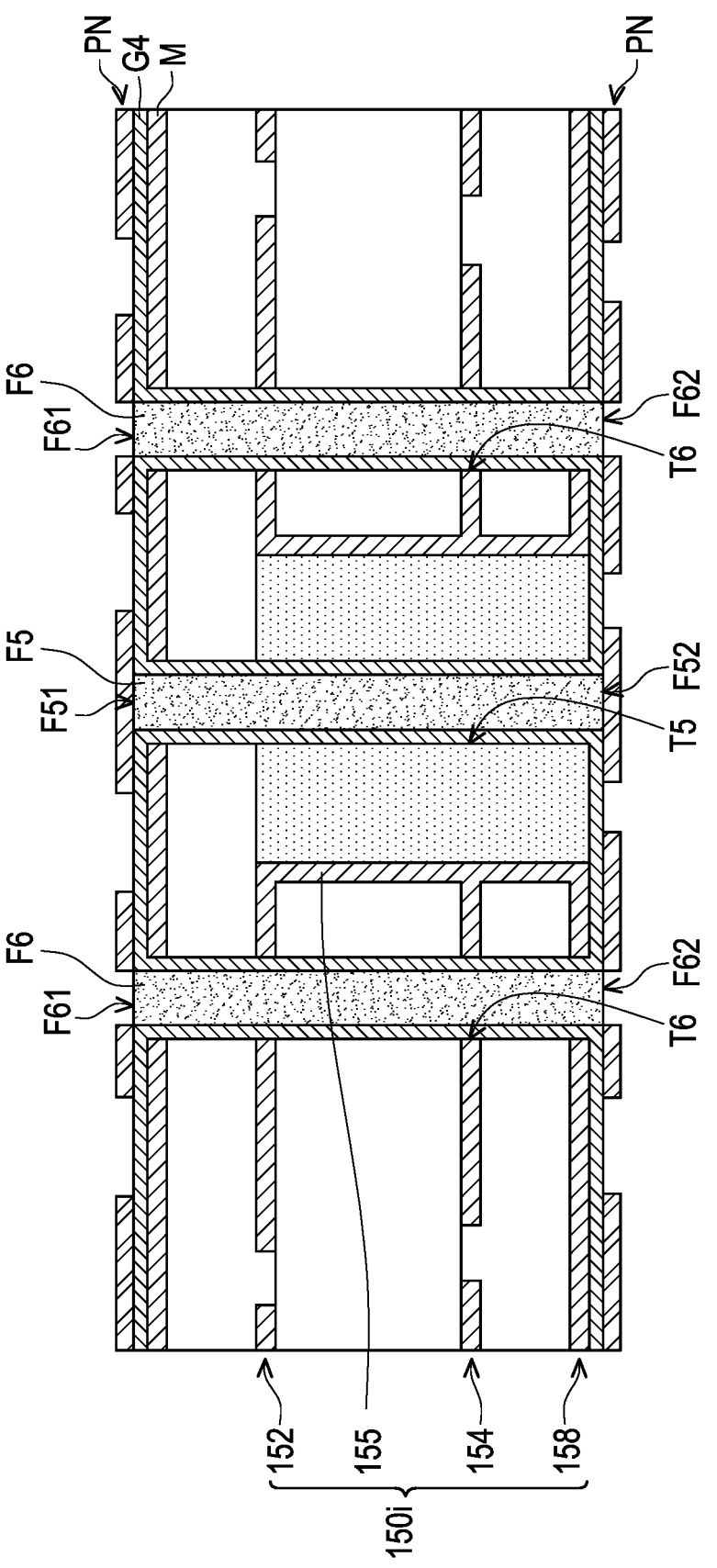
FIG. 13A to FIG. 13B are schematic cross-sectional views of partial steps of another manufacturing method of a circuit board according to another embodiment of the disclosure.
Figure 13B:
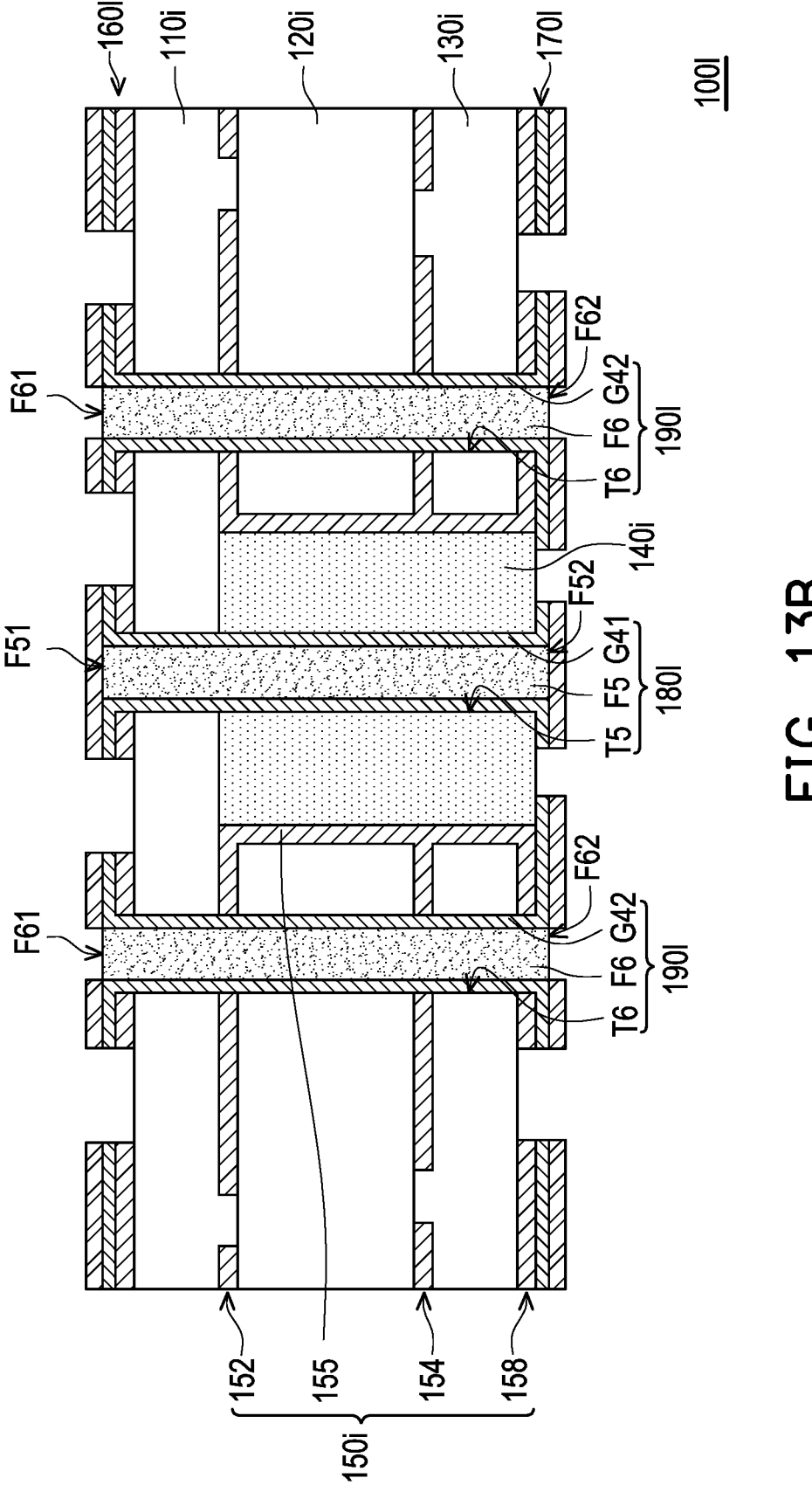
Figure 13C:
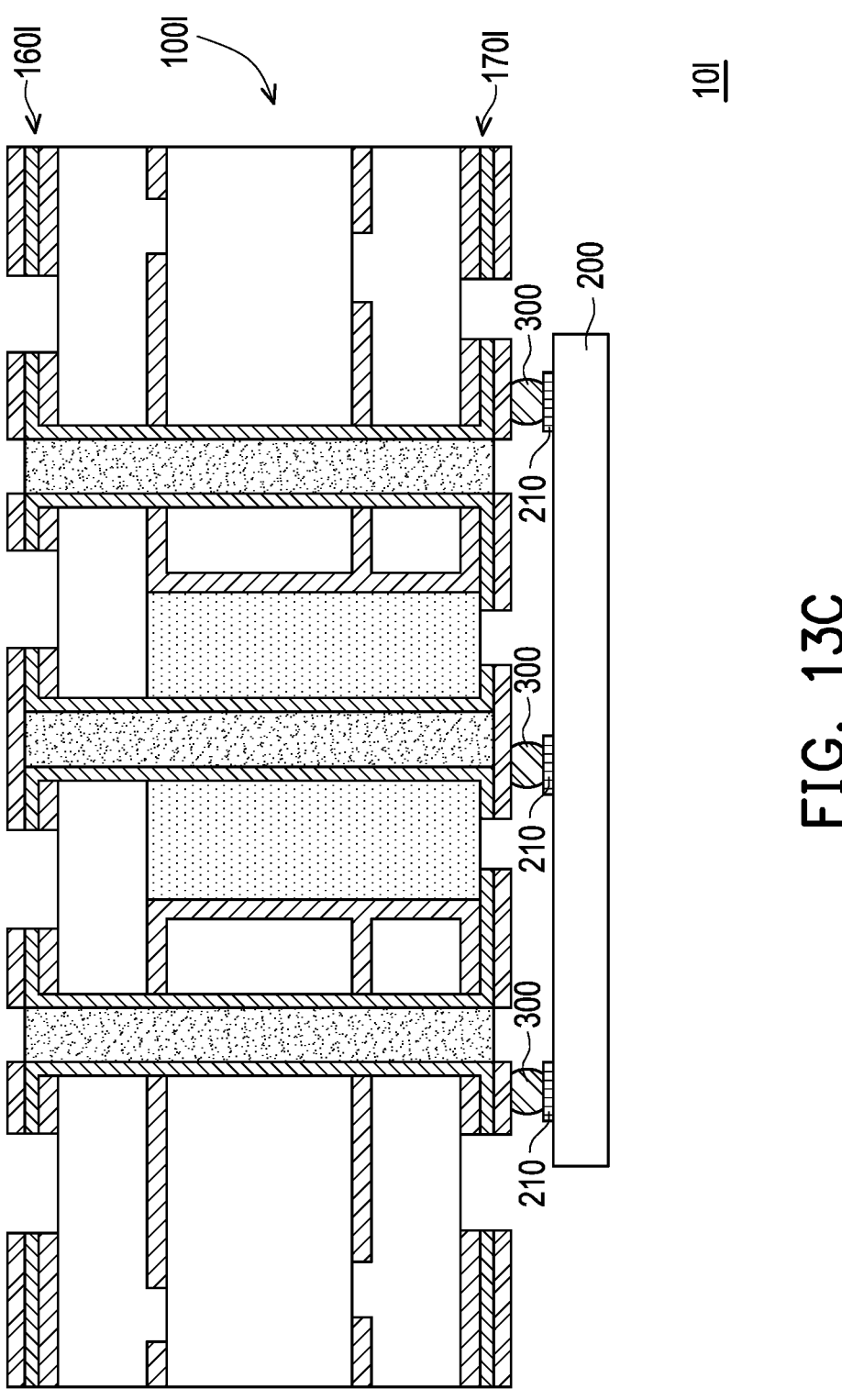
FIG. 13C is a schematic cross-sectional view of an electronic device including the circuit board of FIG. 13B.

FIG. 13A to FIG. 13B are schematic cross-sectional views of partial steps of another manufacturing method of a circuit board according to another embodiment of the disclosure. FIG. 13C is a schematic cross-sectional view of an electronic device including the circuit board of FIG. 13B. Please refer to FIG. 11A and FIG. 13A at the same time. A manufacturing method of a circuit board of this embodiment is similar to the above-mentioned manufacturing method of the circuit board, and the difference between the two is as follows. After the step of respectively filling the first hole filling material F5 and the second hole filling material F6 in the first through hole 15 and each second through hole T6 in FIG. 11A, please refer to FIG. 13A. A patterned cover layer PN is formed on a conductive material layer G4, wherein the patterned cover layer PN covers a part of the conductive material layer G4 and the first upper surface F51 and the first lower surface F52 of the first hole filling material F5. Here, the material of the patterned cover layer PN is, for example, copper, but not limited thereto.

Next, please refer to FIG. 13A and FIG. 13B at the same time. A lithography process is performed to pattern the conductive material layer G4, the metal layer M, and the third circuit layer 158 with the patterned cover layer PN as a mask, so as to form a first external circuit layer 160*l* and a second external circuit layer 170*l*. Here, a first conductive via 180*l* includes the first through hole 15, a first conductive material layer G41, and the first hole filling material F5, wherein the first hole filling material F5 fills the first through hole 15, and the first external circuit layer 160*l* and the second external circuit layer 170*l* respectively cover the first upper surface F51 and the first lower surface F52 of the first hole filling material F5. Each second conductive via 190*l* includes the second through hole T6, a second conductive material layer G42, and the second hole filling material F6, wherein the second hole filling material F6 fills the second through hole T6, and the first external circuit layer 160*l* and the second external circuit layer 170*l* respectively expose the second upper surface F61 and the second lower surface F62 of the second hole filling material F6. So far, the manufacturing of a circuit board 100*l* is completed.

Next, please refer to FIG. 13C. In this embodiment, an electronic device 101 includes, for example, the circuit board 100*l* of FIG. 13B and an electronic element 200, wherein the electronic element 200 is electrically connected to the circuit board 100*l*, and the electronic element 200 includes multiple pads 210. In addition, the electronic device 101 of this embodiment further includes multiple connectors 300, which are disposed between the second external circuit layer 170*l* of the circuit board 100*l* and the pads 210 of the electronic element 200, wherein the electronic element 200 is electrically connected to the circuit board 100*l* through the connectors 300. Here, the connector 300 is, for example, a solder ball, but not limited thereto. In terms of application, an antenna structure may be disposed on the other side of the circuit board 100*l* opposite to the electronic element 200, and the antenna structure may be electrically connected to the first external circuit layer 160*l* of the circuit board 100*l*. For the application in the integrated circuit and the antenna, the circuit board 100*l* of this embodiment can solve the issue of signal interference on the same plane, and can reduce signal energy loss and noise interference, thereby improving the signal transmission reliability.

FIG. 14A to FIG. 14D are schematic cross-sectional views of a manufacturing method of a circuit board according to another embodiment of the disclosure. FIG. 14E is a schematic top view of the circuit board of FIG. 14D. FIG. 14F is a schematic cross-sectional view of an electronic device including the circuit board of FIG. 14D. Please refer to FIG. 10A and FIG. 14A at the same time. A manufacturing method of a circuit board of this embodiment is similar to the above-mentioned manufacturing method of the circuit board, and the difference between the two is as follows. In this embodiment, before performing a plugging process, so that a fourth dielectric the material 140*m* fills the first opening H3 of the second material 120*i* and the second opening H4 of the third dielectric material 130*i*, depth-controlled drilling must be performed first to remove a part of an electroplating layer at a ground layer hole edge, and a plugging agent is filled. In other words, a notch C must be formed between the conductive connection layer 155, the third dielectric material 130*i*, and the third circuit layer 158. Then, the fourth dielectric material 140*m* fills the first opening H3 of the second dielectric material 120*i*, the second opening H4 of the third dielectric material 130*i*, and the notch C. After that, the first dielectric material 110*i* and the metal layer M formed on the first dielectric material 110*i* are laminated on the second dielectric material 120*i* by thermal lamination, wherein the first dielectric material 110*i* is located between the metal layer M and the first circuit layer 152 and the fourth dielectric material 140*m*. So far, the manufacturing of a substrate is completed.

Figure 14A:
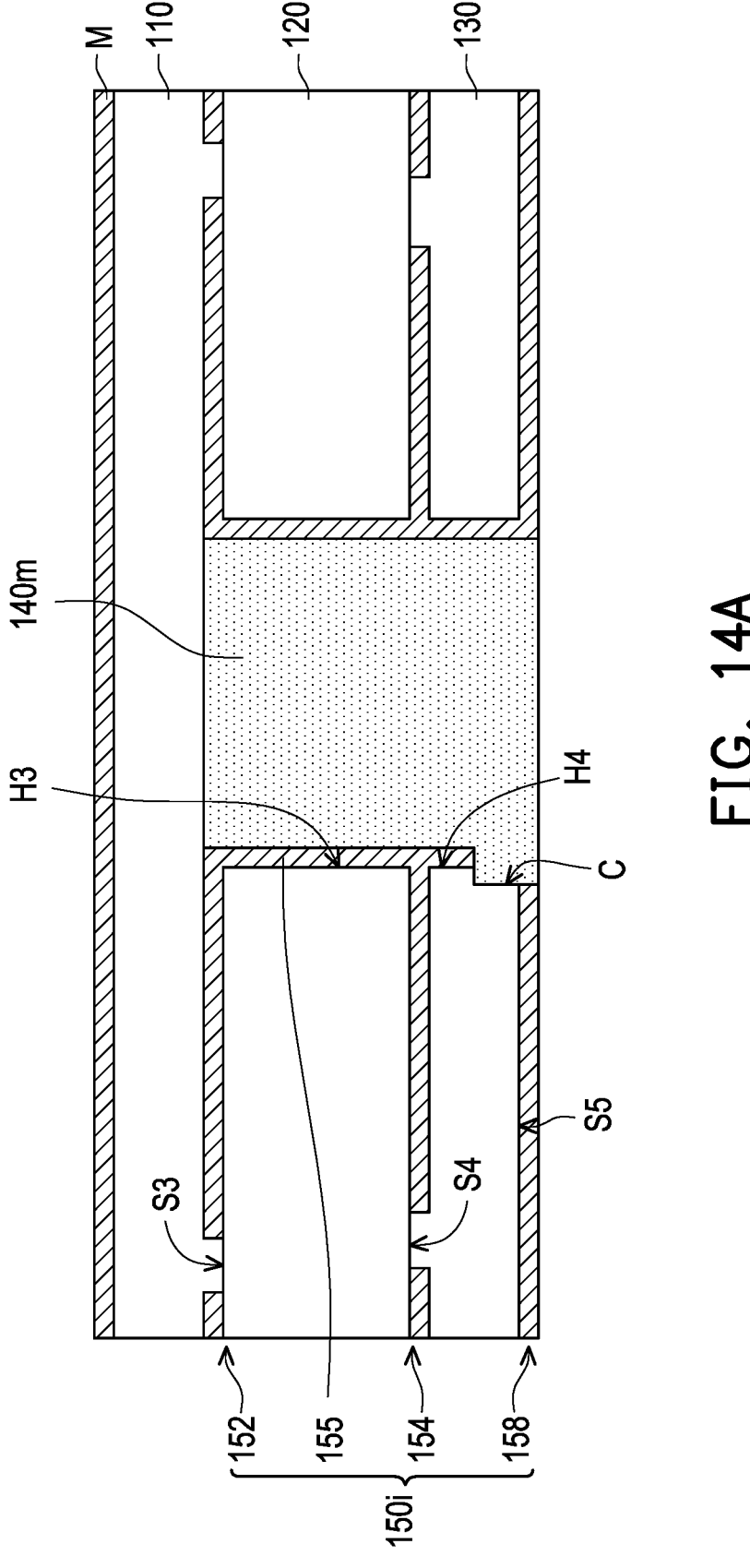
FIG. 14A to FIG. 14D are schematic cross-sectional views of a manufacturing method of a circuit board according to another embodiment of the disclosure.
Figure 14B:
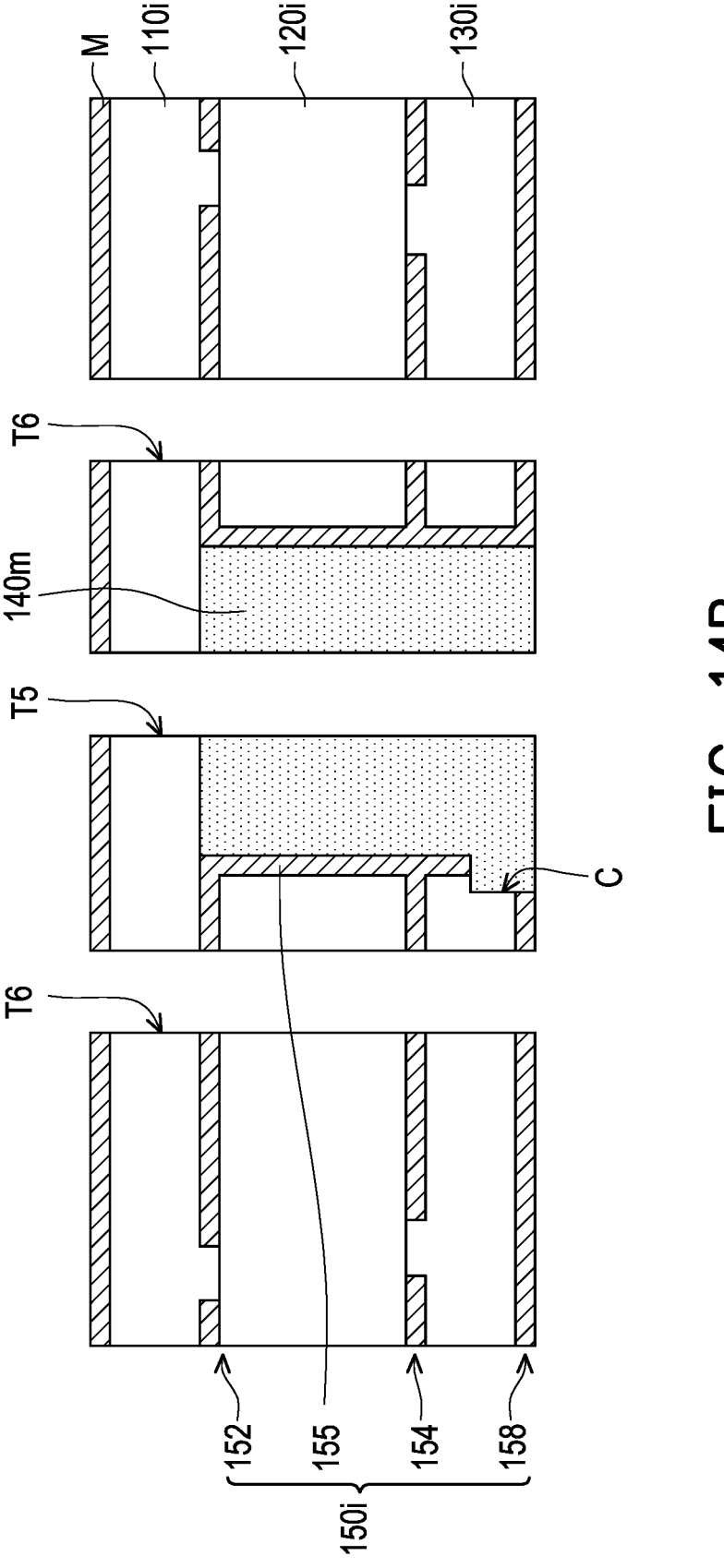

Next, please refer to FIG. 14B. A first through hole 15 and multiple second through holes T6 are formed. The first through hole 15 passes through the metal layer M, the first dielectric material 110*i*, and the fourth dielectric material 140*m*. The second through hole T6 passes through the metal layer M, the first dielectric material 110*i*, the first circuit layer 152, the second dielectric material 120*i*, the second circuit layer 154, the third dielectric material 130*i*, and the third circuit layer 158. After that, please refer to FIG. 14C. A conductive material layer G1 is formed to cover an inner wall of the first through hole 15, an inner wall of each second through hole T6, the metal layer M, the third circuit layer 158, and the fourth dielectric material 140*m*.

Figure 14C:
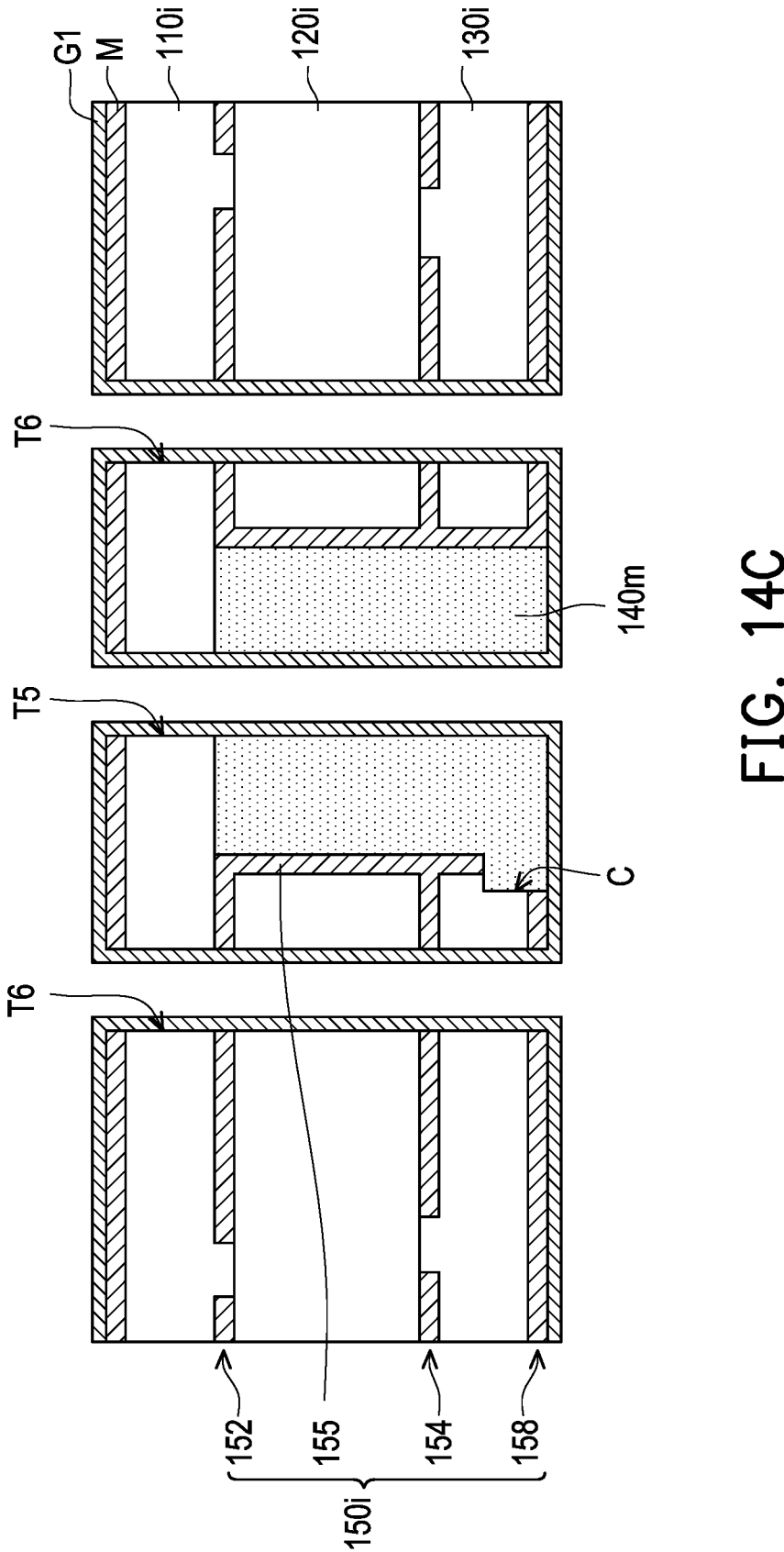
Figure 14D:
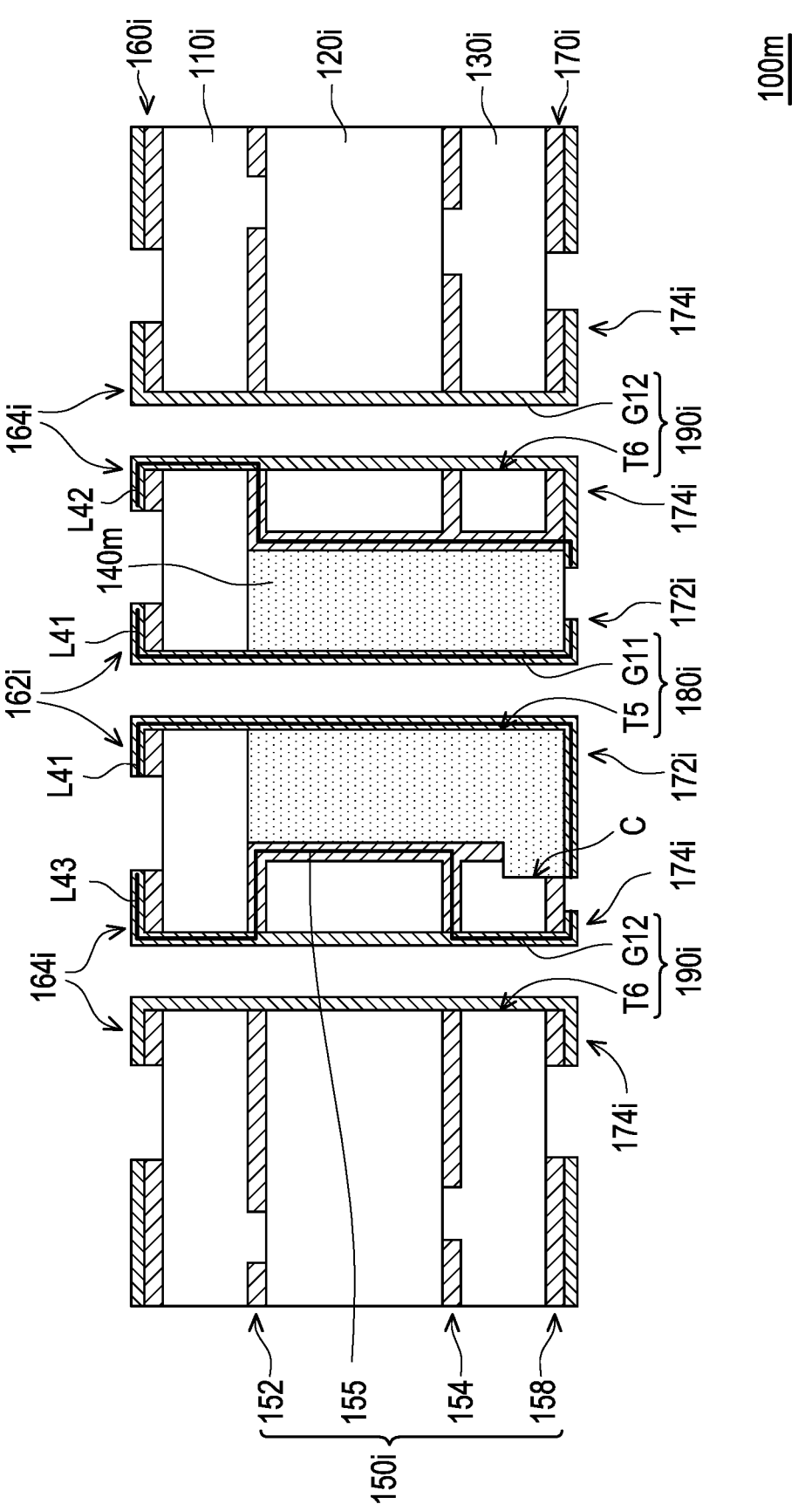
Figure 14E:
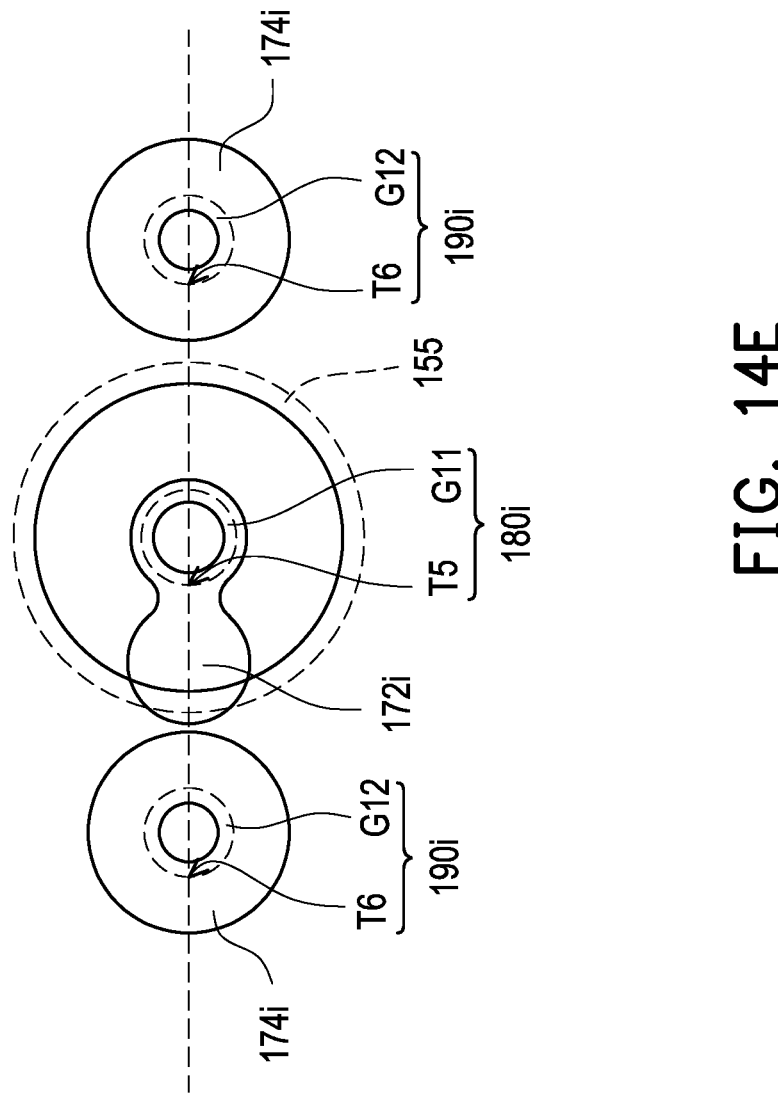
FIG. 14E is a schematic top view of the circuit board of FIG. 14D.
Figure 14F:
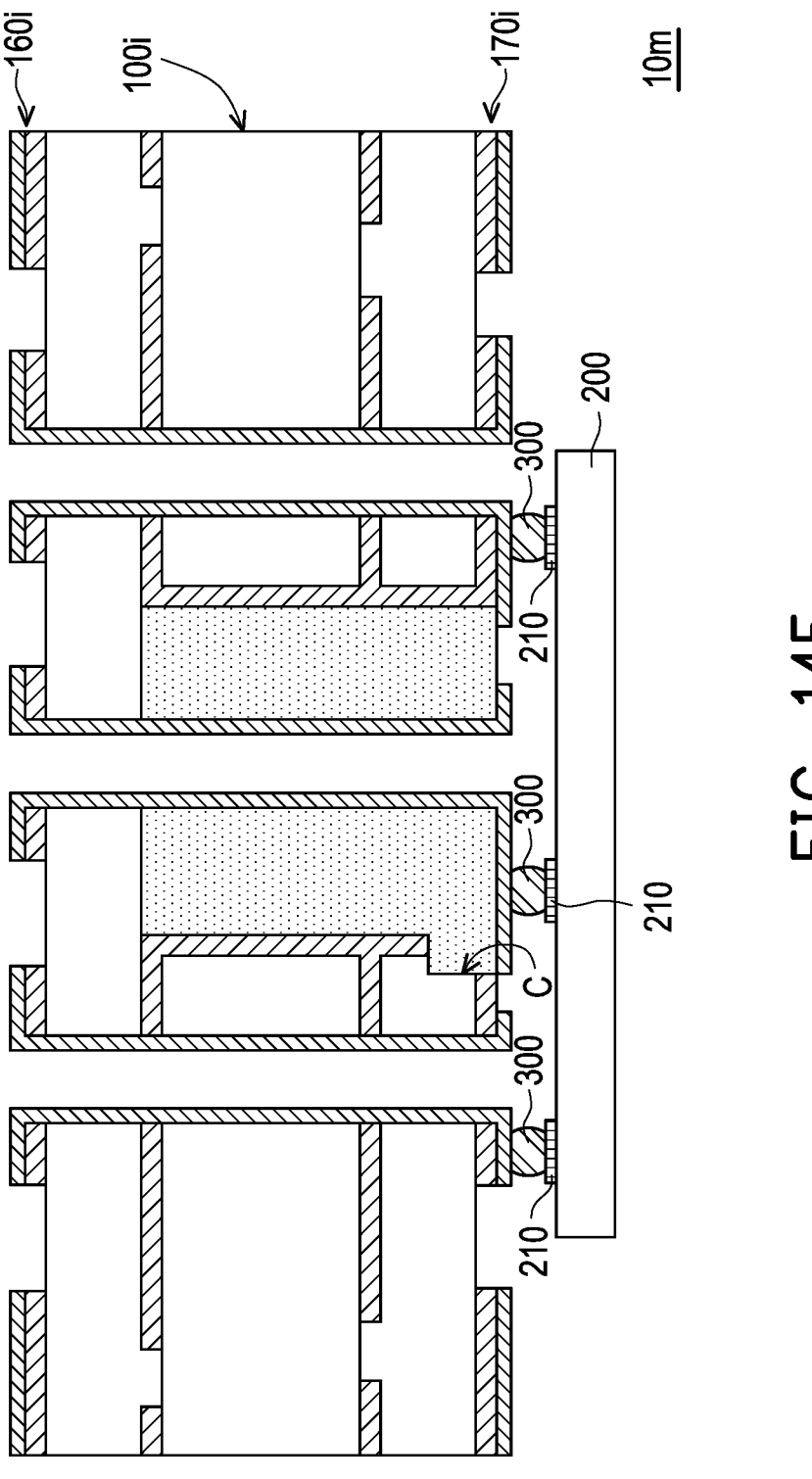
FIG. 14F is a schematic cross-sectional view of an electronic device including the circuit board of FIG. 14D.

Finally, please refer to FIG. 14C and FIG. 14D at the same time. The conductive material layer G1, the metal layer M, and the third circuit layer 158 are patterned to form a first external circuit layer 160*i*, a second external circuit layer 170*i*, a first conductive via 180*i*, and a second conductive via 190*i*. In other words, the first conductive via 180*i*, the second conductive via 190*i*, the first external circuit layer 160*i*, and the second external circuit layer 170*i* of this embodiment are formed simultaneously. In detail, the first external circuit layer 160*i* is formed on the first dielectric material 110*i*, and the second external circuit layer 170*i* is formed on the third dielectric material 130*i* and the fourth dielectric material 140*m*. The first conductive via 180*i* is electrically connected to the first external circuit layer 160*i* and the second external circuit layer 170*i* to define a signal path L41, and the second conductive via 190*i* is electrically connected to the first external circuit layer 160*i*, the conductive structure 150*i*, and the second external circuit layer 170*i* to define ground paths L42 and L43, and the ground paths L42 and L43 surround the signal path L41. It should be noted that according to a magnetic force generated by Ampere's right-hand rule, the ground paths L42 and L43 preferably pass through the first circuit layer 152 and the conductive connection layer 155 of the conductive structure 150*i*, as shown in FIG. 14D.

Further, the first external circuit layer 160*i* includes a first signal circuit 162*i* and a first ground circuit 164*i*, and the second external circuit layer 170*i* includes a second signal circuit 172*i* and a second ground circuit 174*i*. The first signal circuit 162*i*, the first conductive via 180*i*, and the second signal circuit 172*i* define the signal path L41. The first ground circuit 164*i*, each second conductive via 190*i*, the first circuit layer 152, the conductive connection layer 155, and the second ground circuit 174*i* define the ground path L42. The first ground circuit 164*i*, each second conductive via 190*i*, the first circuit layer 152, the conductive connection layer 155, the second circuit layer 154, the conductive connection layer 155, and the second ground circuit 174*i* define the ground path L43. The first conductive via 180*i* includes the first through hole T5 and a first conductive material layer G11. The first conductive material layer G11 covers the inner wall of the first through hole T5 and is electrically connected to the first external circuit layer 160*i* and the second external circuit layer 170*i*. Each second conductive via 190*i* includes each second through hole T6 and a second conductive material layer G12. The second conductive material layer G12 covers the inner wall of each second through hole T6 and is electrically connected to the first external circuit layer 160*i*, the first circuit layer 152, the second circuit layer 154, the third circuit layer 158, and the second external circuit layer 170*i*. So far, the manufacturing of a circuit board 100*m* is completed.

Please refer to FIG. 14D and FIG. 14E at the same time. In this embodiment, since a part of the conductive connection layer 155 is removed at the ground layer hole edge, and the fourth dielectric material 140*m* is filled, so that a subsequently processed conductive layer circuit can be fanned out by the notch C, which means that the second signal line 172*i* is extended, the contact area of the circuit board 100*m* during subsequent bonding with an electronic element may be increased, and there will not be short-circuit with the second ground circuit 174*i*.

Next, please refer to FIG. 14F. In this embodiment, an electronic device 10*m* includes, for example, the circuit board 100*m* of FIG. 14D and an electronic element 200, wherein the electronic element 200 is electrically connected to the circuit board 100*m*, and the electronic element 200 includes multiple pads 210. In addition, the electronic device 10*m* of this embodiment further includes multiple connectors 300, which are disposed between the second external circuit layer 170*i* of the circuit board 100*m* and the pads 210 of the electronic element 200, wherein the electronic element 200 is electrically connected to the circuit board 100*m* through the connectors 300. Here, the connector 300 is, for example, a solder ball, but not limited thereto. In terms of application, an antenna structure may be disposed on the other side of the circuit board 100*m* opposite to the electronic element 200, and the antenna structure may be electrically connected to the first external circuit layer 160*i* of the circuit board 100*m*. For the application in the integrated circuit and the antenna, the circuit board 100*m* of this embodiment can solve the issue of signal interference on the same plane, and can reduce signal energy loss and reduce noise interference, thereby improving the signal transmission reliability.

Figure 15A:
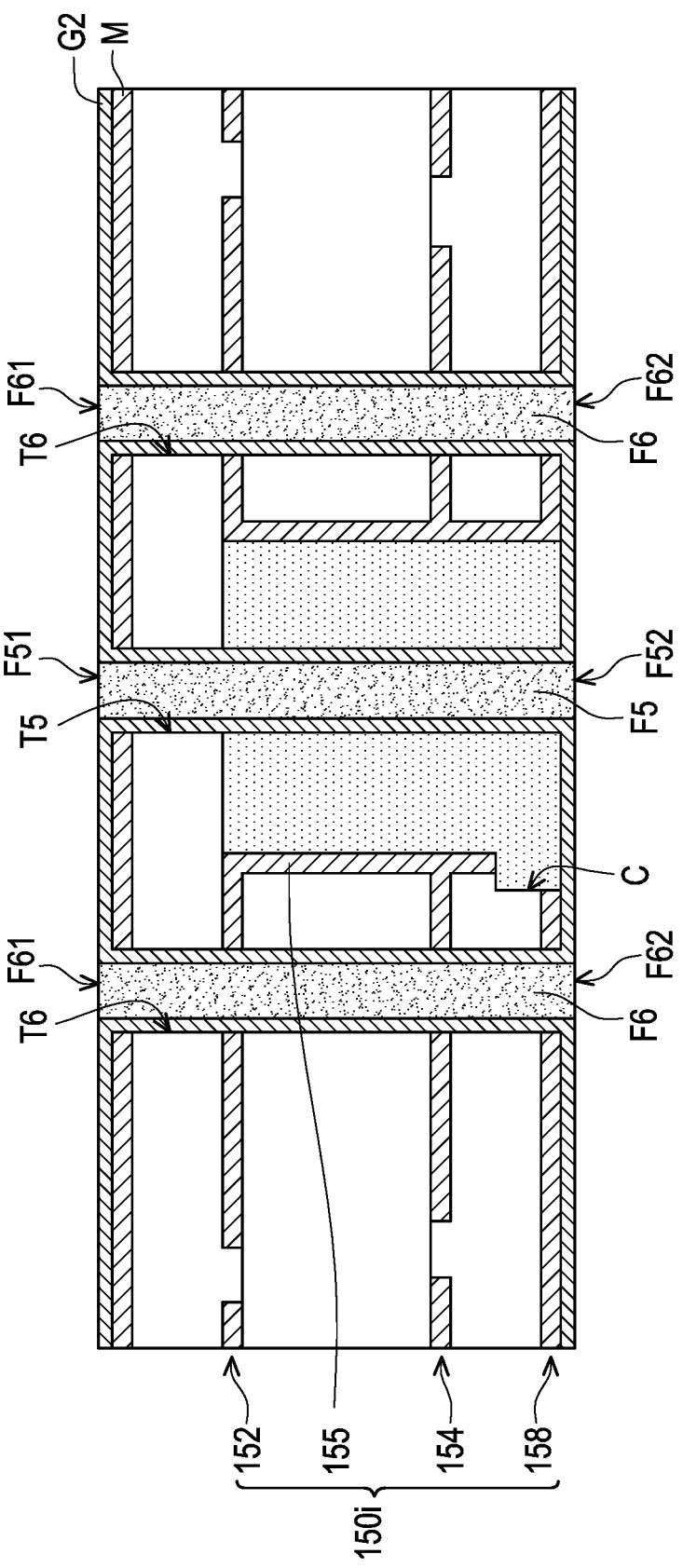
FIG. 15A to FIG. 15B are schematic cross-sectional views of partial steps of another manufacturing method of a circuit board according to another embodiment of the disclosure.
Figure 15B:
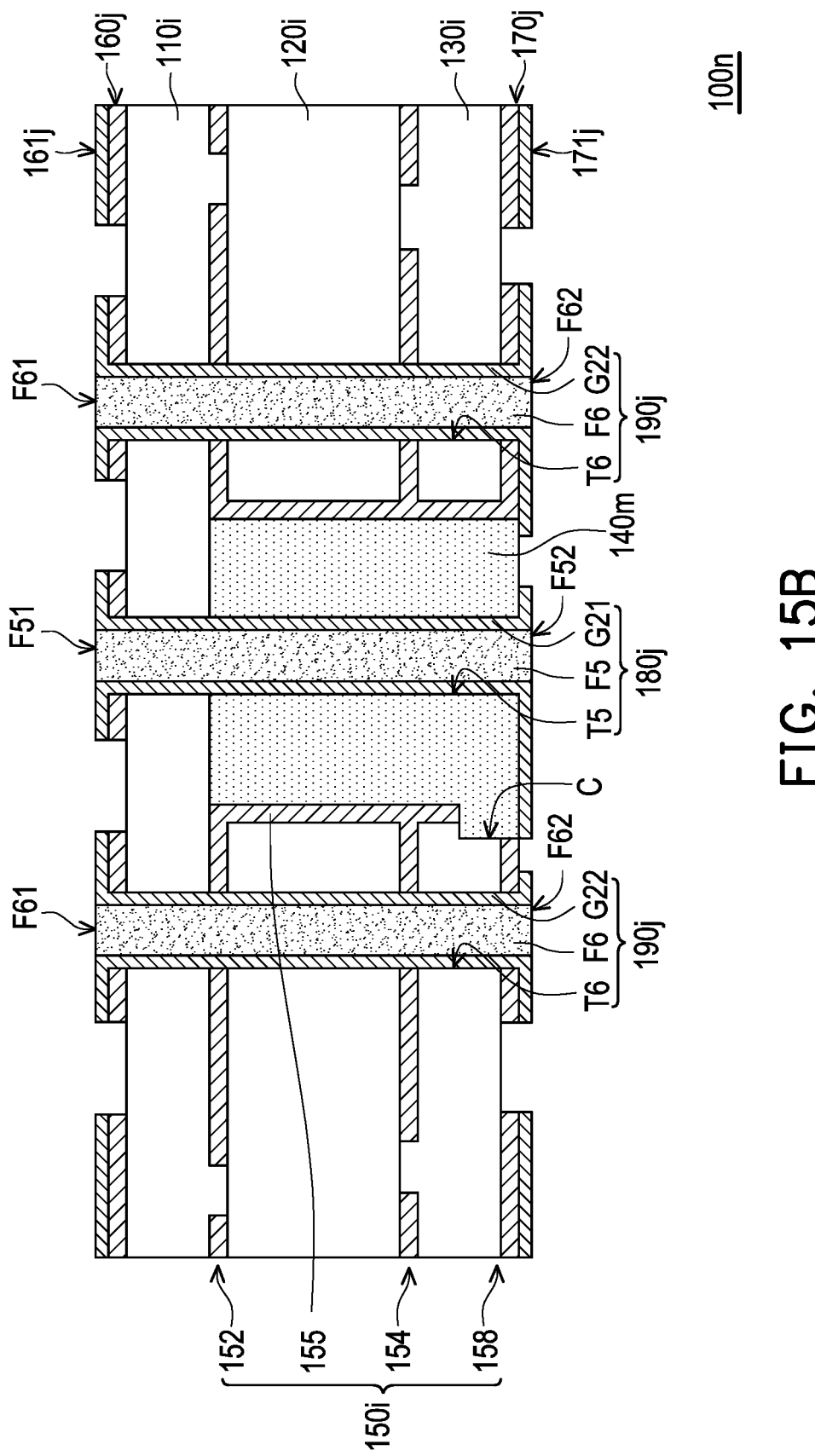
Figure 15C:
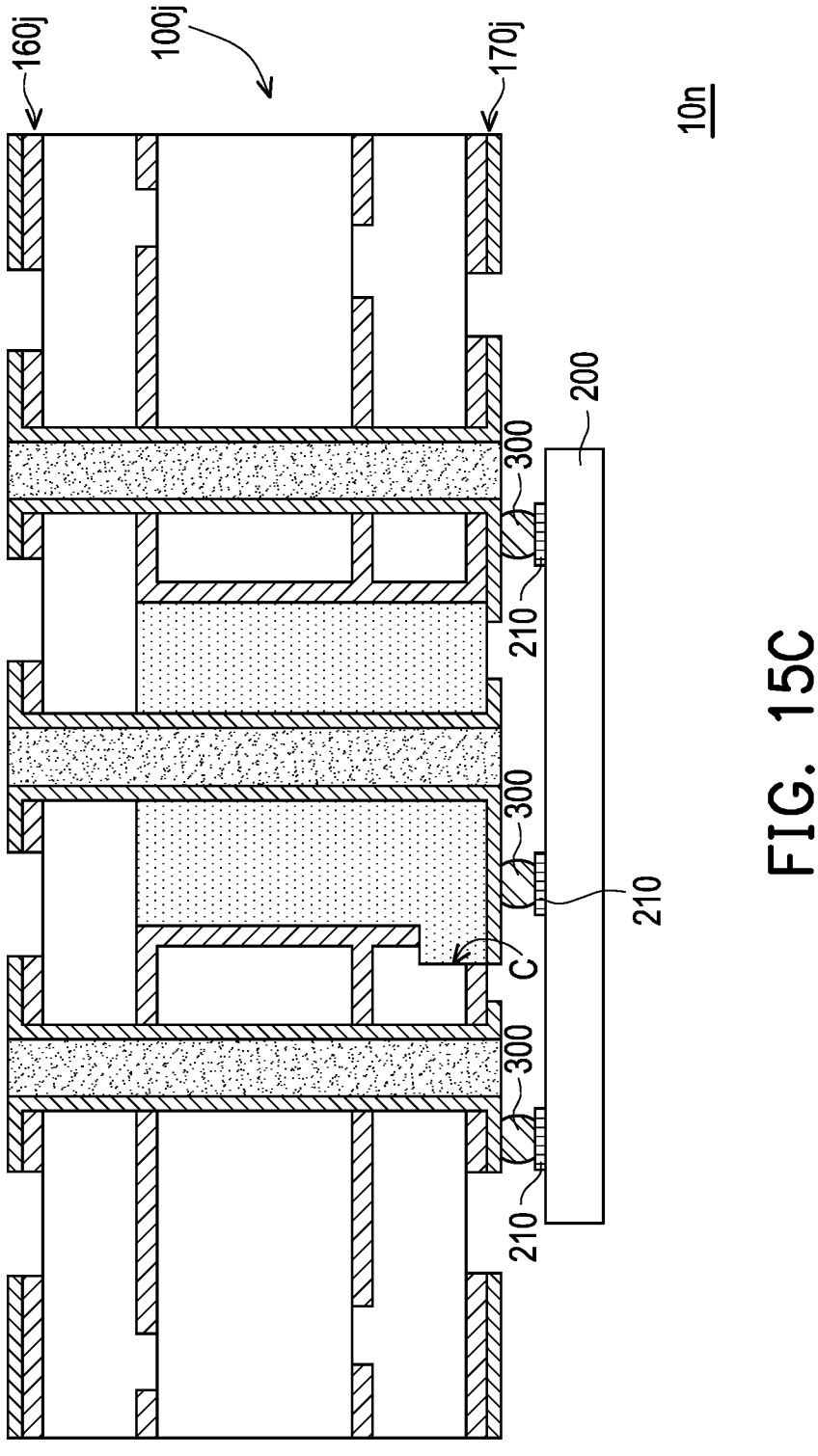
FIG. 15C is a schematic cross-sectional view of an electronic device including the circuit board of FIG. 15B.

FIG. 15A to FIG. 15B are schematic cross-sectional views of partial steps of another manufacturing method of a circuit board according to another embodiment of the disclosure. FIG. 15C is a schematic cross-sectional view of an electronic device including the circuit board of FIG. 15B. Please refer to FIG. 14C and FIG. 15A at the same time. A manufacturing method of a circuit board of this embodiment is similar to the above-mentioned manufacturing method of the circuit board, and the difference between the two is as follows. Please refer to FIG. 15A. After forming the conductive material layer G2, the first hole filing material F5 and the second hole filling material F6 are respectively filled in the first through hole T5 and each second through hole T6, wherein the first hole filling material F5 fills the first through hole 15, and the second hole filling material F6 fills the second through hole T6. Preferably, the first upper surface F51 and the first lower surface F52 opposite to each other of the first hole filling material F5 and the second upper surface F61 and second lower surface F62 opposite to each other of the second hole filling material F6 are respectively flush with the conductive material layer G2. If the first hole filling material F5 and the second hole filling material F6 are higher than the conductive material layer G2, a grinding manner may be selected, so that the first upper surface F51 and the first lower surface F52 of the first hole filling material F5 and the second upper surface F61 and the second lower surface F62 of the second hole filling material F6 are respectively flush with the conductive material layer G2, thereby maintaining a preferred flatness. Here, the materials of the first hole filling material F5 and the second hole filling material F6 are, for example, resin, which may be regarded as a plugging agent or a dielectric material with a dielectric constant of higher than 3.6 and a dielectric loss of lower than 0.05.

After that, please refer to FIG. 15A and FIG. 15B at the same time. A lithography process is performed to pattern the conductive material layer G2, the metal layer M, and the third circuit layer 158, so as to form the first external circuit layer 160*j*, the second external circuit layer 170*j*, the first conductive via 180*j*, and the second conductive via 190*j*. Here, the first external circuit layer 160*j* is formed on the first dielectric material 110*i*, and the second external circuit layer 170*j* is formed on the third dielectric material 130*i* and the fourth dielectric material 140*m*. The first conductive via 180*j* includes the first through hole 15, the first conductive material layer G21, and the first hole filling material F5, wherein the first hole filling material F5 fills the first through hole 15, and the first upper surface F51 and the first lower surface F52 opposite to each other of the first hole filling material F5 are respectively flush with the top surface 161*j* of the first external circuit layer 160*j* and the bottom surface 171*j* of the second external circuit layer 170*j*. Each second conductive via 190*j* includes the second through hole T6, the second conductive material layer G22, and the second hole filling material F6, wherein the second hole filling material F6 fills the second through hole T6, and the second upper surface F61 and the second lower surface F62 opposite to each other of the second hole filling material F6 are respectively flush with the top surface 161*j* of the first external circuit layer 160*j* and the bottom surface 171*j* of the second external circuit layer 170*j*. So far, the manufacturing of a circuit board 100*n* is completed.

Next, please refer to FIG. 15C. In this embodiment, an electronic device 10*n* includes, for example, the circuit board 100*n* of FIG. 15B and an electronic element 200, wherein the electronic element 200 is electrically connected to the circuit board 100*n*, and the electronic element 200 includes multiple pads 210. In addition, the electronic device 10*n* of this embodiment further includes multiple connectors 300, which are disposed between the second external circuit layer 170*j* of the circuit board 100*n* and the pads 210 of the electronic element 200, wherein the electronic element 200 is electrically connected to the circuit board 100*n* through the connectors 300. Here, the connector 300 is, for example, a solder ball, but not limited thereto. In terms of application, an antenna structure may be disposed on the other side of the circuit board 100*n* opposite to the electronic element 200, and the antenna structure may be electrically connected to the first external circuit layer 160*j* of the circuit board 100*n*. For the application in the integrated circuit and the antenna, the circuit board 100*n* of this embodiment can solve the issue of signal interference on the same plane, and can reduce signal energy loss and reduce noise interference, thereby improving the signal transmission reliability.

Figure 16A:
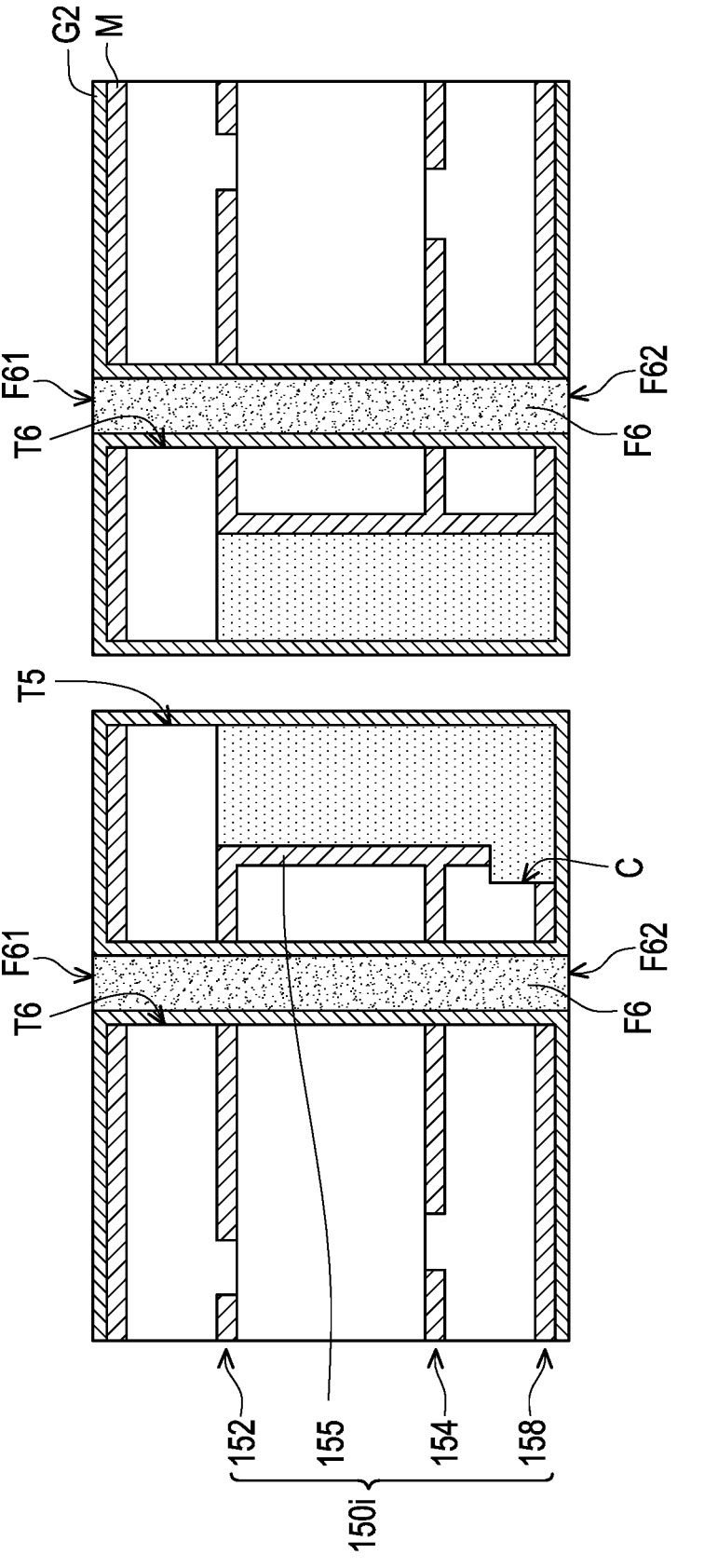
FIG. 16A to FIG. 16B are schematic cross-sectional views of partial steps of another manufacturing method of a circuit board according to another embodiment of the disclosure.
Figure 16B:
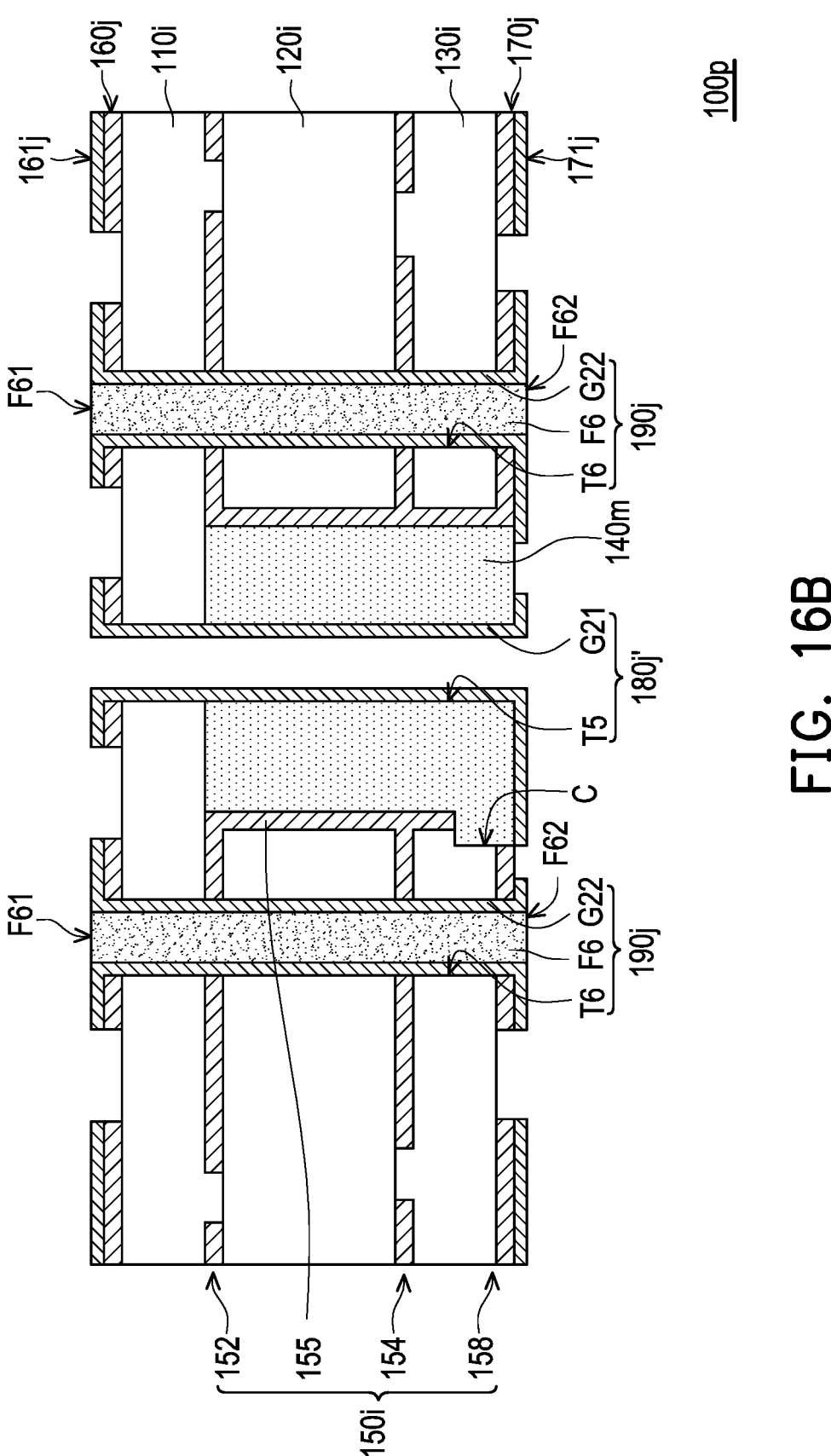
Figure 16C:
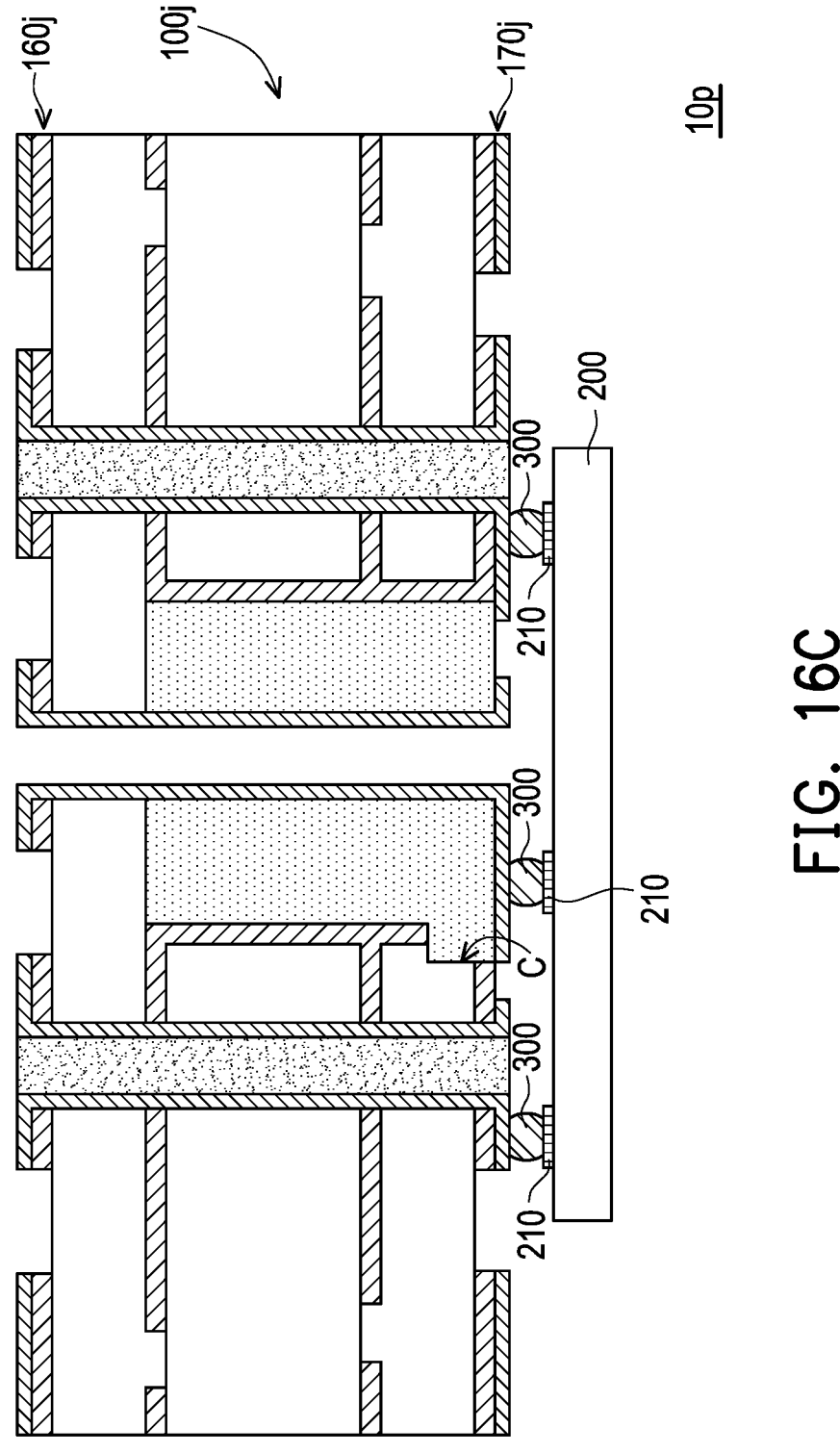
FIG. 16C is a schematic cross-sectional view of an electronic device including the circuit board of FIG. 16B.

FIG. 16A to FIG. 16B are schematic cross-sectional views of partial steps of another manufacturing method of a circuit board according to another embodiment of the disclosure. FIG. 16C is a schematic cross-sectional view of an electronic device including the circuit board of FIG. 16B. Please refer to FIG. 14C and FIG. 16A at the same time. A manufacturing method of a circuit board of this embodiment is similar to the above-mentioned manufacturing method of the circuit board, and the difference between the two is as follows. Please refer to FIG. 16A. After forming the conductive material layer G2, the second hole filling material F6 is filled in each second through hole T6, wherein the second hole filling material F6 fills the second through hole T6. In other words, a filling material is not filled in the first through hole 15 of this embodiment, and there is only air. Preferably, the second upper surface F61 and the second lower surface F62 opposite to each other of the second hole filling material F6 are respectively flush with the conductive material layer G2. If the second hole filling material F6 is higher than the conductive material layer G2, a grinding manner may be selected, so that the second upper surface F61 and the second lower surface F62 of the second hole filling material F6 are respectively flush with the conductive material layer G2, thereby maintaining a preferred flatness. Here, the material of the second hole filling material F6 is, for example, resin, which may be regarded as a plugging agent or a dielectric material with a dielectric constant of higher than 3.6 and a dielectric loss of lower than 0.05.

After that, please refer to FIG. 16A and FIG. 16B at the same time. A lithography process is performed to pattern the conductive material layer G2, the metal layer M, and the third circuit layer 158, so as to form the first external circuit layer 160j, the second external circuit layer 170j, a first conductive via 180j', and the second conductive via 190j. Here, the first external circuit layer 160j is formed on the first dielectric material 110i, and the second external circuit layer 170j is formed on the third dielectric material 130i and the fourth dielectric material 140m. The first conductive via 180j' includes the first through hole T5 and the first conductive material layer G21, wherein the first conductive material layer G21 covers the inner wall of the first through hole T5 and is electrically connected to the first external circuit layer 160j and the second external circuit layer 170j. Each second conductive via 190j includes the second through hole T6, the second conductive material layer G22, and the second hole filling material F6, wherein the second hole filling material F6 fills the second through hole T6, and the second upper surface F61 and the second lower surface F62 opposite to each other of the second hole filling material F6 are respectively flush with the top surface 161j of the first external circuit layer 160j and the bottom surface 171j of the second external circuit layer 170j. So far, the manufacturing of a circuit board 100p is completed.

Next, please refer to FIG. 16C. In this embodiment, an electronic device 10p includes, for example, the circuit board 100p of FIG. 16B and an electronic element 200, wherein the electronic element 200 is electrically connected to the circuit board 100p, and the electronic element 200 includes multiple pads 210. In addition, the electronic device 10p of this embodiment further includes multiple connectors 300, which are disposed between the second external circuit layer 170j of the circuit board 100p and the pads 210 of the electronic element 200, wherein the electronic element 200 is electrically connected to the circuit board 100p through the connectors 300. Here, the connector 300 is, for example, a solder ball, but not limited thereto. In terms of application, an antenna structure may be disposed on the other side of the circuit board 100p opposite to the electronic element 200, and the antenna structure may be electrically connected to the first external circuit layer 160j of the circuit board 100p. For the application in the integrated circuit and the antenna, the circuit board 100p of this embodiment can solve the issue of signal interference on the same plane, and can reduce signal energy loss and reduce noise interference, thereby improving the signal transmission reliability.

Figure 17A:
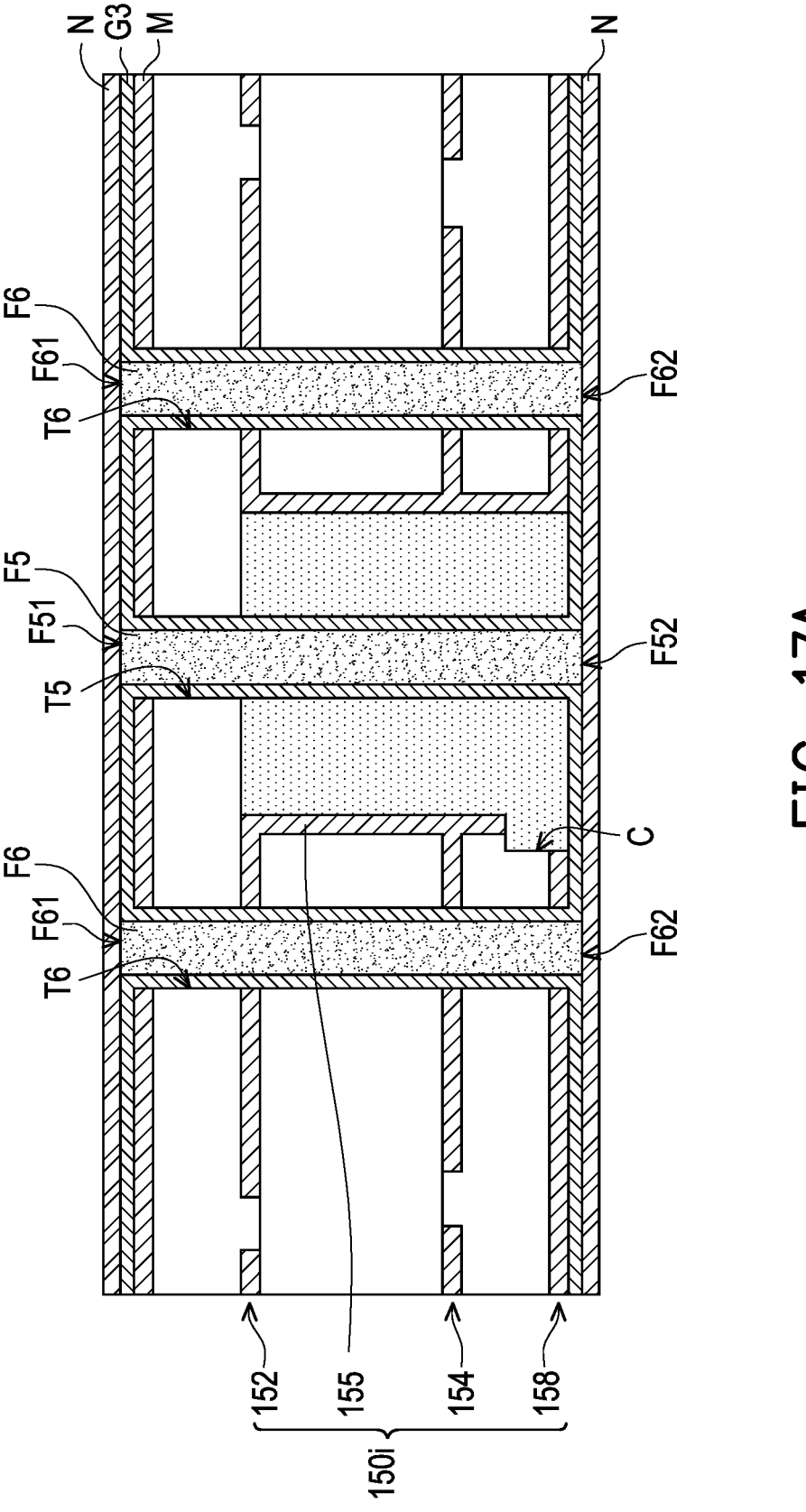
FIG. 17A to FIG. 17B are schematic cross-sectional views of partial steps of another manufacturing method of a circuit board according to another embodiment of the disclosure.
Figure 17B:
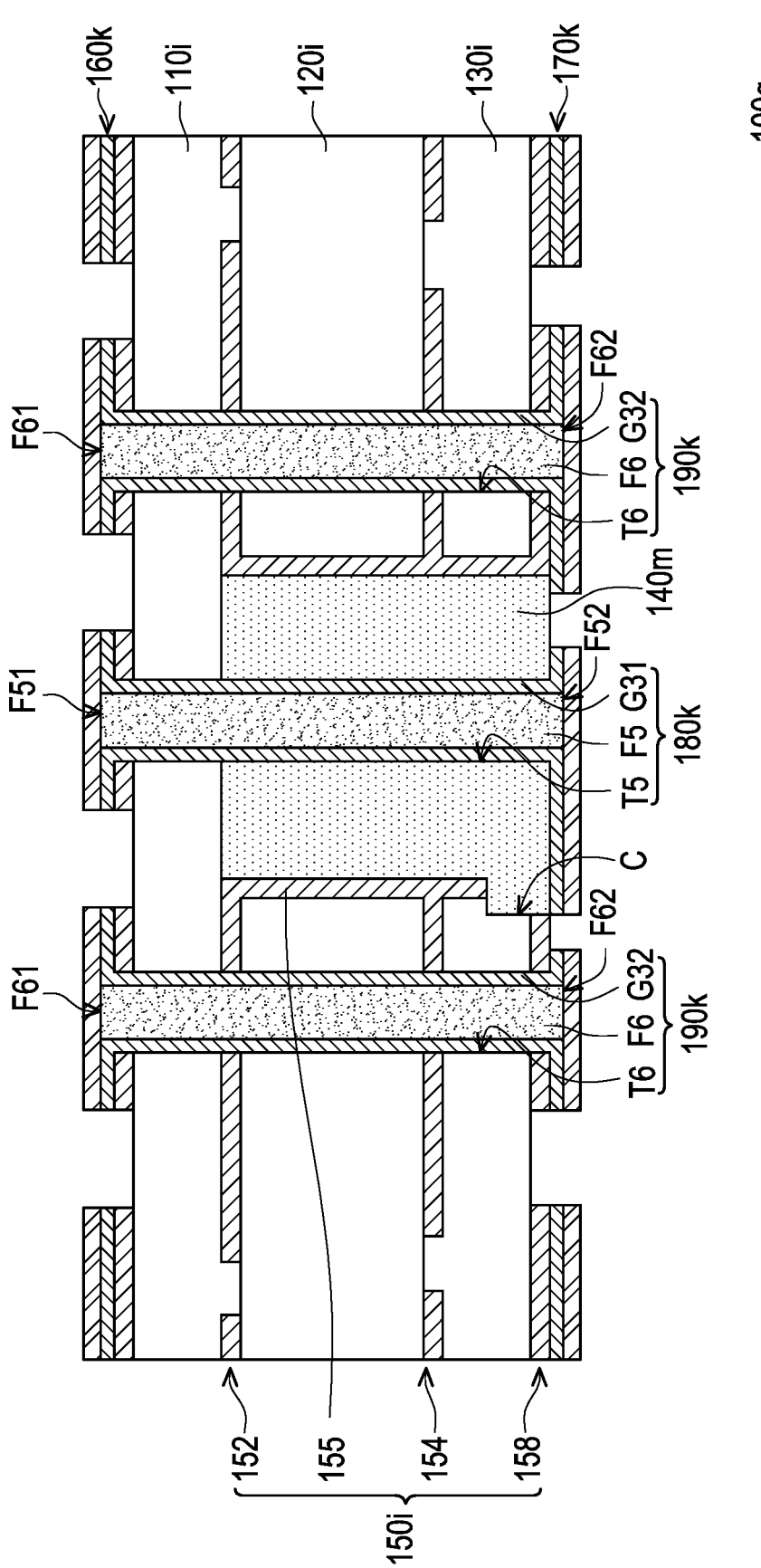
Figure 17C:
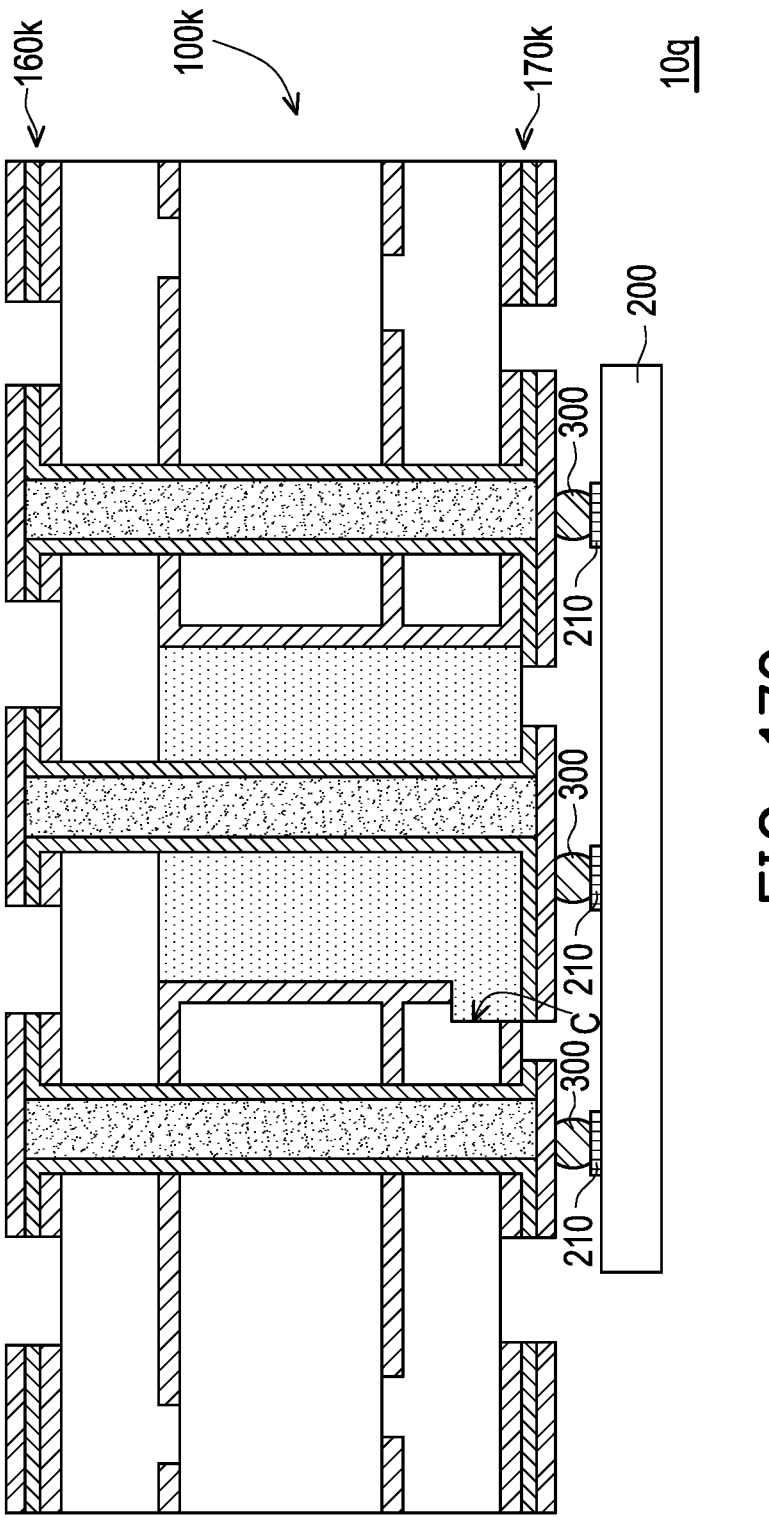
FIG. 17C is a schematic cross-sectional view of an electronic device including the circuit board of FIG. 17B.

FIG. 17A to FIG. 17B are schematic cross-sectional views of partial steps of another manufacturing method of a circuit board according to another embodiment of the disclosure. FIG. 17C is a schematic cross-sectional view of an electronic device including the circuit board of FIG. 17B. Please refer to FIG. 15A and FIG. 17A at the same time. A manufacturing method of a circuit board of this embodiment is similar to the above-mentioned manufacturing method of the circuit board, and the difference between the two is as follows. After the step of respectively filling the first hole filling material F5 and the second hole filling material F6 in the first through hole 15 and each second through hole T6 in FIG. 15A, please refer to FIG. 17A. A cover layer N is formed on the conductive material layer G3, wherein the cover layer N covers the conductive material layer G3, the first upper surface F51 and the first lower surface F52 of the first hole filling material F5, and the second upper surface F61 and the second lower surface F62 of the second hole filling material F6. Here, the material of the cover layer N is, for example, copper, but not limited thereto.

After that, please refer to FIG. 17A and FIG. 17B at the same time. A lithography process is performed to pattern the cover layer N, the conductive material layer G3, the metal layer M, and the third circuit layer 158, so as to form the first external circuit layer 160k and the second external circuit layer 170k. Here, the first conductive via 180k includes the first through hole T5, the first conductive material layer G31, and the first hole filling material F5, wherein the first hole filling material F5 fills the first through hole 15, and the first external circuit layer 160k and the second external circuit layer 170k respectively cover the first upper surface F51 and the first lower surface F52 of the first hole filling material F5. Each second conductive via 190k includes the second through hole T6, the second conductive material layer G32, and the second hole filling material F6, wherein the second hole filling material F6 fills the second through hole T6, and the first external circuit layer 160k and the second external circuit layer 170k respectively cover the second upper surface F61 and the second lower surface F62 of the second hole filling material F6. So far, the manufacturing of a circuit board 100q is completed.

Next, please refer to FIG. 17C. In this embodiment, an electronic device 10q includes, for example, the circuit board 100q of FIG. 17B and an electronic element 200, wherein the electronic element 200 is electrically connected to the circuit board 100q, and the electronic element 200 includes multiple pads 210. In addition, the electronic device 10q of this embodiment further includes multiple connectors 300, which are disposed between the second external circuit layer 170k of the circuit board 100q and the pads 210 of the electronic element 200, wherein the electronic element 200 is electrically connected to the circuit board 100k through the connectors 300. Here, the connector 300 is, for example, a solder ball, but not limited thereto. In terms of application, an antenna structure may be disposed on the other side of the circuit board 100q opposite to the electronic element 200, and the antenna structure may be electrically connected to the first external circuit layer 160*k* of the circuit board 100*q*. For the application in the integrated circuit and the antenna, the circuit board 100*q* of this embodiment can solve the issue of signal interference on the same plane, and can reduce signal energy loss and noise interference, thereby improving the signal transmission reliability.

Figure 18A:
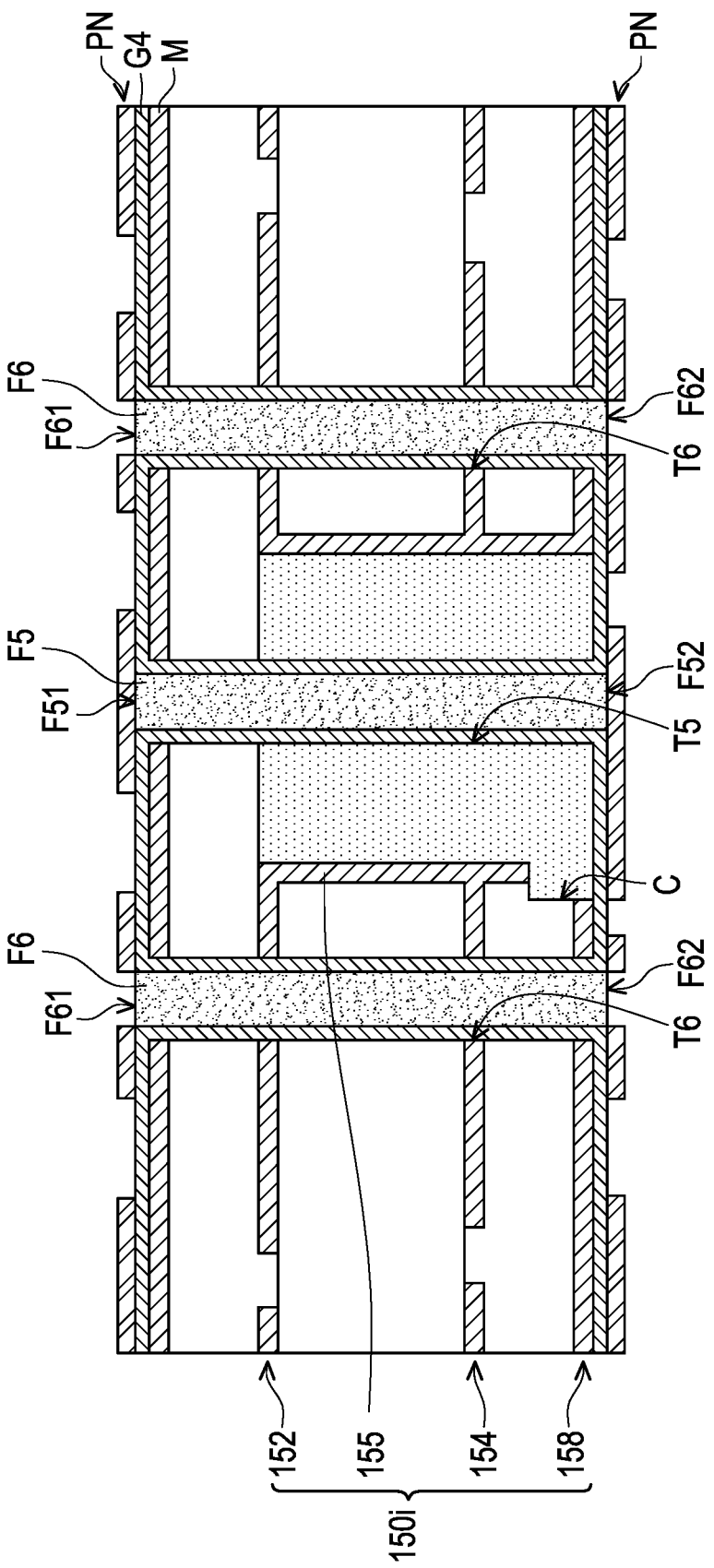
FIG. 18A to FIG. 18B are schematic cross-sectional views of partial steps of another manufacturing method of a circuit board according to another embodiment of the disclosure.
Figure 18B:
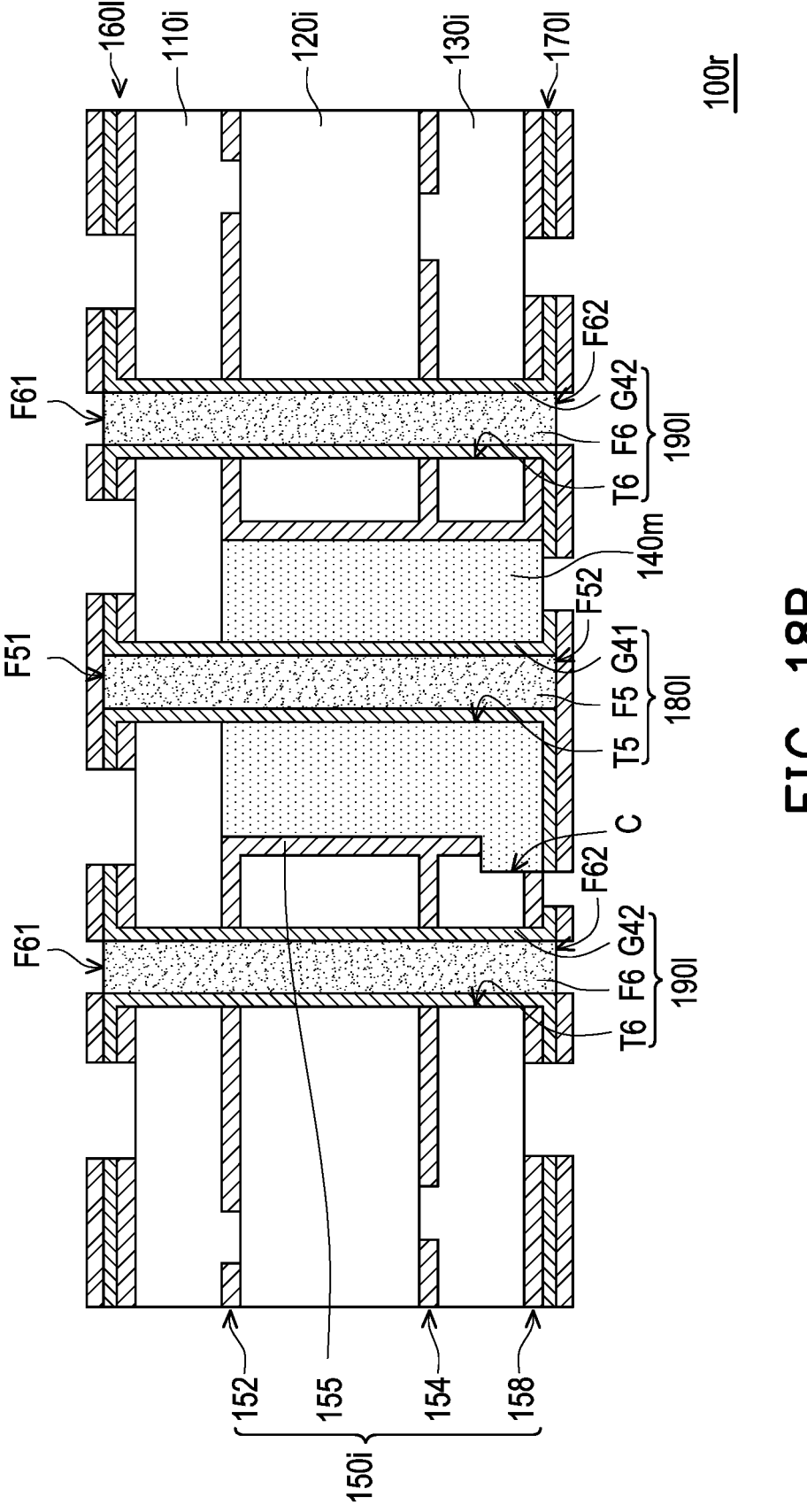
Figure 18C:
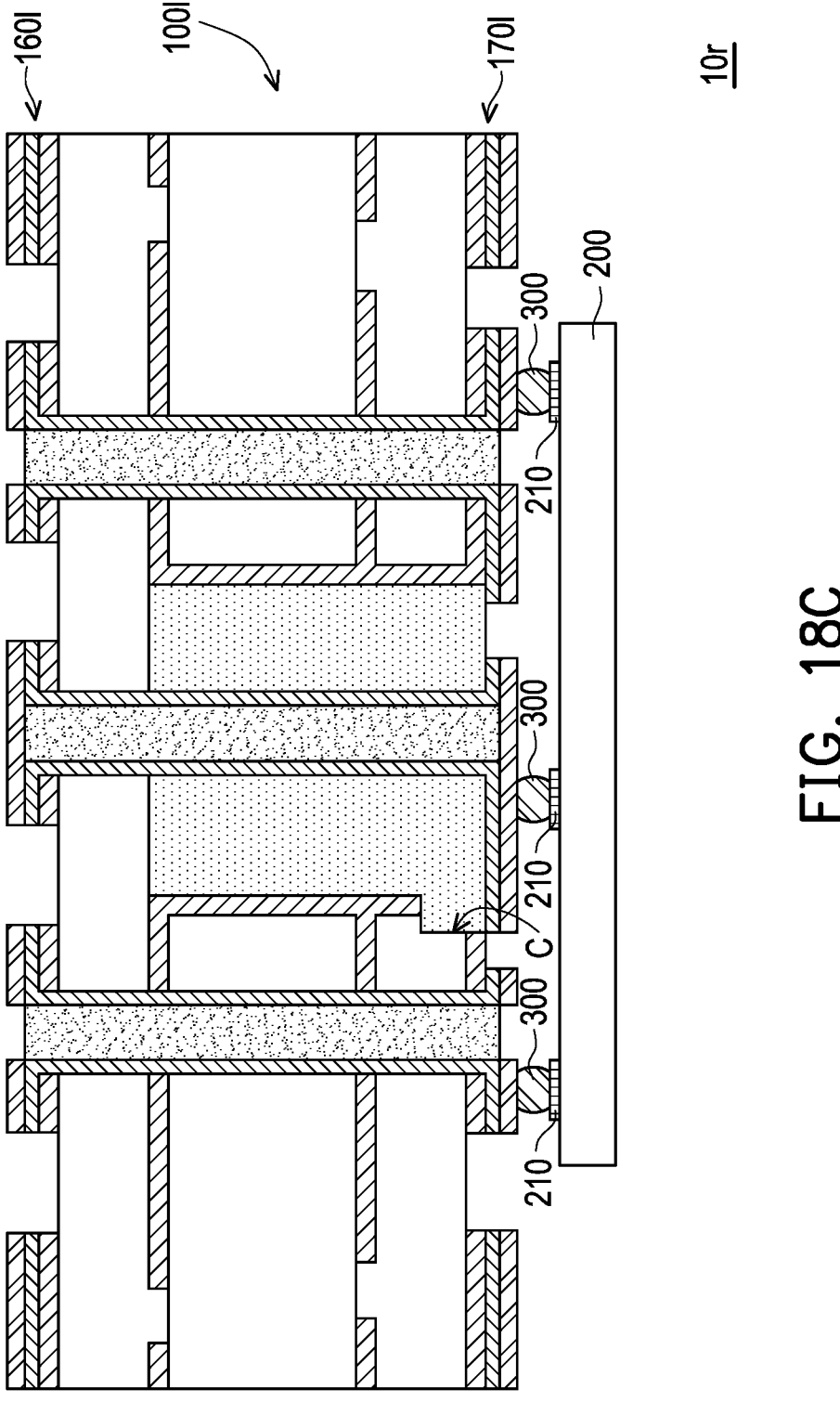
FIG. 18C is a schematic cross-sectional view of an electronic device including the circuit board of FIG. 18B.

FIG. 18A to FIG. 18B are schematic cross-sectional views of partial steps of another manufacturing method of a circuit board according to another embodiment of the disclosure. FIG. 18C is a schematic cross-sectional view of an electronic device including the circuit board of FIG. 18B. Please refer to FIG. 15A and FIG. 18A at the same time. A manufacturing method of a circuit board of this embodiment is similar to the above-mentioned manufacturing method of the circuit board, and the difference between the two is as follows. After the step of respectively filling the first hole filling material F5 and the second hole filling material F6 in the first through hole 15 and each second through hole T6 in FIG. 15A, please refer to FIG. 18A. A patterned cover layer PN is formed on the conductive material layer G4, wherein the patterned cover layer PN covers a part of the conductive material layer G4 and the first upper surface F51 and the first lower surface F52 of the first hole filling material F5. Here, the material of the patterned cover layer PN is, for example, copper, but not limited thereto.

Next, please refer to FIG. 18A and FIG. 18B at the same time. A lithography process is performed to pattern the conductive material layer G4, the metal layer M, and the third circuit layer 158 with the patterned cover layer PN as a mask, so as to form the first external circuit layer 160*l* and the second external circuit layer 170*l*. Here, the first conductive via 180*l* includes the first through hole 15, the first conductive material layer G41, and the first hole filling material F5, wherein the first hole filling material F5 fills the first through hole 15, and the first external circuit layer 160*l* and the second external circuit layer 170*l* respectively cover the first upper surface F51 and the first lower surface F52 of the first hole filling material F5. Each second conductive via 190*l* includes the second through hole T6, the second conductive material layer G42, and the second hole filling material F6, wherein the second hole filling material F6 fills the second through hole T6, and the first external circuit layer 160*l* and the second external circuit layer 170*l* respectively expose the second upper surface F61 and the second lower surface F62 of the second hole filling material F6. So far, the manufacturing of a circuit board 100*r* is completed.

Next, please refer to FIG. 18C. In this embodiment, an electronic device 10*r* includes, for example, the circuit board 100*r* of FIG. 18B and an electronic element 200, wherein the electronic element 200 is electrically connected to the circuit board 100*r*, and the electronic element 200 includes multiple pads 210. In addition, the electronic device 10*r* of this embodiment further includes multiple connectors 300, which are disposed between the second external circuit layer 170*l* of the circuit board 100*r* and the pads 210 of the electronic element 200, wherein the electronic element 200 is electrically connected to the circuit board 100*r* through the connectors 300. Here, the connector 300 is, for example, a solder ball, but not limited thereto. In terms of application, an antenna structure may be disposed on the other side of the circuit board 100*r* opposite to the electronic element 200, and the antenna structure may be electrically connected to the first external circuit layer 160*l* of the circuit board 100*r*. For the application in the integrated circuit and the antenna, the circuit board 100*r* of this embodiment can solve the issue of signal interference on the same plane, and can reduce signal energy loss and noise interference, thereby improving the signal transmission reliability.

In summary, in the design of the circuit board of the disclosure, the first conductive via is electrically connected to the first external circuit layer and the second external circuit layer to define the signal path, and the second conductive vias are electrically connected to the first external circuit layer, the conductive structure, and the second external circuit layer to define the ground path, and the ground path surrounds the signal path. In this way, a good high-frequency high-speed signal loop can be formed, and the subsequent application in the integrated circuit and the antenna can also solve the issue of signal interference on the same plane, and can reduce signal energy loss and reduce noise interference, thereby improving the signal transmission reliability.

Although the disclosure is disclosed in the above embodiments, the embodiments are not intended to limit the disclosure. Persons skilled in the art may make some changes and modifications without departing from the spirit and scope of the disclosure. Therefore, the protection scope of the disclosure shall be defined by the appended claims.

What is claimed is:

1. A circuit board, comprising: a first dielectric material, a second dielectric material, a third dielectric material, a fourth dielectric material, a first external circuit layer, a second external circuit layer, a conductive structure, and a first conductive via, and a plurality of second conductive vias, wherein the first external circuit layer is disposed on the first dielectric material;

the second external circuit layer is at least disposed on the third dielectric material;

the second dielectric material is disposed between the first dielectric material and the third dielectric material;

the conductive structure is at least disposed between the first dielectric material and the second dielectric material, between the second dielectric material and the third dielectric material, and between the second dielectric material and the fourth dielectric material;

the first conductive via at least passes through the first dielectric material and the fourth dielectric material, and is electrically connected to the first external circuit layer and the second external circuit layer to define a signal path; and the second conductive vias pass through the first dielectric material, the second dielectric material, the third dielectric material, and a part of the conductive structure, and surround the first conductive via, wherein the second conductive vias are electrically connected to the first external circuit layer, the conductive structure, and the second external circuit layer to define a ground path, and the ground path surrounds the signal path, the first conductive via comprises a first through hole, and each of the second conductive vias comprises a second through hole, the first conductive via further comprises a first hole filling material filling the first through hole, and each of the second conductive vias further comprises a second hole filling material filling the second through hole, wherein the first external circuit layer and the second external circuit layer respectively cover a first upper surface and a first lower surface of the first hole filling material; and the first external circuit layer and the second external circuit layer respectively cover a second upper surface and a second lower surface of the second hole filling material.

2. The circuit board according to claim 1, wherein the conductive structure comprises a first circuit layer, a second circuit layer, and a conductive connection layer, the second dielectric material has a first surface and a second surface opposite to each other and an opening, the opening passes through the second dielectric material, the first circuit layer is disposed on the first surface, the second circuit layer is disposed on the second surface, and the conductive connection layer covers an inner wall of the opening and connects the first circuit layer and the second circuit layer.

3. The circuit board according to claim 2, wherein the first external circuit layer comprises a first signal circuit and a first ground circuit, the second external circuit layer comprises a second signal circuit and a second ground circuit, the first signal circuit, the first conductive via, and the second signal circuit define the signal path, and the first ground circuit, each of the second conductive vias, the first circuit layer, the conductive connection layer, the second circuit layer, and the second ground circuit define the ground path.

4. The circuit board according to claim 2, wherein the fourth dielectric material is disposed between the first dielectric material and the third dielectric material, and fills the opening of the second dielectric material.

5. The circuit board according to claim 4, further comprising:
   a fifth dielectric material, having a first opening, wherein the first dielectric material is located in the first opening; and
   a sixth dielectric material, having a second opening, wherein the third dielectric material is located in the second opening.

6. The circuit board according to claim 4, wherein the first conductive via comprises a first through hole and a first conductive material layer, the first through hole passes through the first dielectric material, the fourth dielectric material, and the third dielectric material, and the first conductive material layer covers an inner wall of the first through hole and electrically connects the first external circuit layer and the second external circuit layer; and
   each of the second conductive vias comprises a second through hole and a second conductive material layer, the second through hole passes through the first dielectric material, the second dielectric material, and the third dielectric material, and the second conductive material layer covers an inner wall of the second through hole and electrically connects the first external circuit layer, the first circuit layer, the second circuit layer, and the second external circuit layer.

7. The circuit board according to claim 6, further comprising:
   a connecting metal layer, disposed on the third dielectric material and electrically connected to the first conductive via.

8. The circuit board according to claim 6, wherein the first conductive via further comprises a first hole filling material filling the first through hole, and a first upper surface and a first lower surface opposite to each other of the first hole filling material are respectively flush with a top surface of the first external circuit layer and a bottom surface of the second external circuit layer; and
   each of the second conductive vias further comprises a second hole filling material filling the second through hole, and a second upper surface and a second lower surface opposite to each other of the second hole filling material are respectively flush with the top surface of the first external circuit layer and the bottom surface of the second external circuit layer.

9. The circuit board according to claim 6, wherein the first conductive via further comprises a first hole filling material filling the first through hole, and the first external circuit layer and the second external circuit layer respectively cover a first upper surface and a first lower surface of the first hole filling material; and
   each of the second conductive vias further comprises a second hole filling material filling the second through hole, and the first external circuit layer and the second external circuit layer respectively cover a second upper surface and a second lower surface of the second hole filling material.

10. The circuit board according to claim 6, wherein the first conductive via further comprises a first hole filling material filling the first through hole, and the first external circuit layer and the second external circuit layer respectively cover a first upper surface and a first lower surface of the first hole filling material; and
   each of the second conductive vias further comprises a second hole filling material filling the second through hole, and the first external circuit layer and the second external circuit layer respectively expose a second upper surface and a second lower surface of the second hole filling material.

11. The circuit board according to claim 1, wherein the conductive structure comprises a first circuit layer, a second circuit layer, a third circuit layer, and a conductive connection layer, the second dielectric material has a first surface and a second surface opposite to each other and a first opening, the first opening passes through the second dielectric material, the first circuit layer is disposed on the first surface, the second circuit layer is disposed on the second surface, the third dielectric material has a third surface relatively far from the second dielectric material and a second opening, the second opening passes through the third dielectric material and is connected to the first opening, the third circuit layer is disposed on the third surface, and the conductive connection layer covers an inner wall of the first opening and an inner wall of the second opening, and is connected to the first circuit layer, the second circuit layer, and the third circuit layer.

12. The circuit board according to claim 11, wherein the first external circuit layer comprises a first signal circuit and a first ground circuit, the second external circuit layer comprises a second signal circuit and a second ground circuit, the first signal circuit, the first conductive via, and the second signal circuit define the signal path, and the first ground circuit, each of the second conductive vias, the first circuit layer, the conductive connection layer, and the second ground circuit define the ground path.

13. The circuit board according to claim 11, wherein the fourth dielectric material fills the first opening of the second dielectric material and the second opening of the third dielectric material.

14. The circuit board according to claim 13, wherein the first conductive via comprises a first conductive material layer, the first through hole passes through the first dielectric material and the fourth dielectric material, and the first conductive material layer covers an inner wall of the first through hole and is electrically connected to the first external circuit layer and the second external circuit layer; and each of the second conductive vias comprises a second conductive material layer, the second through hole passes through the first dielectric material, the second dielectric material, and the third dielectric material, and the second conductive material layer covers an inner wall of the second through hole and is electrically connected to the first external circuit layer, the first circuit layer, the second circuit layer, the third circuit layer, and the second external circuit layer.

15. The circuit board according to claim 14, wherein the first conductive via further comprises a first hole filling material filling the first through hole, and a first upper surface and a first lower surface opposite to each other of the first hole filling material are respectively flush with a top surface of the first external circuit layer and a bottom surface of the second external circuit layer; and each of the second conductive vias further comprises a second hole filling material filling the second through hole, and a second upper surface and a second lower surface opposite to each other of the second hole filling material are respectively flush with the top surface of the first external circuit layer and the bottom surface of the second external circuit layer.

16. The circuit board according to claim 14, wherein the first conductive via further comprises a first hole filling material filling the first through hole, and the first external circuit layer and the second external circuit layer respectively cover a first upper surface and a first lower surface of the first hole filling material; and each of the second conductive vias further comprises a second hole filling material filling the second through hole, and the first external circuit layer and the second external circuit layer respectively expose a second upper surface and a second lower surface of the second hole filling material.

17. The circuit board according to claim 11, wherein a notch is formed between the conductive connection layer, the third dielectric material, and the third circuit layer, and the fourth dielectric material fills the first opening of the second dielectric material, the second opening of the third dielectric material, and the notch.

18. The circuit board according to claim 17, wherein the first conductive via comprises a first conductive material layer, the first through hole passes through the first dielectric material and the fourth dielectric material, and the first conductive material layer covers an inner wall of the first through hole and is electrically connected to the first external circuit layer and the second external circuit layer; and each of the second conductive vias comprises a second conductive material layer, the second through hole passes through the first dielectric material, the second dielectric material, and the third dielectric material, and the second conductive material layer covers an inner wall of the second through hole and is electrically connected to the first external circuit layer, the first circuit layer, the second circuit layer, the third circuit layer, and the second external circuit layer.

19. The circuit board according to claim 18, wherein the first conductive via further comprises a first hole filling material filling the first through hole, and a first upper surface and a first lower surface opposite to each other of the first hole filling material are respectively flush with a top surface of the first external circuit layer and a bottom surface of the second external circuit layer; and each of the second conductive vias further comprises a second hole filling material filling the second through hole, and a second upper surface and a second lower surface opposite to each other of the second hole filling material are respectively flush with the top surface of the first external circuit layer and the bottom surface of the second external circuit layer.

20. The circuit board according to claim 18, wherein each of the second conductive vias further comprises a hole filling material filling the second through hole, and an upper surface and a lower surface opposite to each other of the hole filling material are respectively flush with the top surface of the first external circuit layer and the bottom surface of the second external circuit layer.

21. The circuit board according to claim 18, wherein the first conductive via further comprises a first hole filling material filling the first through hole, and the first external circuit layer and the second external circuit layer respectively cover a first upper surface and a first lower surface of the first hole filling material; and each of the second conductive vias further comprises a second hole filling material filling the second through hole, and the first external circuit layer and the second external circuit layer respectively expose a second upper surface and a second lower surface of the second hole filling material.

22. An electronic device, comprising:

a circuit board, comprising a first dielectric material, a second dielectric material, a third dielectric material, a fourth dielectric material, a first external circuit layer, a second external circuit layer, a conductive structure, a first conductive via, and a plurality of second conductive vias, wherein the first external circuit layer is disposed on the first dielectric material;

the second external circuit layer is at least disposed on the third dielectric material;

the second dielectric material is disposed between the first dielectric material and the third dielectric material;

the conductive structure is at least disposed between the first dielectric material and the second dielectric material, between the second dielectric material and the third dielectric material, and between the second dielectric material and the fourth dielectric material;

the first conductive via at least passes through the first dielectric material and the fourth dielectric material, and is electrically connected to the first external circuit layer and the second external circuit layer to define a signal path; and the second conductive vias pass through the first dielectric material, the second dielectric material, the third dielectric material, and a part of the conductive structure, and surround the first conductive via, wherein the second conductive vias are electrically connected to the first external circuit layer, the conductive structure, and the second external circuit layer to define a ground path, and the ground path surrounds the signal path, the first conductive via comprises a first through hole, and each of the second conductive vias comprises a second through hole, the first conductive via further comprises a first hole filling material filling the first through hole, and each of the second conductive vias further comprises a second hole filling material filling the second through hole; and an electronic element, electrically connected to the circuit board, wherein the first external circuit layer and the second external circuit layer respectively cover a first upper surface and a first lower surface of the first hole filling material; and the first external circuit layer and the second external circuit layer respectively cover a second upper surface and a second lower surface of the second hole filling material.

* * * * *